(12) United States Patent
Kurokawa

(10) Patent No.: US 9,934,826 B2
(45) Date of Patent: Apr. 3, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Sagamihara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/481,937

(22) Filed: Apr. 7, 2017

(65) Prior Publication Data

US 2017/0301376 A1 Oct. 19, 2017

(30) Foreign Application Priority Data

Apr. 14, 2016 (JP) ................................. 2016-081092

(51) Int. Cl.
*G11C 5/06* (2006.01)
*H01L 29/786* (2006.01)
(Continued)

(52) U.S. Cl.
CPC ............ *G11C 5/063* (2013.01); *H01L 27/124* (2013.01); *H01L 27/1225* (2013.01); *H01L 29/7869* (2013.01); *G06N 3/08* (2013.01)

(58) Field of Classification Search
CPC ... G11C 5/063; H01L 27/1225; H01L 27/124; H01L 29/7869
See application file for complete search history.

(56) References Cited

U.S. PATENT DOCUMENTS 5,047,655 A 9/1991 Chambost et al.
5,071,171 A 12/1991 Perratone
(Continued)

FOREIGN PATENT DOCUMENTS

| JP | 2000-057244 A | 2/2000 |
| JP | 2007-066258 A | 3/2007 |
| JP | 2013-008352 A | 1/2013 |

OTHER PUBLICATIONS

International Search Report (Application No. PCT/IB2017/052047) dated Jun. 13, 2017.
(Continued)

*Primary Examiner* — Toan Le
(74) *Attorney, Agent, or Firm* — Nixon Peabody LLP; Jeffrey L. Costellia

(57) ABSTRACT

To provide a semiconductor device including a first memory cell for holding first analog data, a second memory cell for holding reference analog data, and an offset circuit. The first memory cell and the second memory cell supply a first current and a second current, respectively, when a reference potential is supplied. The offset circuit supplies a third current corresponding to a differential current between the first current and the second current. The first memory and the second memory supply a fourth current and a fifth current, respectively, when a potential corresponding to second analog data is supplied. By subtracting the third current from a differential current between the fourth current and the fifth current, a current that depends on the sum of products of the first analog data and the second analog data is obtained. By providing a plurality of product-sum operation circuits that can be freely connected, a hierarchical neural network can be formed.

17 Claims, 27 Drawing Sheets

(51) Int. Cl.
*H01L 27/12* (2006.01)
*G06N 3/08* (2006.01)

(56) References Cited

U.S. PATENT DOCUMENTS

| | | | |
|---|---|---|---|
| 5,093,803 | A | 3/1992 | Howard et al. |
| 5,155,802 | A | 10/1992 | Mueller et al. |
| 5,268,320 | A | 12/1993 | Holler et al. |
| 6,452,237 | B1 | 9/2002 | Varshavsky |
| 6,470,328 | B1 | 10/2002 | Varshavsky |
| 8,547,753 | B2 | 10/2013 | Takemura |
| 8,581,625 | B2 | 11/2013 | Yoneda |
| 8,809,850 | B2 | 8/2014 | Yamazaki |
| 2002/0030205 | A1 | 3/2002 | Varshavsky |
| 2012/0297221 | A1 | 11/2012 | Ohnuki |
| 2016/0343452 | A1 | 11/2016 | Ikeda et al. |
| 2017/0063351 | A1 | 3/2017 | Kurokawa |
| 2017/0154678 | A1* | 6/2017 | Nakagawa ......... G11C 16/0466 |
| 2017/0263291 | A1* | 9/2017 | Kurokawa ............. G11C 5/063 |
| 2017/0270405 | A1* | 9/2017 | Kurokawa ........... G06N 3/0635 |

OTHER PUBLICATIONS

Written Opinion (Application No. PCT/IB2017/052047) dated Jun. 13, 2017.

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

* cited by examiner

SEMICONDUCTOR DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

An artificial neural network (hereinafter, simply referred to as a neural network) is an information processing system modeled on a biological neural network. A computer having a higher performance than a conventional Neumann computer is expected to be provided by utilizing the neural network, and in these years, a variety of researches on an neural network constructed over an electronic circuit have been carried out.

In the neural network, units that resemble neurons are connected to each other through units that resemble synapses. By changing the connection strength (in this specification, the connection strength is referred to as a weight coefficient), a variety of input patterns are learned, and pattern recognition, associative storage, or the like can be performed at high speed. Furthermore, Non-Patent Document 1 discloses a technique relating to a chip having a self-learning function with the neural network.

REFERENCE

[Non-Patent Document 1] Yutaka Arima et al., "A Self-Learning Neural Network Chip with 125 Neurons and 10K Self-Organization Synapses", *IEEE Journal of Solid-State Circuits*, Vol. 26, No. 4, April 1991, pp. 607-611

DISCLOSURE OF INVENTION

In order to construct a hierarchical neural network using a semiconductor device, a product-sum operation circuit needs to be provided. In the product-sum operation circuit, connection strength between each of first neurons in a first layer and one of second neurons in a second layer is stored. The output of each of the first neurons in the first layer and the corresponding connection strength are multiplied, and the products are summed. In other words, a memory that holds connection strength, a multiplier circuit and an adder circuit that perform a product-sum operation, and the like are necessarily mounted on the semiconductor device.

In the case where the memory, the multiplier circuit, the adder circuit, and the like are formed using digital circuits, the memory needs to be able to store multi-bit data and moreover, the multiplier circuit and the adder circuit need to be able to perform multi-bit arithmetic operation. In other words, a large-scale memory, a large-scale multiplier circuit, and a large-scale adder circuit are required to construct a neural network using digital circuits; therefore, the chip area of the digital circuits is increased.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a system with the electronic device.

Another object of one embodiment of the present invention is to provide a semiconductor device with a small circuit area. Another object of one embodiment of the present invention is to provide a semiconductor device with low power consumption. Another object of one embodiment of the present invention is to provide an electronic device that performs processing such as pattern recognition or associative storage.

Note that the objects of one embodiment of the present invention are not limited to the above objects. The objects described above do not disturb the existence of other objects. The other objects are the ones that are not described above and are described below. The other objects are apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a first product-sum operation circuit, a second product-sum operation circuit, a first switch circuit, and a second switch circuit. The first product-sum operation circuit includes a first terminal. The second product-sum operation circuit includes a second terminal. The first switch circuit includes a third terminal and a fourth terminal. The second switch circuit includes a fifth terminal and a sixth terminal. The first terminal is electrically connected to the third terminal. The second terminal is electrically connected to the fifth terminal. The fourth terminal is electrically connected to the sixth terminal. The first switch circuit is configured to make the third terminal and the fourth terminal in a conducting state or in a non-conducting state. The second switch circuit is configured to make the fifth terminal and the sixth terminal in a conducting state or in a non-conducting state.

(2) Another embodiment of the present invention is the semiconductor device according to (1) in which the configuration of the first switch circuit is the same as that of the second switch circuit; the fifth terminal corresponds to the third terminal; the sixth terminal corresponds to the fourth terminal; the first switch circuit includes a first transistor, a second transistor, and a first capacitor; one of a source and a drain of the first transistor is electrically connected to a gate of the second transistor; one of a pair of electrodes of the first capacitor is electrically connected to the one of the source and the drain of the first transistor; one of a source and a drain of the second transistor is electrically connected to the third terminal; and the other of the source and the drain of the second transistor is electrically connected to the fourth terminal.

(3) Another embodiment of the present invention is the semiconductor device according to (1) or (2) in which the configuration of the second product-sum operation circuit is the same as that of the first product-sum operation circuit;

the first product-sum operation circuit includes a memory cell array and an offset circuit; the memory cell array includes a first memory cell and a second memory cell; the first memory cell is electrically connected to the offset circuit; the second memory cell is electrically connected to the offset circuit; the first memory cell is configured to hold a first potential corresponding to first data and flow a first current corresponding to the first potential when a first signal is input as a selection signal; the second memory cell is configured to hold a second potential corresponding to second data and flow a second current corresponding to the second potential when the first signal is input as the selection signal; the offset circuit is configured to flow a third current corresponding to a differential current between the first current and the second current; when a second signal is input as the selection signal, the first memory cell is configured to flow a fourth current corresponding to the second signal and the first potential; the second memory cell is configured to flow a fifth current corresponding to the second signal and the second potential when the second signal is input as the selection signal; and the first product-sum operation circuit is configured to output a sixth current that is obtained by subtracting the third current from a differential current between the fourth current and the fifth current.

(4) Another embodiment of the present invention is the semiconductor device according to (3) in which the offset circuit includes a constant current circuit, third to fifth transistors, a second capacitor, a first wiring, a second wiring, a first output terminal, a second output terminal, and a current mirror circuit; the constant current circuit is electrically connected to the first wiring; the constant current circuit is configured to supply a seventh current to the first wiring; one of a source and a drain of the third transistor is electrically connected to one of a source and a drain of the fourth transistor; a gate of the third transistor is electrically connected to the other of the source and the drain of the fourth transistor; the one of the source and the drain of the fourth transistor is electrically connected to the first wiring; one of a source and a drain of the fifth transistor is electrically connected to the other of the source and the drain of the fourth transistor; one of a pair of electrodes of the second capacitor is electrically connected to the gate of the third transistor; the first wiring is electrically connected to the first output terminal; the second wiring is electrically connected to the second output terminal; the current mirror circuit is electrically connected to the first wiring; the current mirror circuit is electrically connected to the second wiring; the current mirror circuit is configured to supply an eighth current corresponding to a potential of the second wiring to the first wiring and the second wiring; the first memory cell is electrically connected to the first output terminal; and the second memory cell is electrically connected to the second output terminal.

(5) Another embodiment of the present invention is the semiconductor device according to (4) in which the constant current circuit includes sixth to eighth transistors and a third capacitor; one of a source and a drain of the sixth transistor is electrically connected to one of a source and a drain of the seventh transistor; a gate of the sixth transistor is electrically connected to the other of the source and the drain of the seventh transistor; the one of the source and the drain of the seventh transistor is electrically connected to the first wiring; one of a source and a drain of the eighth transistor is electrically connected to the other of the source and the drain of the seventh transistor; and one of a pair of electrodes of the third capacitor is electrically connected to a gate of the sixth transistor.

(6) Another embodiment of the present invention is the semiconductor device according to any one of (1) to (5), where at least one of channel formation regions in the first to fifth transistors, the seventh transistor, and the eighth transistor includes an oxide containing at least one of indium, an element M (the element M is aluminum, gallium, yttrium, or tin), and zinc.

(7) Another embodiment of the present invention is a semiconductor wafer including a region for dicing and a plurality of semiconductor devices. Each of the plurality of semiconductor devices is the semiconductor device described in any one of (1) to (6).

(8) Another embodiment of the present invention is an electronic device including the semiconductor device described in any one of (1) to (6), a housing, and a display device.

(9) Another embodiment of the present invention is the electronic device according to (8), including the semiconductor device according to any one of (1) to (6) and being configured to perform processing such as pattern recognition and associative storage.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to one embodiment of the present invention, a system using the electronic device can be provided.

Another embodiment of the present invention can provide a semiconductor device with a small circuit area. Another embodiment of the present invention can provide a semiconductor device with lower power consumption. According to another embodiment of the present invention, an electronic device that performs processing such as pattern recognition and associative storage can be provided.

Note that the effects of one embodiment of the present invention are not limited to the above effects. The effects described above do not disturb the existence of other effects. The other effects are the ones that are not described above and are described below. The other effects are apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF DRAWINGS

FIG. 17 is a timing chart showing an operation example of a semiconductor device.

FIGS. 21A, 21B-1, 21B-2, and 21C illustrate an example of a structure of a touch panel.

BEST MODE FOR CARRYING OUT THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electronic appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like that includes a semiconductor element and is included in an electronic component or a module.

In this specification, an oxide semiconductor is referred to as an OS in some cases. Thus, a transistor including an oxide semiconductor in a channel formation region is referred to as an OS transistor in some cases.

Embodiment 1

In this embodiment, a hierarchical neural network and an example of a semiconductor device of one embodiment of the present invention including the hierarchical neural network are described.

<Hierarchical Neural Network>

First, a hierarchical neural network is described.

Figure 2:
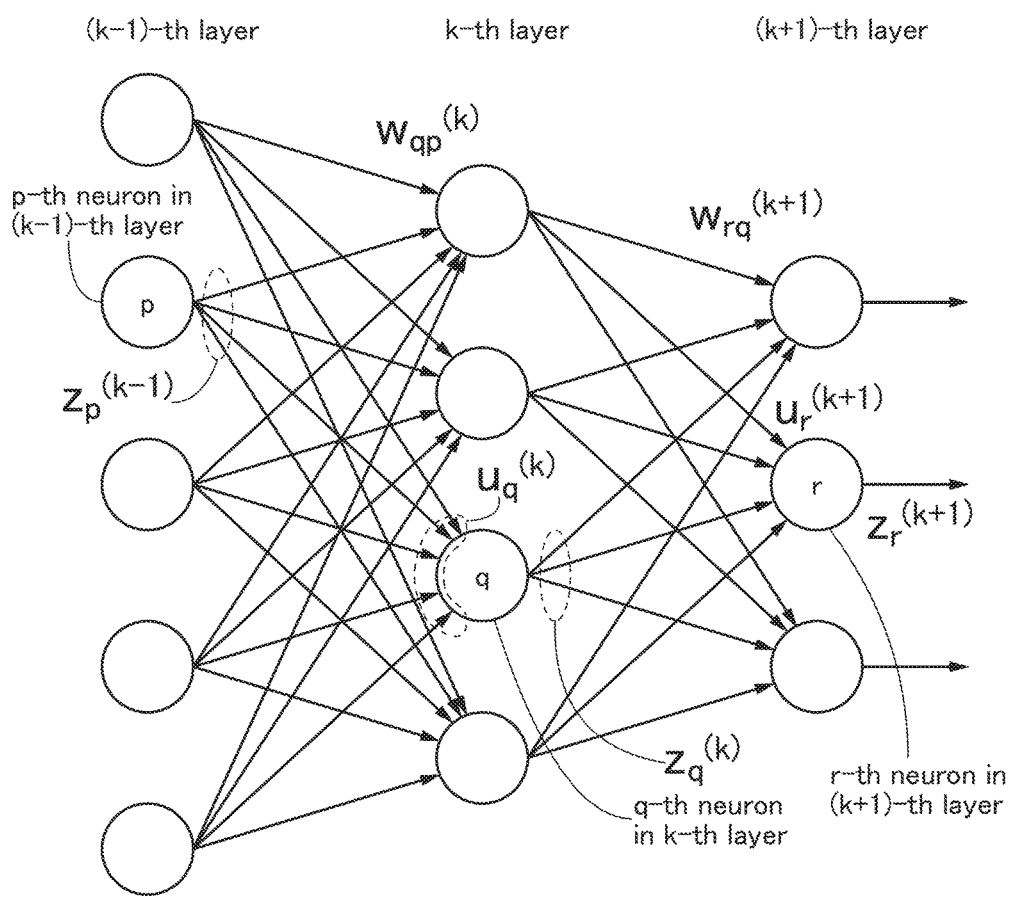
FIG. 2 illustrates an example of a hierarchical neural network.

FIG. 2 is a diagram showing an example of a hierarchical neural network. A (k−1)-th layer (here, k is an integer greater than or equal to two) includes P neurons (here, P is an integer greater than or equal to one). A k-th layer includes Q neurons (here, Q is an integer greater than or equal to one). A (k+1)-th layer includes R neurons (here, R is an integer greater than or equal to one).

The product of an output signal $z_p^{(k-1)}$ of the p-th neuron (here, p is an integer greater than or equal to one and less than or equal to P) in the (k−1)-th layer and a weight coefficient $w_{qp}^{(k)}$ is input to the q-th neuron (here, q is an integer greater than or equal to one and less than or equal to Q) in the k-th layer. The product of an output signal $z_q^{(k)}$ of the q-th neuron in the k-th layer and a weight coefficient $w_{rq}^{(k+1)}$ is input to the r-th neuron (here, r is an integer greater than or equal to one and less than or equal to R) in the (k+1)-th layer. The output signal of the r-th neuron in the (k+1)-th layer is $z_r^{(k+1)}$.

In this case, the summation $u_q^{(k)}$ of signals input to the q-th neuron in the k-th layer is expressed by the following formula.

$$u_q^{(k)} = \Sigma w_{qp}^{(k)} z_p^{(k-1)} \qquad \text{[Formula 1]}$$

The output signal $z_q^{(k)}$ from the q-th neuron in the k-th layer is expressed by the following formula.

$$z_q^{(k)} = f(u_q^{(k)}) \qquad \text{[Formula 2]}$$

A function $f(u_q^{(k)})$ is an activation function. A step function, a linear ramp function, a sigmoid function, or the like can be used as the function $f(u_q^{(k)})$.

Note that the activation function may be the same among all neurons or may be different among neurons. Furthermore, the activation function in one layer may be the same as or different from that in another layer.

Figure 3:
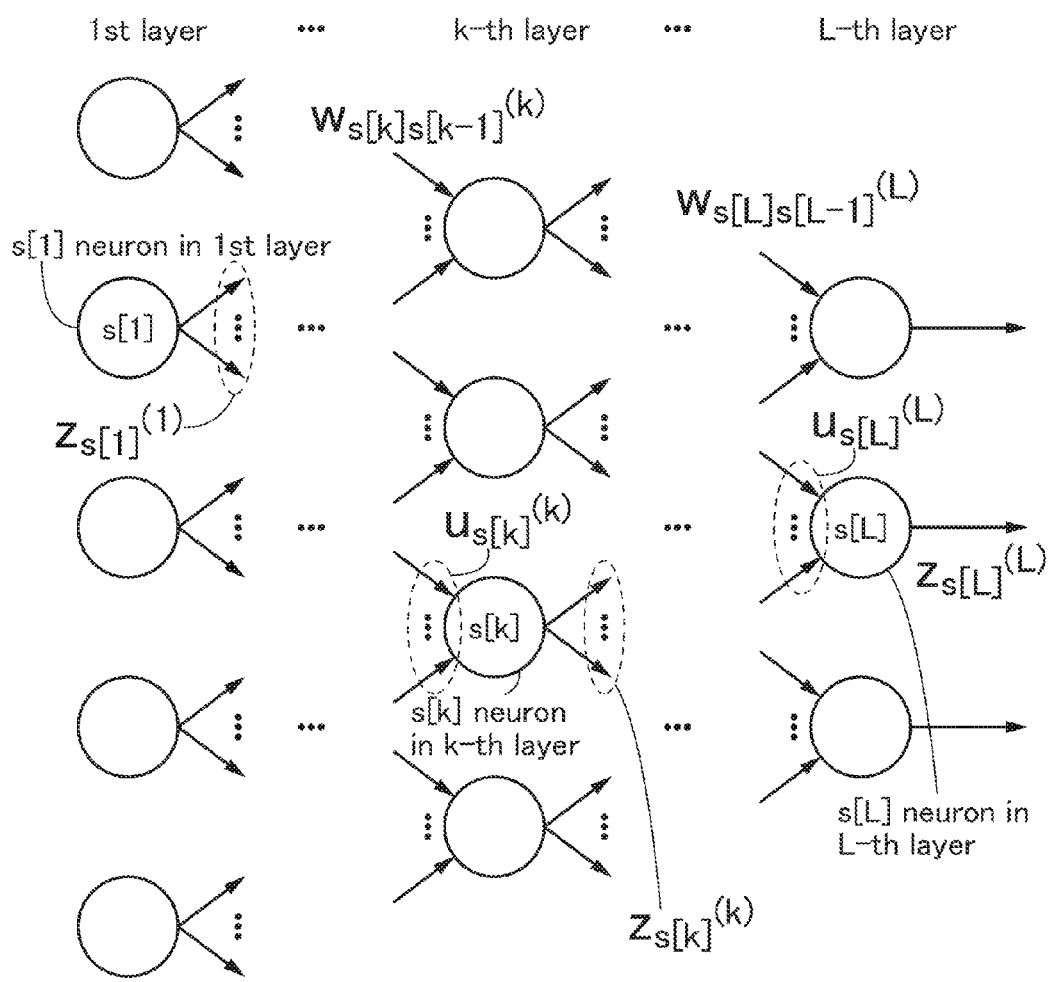
FIG. 3 illustrates an example of a hierarchical neural network.

Here, a hierarchical neural network including L layers (here, L is an integer greater than or equal to three) in total shown in FIG. 3 is described (that is, here, k is an integer greater than or equal to two and less than or equal to (L−1)). A first layer is an input layer of the hierarchical neural network, an L-th layer is an output layer of the hierarchical neural network, and second to (L−1)-th layers are hidden layers of the hierarchical neural network.

The first layer (input layer) includes P neurons, the k-th layer (hidden layer) includes Q[k] neurons (here, Q[k] is an integer greater than or equal to one), and the L-th layer (output layer) includes R neurons.

An output signal of the s[1]-th neuron in the first layer (here, s[1] is an integer greater than or equal to one and less than or equal to P) is $z_{s[1]}^{(1)}$, an output signal of the s[k]-th neuron in the k-th layer (here, s[k] is an integer greater than or equal to one and less than or equal to Q[k]) is $z_{s[k]}^{(k)}$, and an output signal of the s[L]-th neuron in the L-th layer (here, s[L] is an integer greater than or equal to one and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{s[k]s[k-1]}^{(k)}$ (here, $s[k-1]$ is an integer greater than or equal to one and less than or equal to $Q[k-1]$) is input to the $s[k]$-th neuron in the k-th layer. The product $u_{s[L]}^{(L)}$ of an output signal $z_{x[L-1]}^{(L-1)}$ of the $s[L-1]$-th neuron in the (L-1)-th layer and a weight coefficient $w_{s[L]s[L-1]}^{(L)}$ (here, $s[L-1]$ is an integer greater than or equal to one and less than or equal to $Q[L-1]$) is input to the $s[L]$-th neuron in the L-th layer.

CONFIGURATION EXAMPLE 1 OF HIERARCHICAL NEURAL NETWORK

Next, an example of a semiconductor device having a hierarchical neural network is described.

Figure 1A:
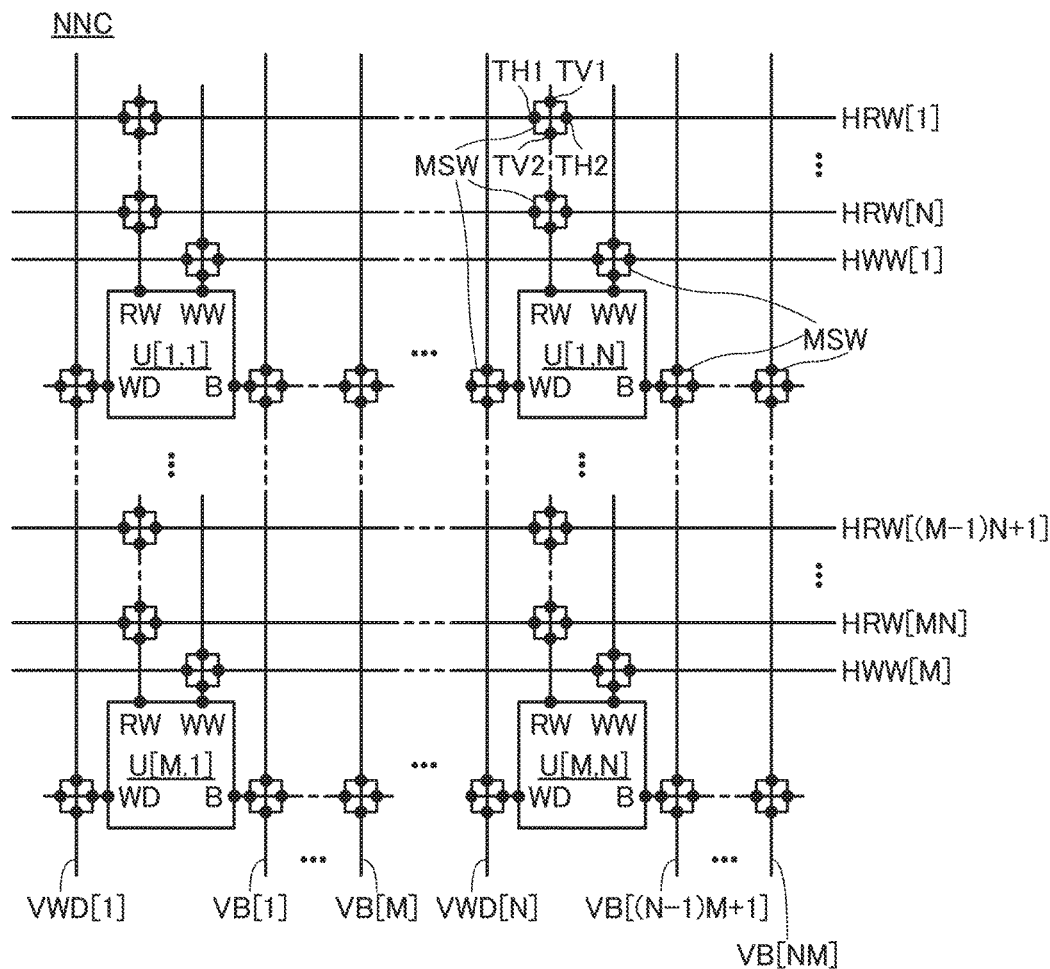
FIGS. 1A and 1B are block diagrams showing an example of a semiconductor device.

In a circuit NNC illustrated in FIG. 1A, M product-sum operation circuits are arranged in the column direction and N product-sum operation circuits are arranged in the row direction (here, M and N are each an integer greater than or equal to one); that is, the circuit NNC includes M×N product-sum operation circuits arranged in a matrix. Note that the product-sum operation circuit in the g-th row and the h-th column (here, g is an integer greater than or equal to one and less than or equal to M, and h is an integer greater than or equal to one and less than or equal to N) is denoted by U[g,h]. Note that product-sum operation circuits U[1,1] to U[M,N] each include m×n analog memory cells that are arranged in a matrix, i.e., m memory cells are arranged in the column direction and n memory cells are arranged in the row direction (here, m and n are each an integer greater than or equal to one).

The product-sum operation circuit U[g,h] can be a semiconductor device 100 described in Embodiment 2. The product-sum operation circuit U[g,h] does not necessarily include an offset circuit 110 described in Embodiment 2 and can be electrically connected to the offset circuit 110 outside the product-sum operation circuit U[g,h].

Each of the product-sum operation circuits U[1,1] to U[M,N] includes a terminal RW, a terminal WW, a terminal WD, and a terminal B. The terminals RW are m terminals connected to wirings RW[1] to RW[m] in a memory cell array 120 described in Embodiment 2. Similarly, the terminals WW are m terminals connected to wirings WW[1] to WW[m] in the memory cell array 120, the terminals WD are n terminals connected to wirings WD[1] to WD[n-1] and a wiring WDref, and the terminals B are n terminals connected to wirings B[1] to B[n-1] and a wiring Bref.

In addition, the circuit NNC includes wiring groups HRW[1] to HRW[MN], wiring groups HWW[1] to HWW[M], wiring groups VB[1] to VB[NM], and wiring groups VWD[1] to VWD[N]. Note that the wiring groups HRW[1] to HRW[MN] each include m wirings, the wiring groups HWW[1] to HWW[M] each include m wirings, the wiring groups VB[1] to VB[NM] each include n wirings, and the wiring groups VWD[1] to VWD[N] each include n wirings.

The circuit NNC includes a plurality of switch circuits MSW. The switch circuit MSW includes a terminal TV1, a terminal TV2, a terminal TH1, and a terminal TH2. Note that the terminal TV1 is electrically connected to the terminal TV2, and the terminal TH1 is electrically connected to the terminal TH2.

The switch circuit MSW has a function of electrically connecting or disconnecting a wiring between the terminal TV1 and the terminal TV2 and a wiring between the terminal TH1 and the terminal TH2. That is, the switch circuit MSW has a function of electrically connecting or disconnecting the terminals of the product-sum operation circuit U[g,h] to/from the wirings. Furthermore, the switch circuit MSW has a function of holding data (in this specification, also referred to as configuration data in some cases) for electrically connecting or disconnecting the wiring between the terminal TV1 and the terminal TV2 and the wiring between the terminal TH1 and the terminal TH2. Here, it is preferable that the switch circuit MSW include a pass transistor for electrically connecting or disconnecting the wiring between the terminal TV1 and the terminal TV2 and the wiring between the terminal TH1 and the terminal TH2, and the on/off state of the pass transistor be controlled by the configuration data.

Note that in FIG. 1A, only the following components are shown: the product-sum operation circuit U[1,1]; the product-sum operation circuit U[M,1]; the product-sum operation circuit U[1,NV]; the product-sum operation circuit U[M,N]; the wiring group HRW[1]; the wiring group HRW[N]; a wiring group HRW[(M-1)N+1]; the wiring group HRW[MN]; the wiring group HWW[1]; the wiring group HWWM; the wiring group VB[1]; the wiring group VB[M]; a wiring group VB[(N-1)M+1]; the wiring group VB[NM]; the wiring group VWD[1]; the wiring group VWD[N]; the terminal RW; the terminal WW; the terminal WD; the terminal B; the switch circuit MSW; the terminal TH1; the terminal TH2; the terminal TV1; and the terminal TV2. Other product-sum operation circuits are not shown.

Note that the configuration of the circuit NNC in FIG. 1A is not limited to the one embodiment of the present invention. Depending on the circumstances or conditions, a circuit, a wiring, an element, or the like may be removed from the configuration of the circuit NNC as appropriate. Alternatively, another circuit, another wiring, another element, or the like may be added to the configuration of the circuit NNC as appropriate.

Figure 1B:
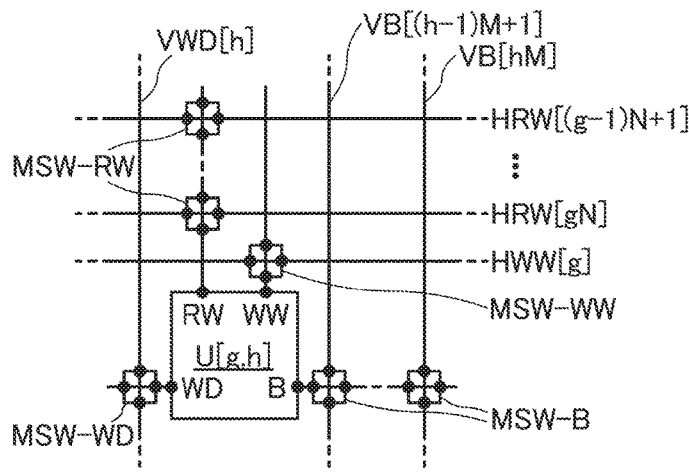

Next, the connection structure of the product-sum operation circuits U[1,1] to U[M,N], the above-described wirings, and the plurality of switch circuits MSW is described. Note that for simplicity, the description is made with a focus on the product-sum operation circuit U[g,h] illustrated in FIG. 1B. Each of the switch circuits MSW is denoted by a reference numeral of a wiring connected to the switch circuit MSW, i.e., a switch circuit MSW-RW, a switch circuit MSW-WW, a switch circuit MSW-B, and a switch circuit MSW-WD.

The terminal RW of the product-sum operation circuit U[g,h] is electrically connected to N switch circuits MSW-RW. The N switch circuits MSW-RW are electrically connected to the respective wiring groups HRW[gN] to HRW[(g-1)N+1].

The terminal WW of the product-sum operation circuit U[g,h] is electrically connected to the switch circuit MSW-WW. The switch circuit MSW-WW is electrically connected to the wiring group HWW[g].

The terminal B of the product-sum operation circuit U[g,h] is electrically connected to M switch circuits MSW-B. The M switch circuits MSW-B are electrically connected to the respective wiring groups VB[(h-1)M+1] to VB[hM].

The terminal WD of the product-sum operation circuit U[g,h] is electrically connected to the switch circuit MSW-WD. The switch circuit MSW-WD is electrically connected to the wiring group VWD[h].

CONFIGURATION EXAMPLE 1 OF SWITCH CIRCUIT MSW

Figure 4:
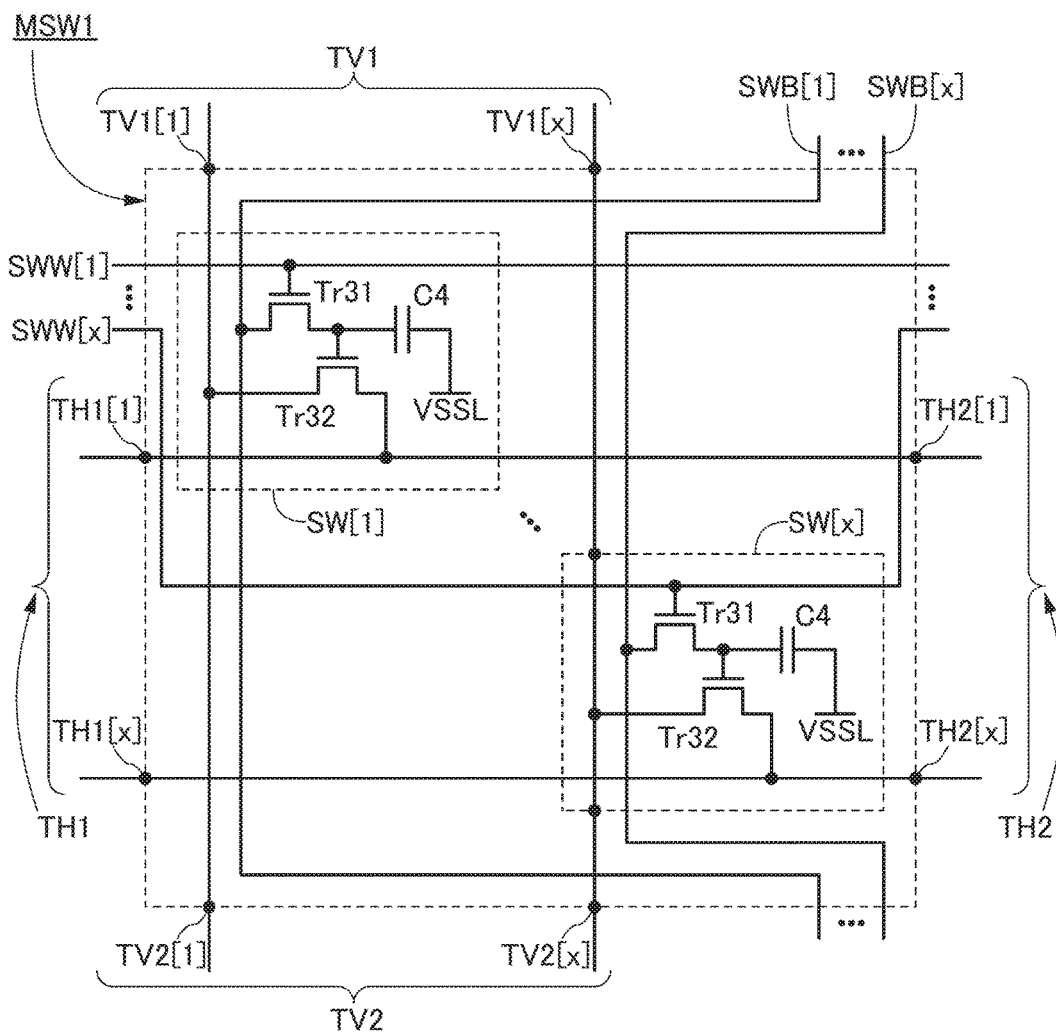
FIG. 4 is a circuit diagram illustrating a configuration example of a switch circuit.

FIG. 4 illustrates an example of the configuration of the switch circuit MSW. A switch circuit MSW1 illustrated in FIG. 4 electrically connects or disconnects x wirings to/from other x wirings. Note that x is an integer greater than or equal to one and is variable depending on the number of included wirings. For example, in the case where the switch circuit MSW1 is used for the switch circuit MSW-RW or the switch circuit MSW-WW, x may be n. Furthermore, for example, in the case where the switch circuit MSW1 is used for the switch circuit MSW-B or the switch circuit MSW-WD, x may be m.

The switch circuit MSW1 includes the terminal TV1, the terminal TV2, the terminal TH1, and the terminal TH2. The terminal TV1 includes terminals TV1[1] to TV1[$x$], the terminal TV2 includes terminals TV2[1] to TV2[$x$], the terminal TH1 includes terminals TH1[1] to TH1[$x$], and the terminal TH2 includes terminals TH2[1] to TH2[$x$].

A terminal TV1[$x_0$] (here, $x_0$ is an integer greater than or equal to one and less than or equal to x) is electrically connected to a terminal TV2[$x_0$], and a terminal TH1[$x_0$] is electrically connected to a terminal TH2[$x_0$]. Note that in FIG. 4, the terminals TV1[$x_0$], TV2[$x_0$], TH1[$x_0$], and TH2[$x_0$] are not illustrated.

The switch circuit MSW1 includes circuits SW[1] to SW[$x$]. Each of the circuits SW[1] to SW[$x$] includes a transistor Tr31, a transistor Tr32, and a capacitor C4.

Here, for the configuration of the circuits SW[1] to SW[$x$], the description is made with a focus on the circuit SW[$x_0$]. A first terminal of the transistor Tr31 is electrically connected to a wiring SWB[$x_0$], a second terminal of the transistor Tr31 is electrically connected to a first terminal of the capacitor C4, and a gate of the transistor Tr31 is electrically connected to a wiring SWW[$x_0$]. A first terminal of the transistor Tr32 is electrically connected to the terminals TV1[$x_0$] and TV2[$x_0$], a second terminal of the transistor Tr32 is electrically connected to the terminals TH1[$x_0$] and TH2[$x_0$], and a gate of the transistor Tr32 is electrically connected to the first terminal of the capacitor C4. A second terminal of the capacitor C4 is electrically connected to a wiring VSSL. Note that a portion where the second terminal of the transistor Tr31, the first terminal of the capacitor C4, and the gate of the transistor Tr32 are connected is referred to as a holding node in the circuit SW[$x_0$].

The wiring SWW[$x_0$] supplies a selection signal to the circuit SW[$x_0$], and the wiring SWB[$x_0$] supplies configuration data to the circuit SW[$x_0$]. When a high-level potential is supplied from the wiring SWW[$x_0$], the high-level potential is supplied to the gate of the transistor Tr31 in the circuit SW[$x_0$]; accordingly, the transistor Tr31 is turned on. At this time, a potential corresponding to configuration data is supplied from the wiring SWB[$x_0$], and thus the potential is written in the holding node. Then, the transistor Tr31 is turned off by supplying a low-level potential from the wiring SWW[$x_0$]; accordingly, the potential corresponding to configuration data can be held. Since the potential corresponding to configuration data is applied to the gate of the transistor Tr32, whether the transistor Tr32 is on or off is determined by the configuration data.

Note that wirings SWW[1] to SWW[$x$] are illustrated in FIG. 4; however, one embodiment of the present invention is not limited thereto. For example, when the wirings SWW[1] to SWW[$x$] are not separately provided and one wiring may be shared therebetween, the circuits SW[1] to SW[$x$] can be selected all together. Accordingly, configuration data can be written to the circuits SW[1] to SW[$x$] at the same time.

Furthermore, wirings SWB[1] to SWB[$x$] are illustrated in FIG. 4; however, one embodiment of the present invention is not limited thereto. For example, when the wirings SWB[1] to SWB[$x$] are not separately provided and one wiring may be shared therebetween, the area of the switch circuit MSW1 can be reduced. In this case, the circuits SW[1] to SW[$x$] are sequentially selected by the wirings SWW[1] to SWW[$x$], and predetermined configuration data is written to the selected circuit.

Note that in the switch circuit MSW1 of FIG. 4, only the following components are shown: the circuit SW[1]; the circuit SW[$x$]; the wiring SWW[1]; the wiring SWW[$x$]; the wiring SWB[1]; the wiring SWB[$x$]; the wiring VSSL; the terminal TV1; the terminal TV1[1]; the terminal TV1[$x$]; the terminal TV2; the terminal TV2[1]; the terminal TV2[$x$]; the terminal TH1; the terminal TH1[1]; the terminal TH1 [$x$]; the terminal TH2; the terminal TH2[1]; the terminal TH2[$x$]; the transistor Tr31; the transistor Tr32; and the capacitor C4. Other wirings, circuits, and elements and reference numerals thereof are not shown.

CONFIGURATION EXAMPLE 2 OF SWITCH CIRCUIT MSW

Figure 5:
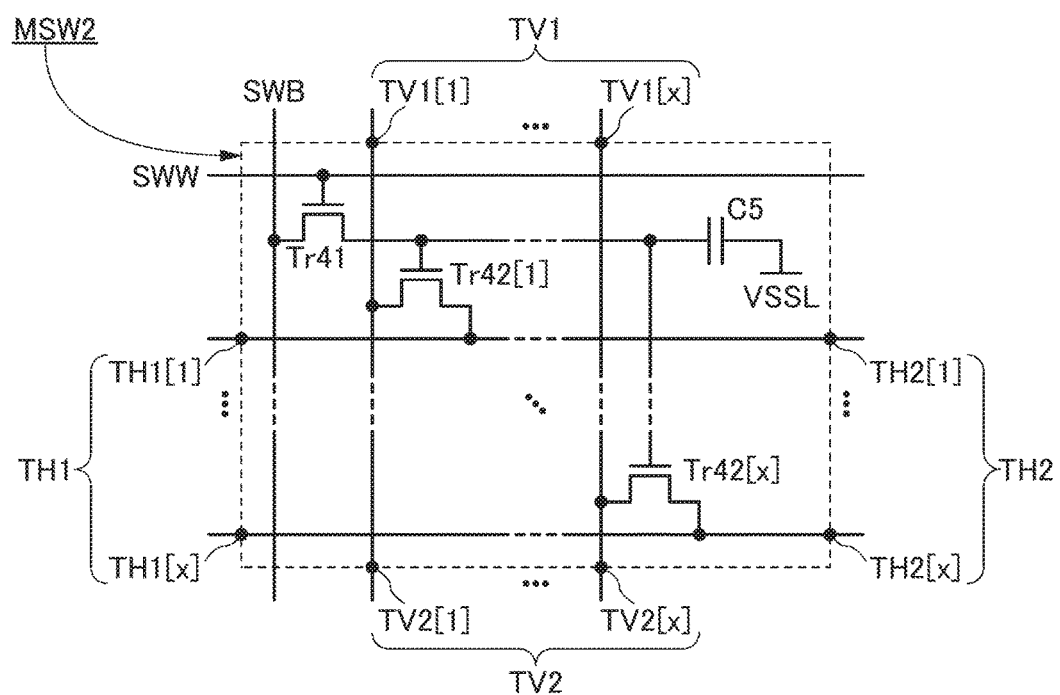
FIG. 5 is a circuit diagram illustrating a configuration example of a switch circuit.

FIG. 5 illustrates another example of the configuration of the switch circuit MSW, which is different from that in FIG. 4. Like the switch circuit MSW1, a switch circuit MSW2 illustrated in FIG. 5 electrically connects or disconnects x wirings to/from other x wirings. Note that x is variable depending on the number of included wirings.

The switch circuit MSW2 includes the terminal TV1, the terminal TV2, the terminal TH1, and the terminal TH2. The terminal TV1 includes terminals TV1[1] to TV1[$x$], the terminal TV2 includes terminals TV2[1] to TV2[$x$], the terminal TH1 includes terminals TH1[1] to TH1[$x$], and the terminal TH2 includes terminals TH2[1] to TH2[$x$].

The terminal TV1[$x_0$] is electrically connected to the terminal TV2[$x_0$], and the terminal TH1[$x_0$] is electrically connected to the terminal TH2[$x_0$]. Note that in FIG. 5, the terminals TV1[$x_0$], TV2[$x_0$], TH1[$x_0$], and TH2[$x_0$] are not illustrated.

The switch circuit MSW2 includes a transistor Tr41, transistors Tr42[1] to Tr42[$x$], and a capacitor C5.

Here, the configuration of the switch circuit MSW2 is described. A first terminal of the transistor Tr41 is electrically connected to a wiring SWB, a second terminal of the transistor Tr41 is electrically connected to gates of the transistors Tr42[1] to Tr42[$x$], and a gate of the transistor Tr41 is electrically connected to a wiring SWW. A first terminal of the transistor Tr42[$x_0$] is electrically connected to the terminals TV1[$x_0$] and TV2[$x_0$], and a second terminal of the transistor Tr42[$x_0$] is electrically connected to the terminals TH1[$x_0$] and TH2[$x_0$]. A first terminal of the capacitor C5 is electrically connected to the second terminal of the transistor Tr41, and a second terminal of the capacitor C5 is electrically connected to the wiring VSSL. Note that a portion where the second terminal of the transistor Tr41, the first terminal of the capacitor C5, and the gates of the transistors Tr42[1] to Tr42[$x$] are connected is referred to as a holding node in the switch circuit MSW2.

The wiring SWW supplies a potential to the gate of the transistor Tr41 in the switch circuit MSW2, and the wiring SWB supplies configuration data to the switch circuit MSW2. When the high-level potential is supplied from the wiring SWW, the high-level potential is supplied to the gate of the transistor Tr41; accordingly, the transistor Tr41 is turned on. At this time, a potential corresponding to configuration data is supplied from the wiring SWB, and thus the potential is written in the holding node. Then, the low-level potential is supplied to the wiring SWW so that the transistor Tr41 is turned off; accordingly, the potential corresponding to configuration data can be held. Since the potential corresponding to configuration data is applied to the gates of the transistors Tr42[1] to Tr42[x], whether the transistors Tr42[1] to Tr42[x] are on or off is determined all at once by the configuration data.

Note that in the switch circuit MSW2 of FIG. 5, only the following components are shown: the wiring SWW; the wiring SWB; the wiring VSSL; the terminal TV1; the terminal TV1[1]; the terminal TV1[x]; the terminal TV2; the terminal TV2[1]; the terminal TV2[x]; the terminal TH1; the terminal TH1[1]; the terminal TH1[x]; the terminal TH2; the terminal TH2[1]; the terminal TH2[x]; the transistor Tr41; the transistor Tr42[1]; the transistor Tr42[x]; and the capacitor C5. Other wirings, circuits, and elements and the reference numerals thereof are not shown.

With use of the OS transistors as the transistors Tr31, Tr32, Tr41, and Tr42[1] to Tr42[x], the leakage current of each of the transistors Tr31, Tr32, Tr41, and Tr42[1] to Tr42[x] can be suppressed, which enables a product-sum operation circuit with high calculation accuracy to be fabricated in some cases. Furthermore, with use of the OS transistor as the transistor Tr31 or Tr41, the amount of leakage current from a holding node to any of the wirings SWB[1] to SWB[x] or the wiring SWB when the transistor Tr31 or Tr41 are in an off state can be extremely small. In other words, frequencies of refresh operation at the holding node can be reduced; thus, power consumption of a semiconductor device can be reduced.

Although an n-channel transistor is illustrated as the transistor Tr32 in FIG. 4, the transistor Tr32 may be a p-channel transistor. Similarly, although n-channel transistors are illustrated as the transistors Tr42[1] to Tr42[x] in FIG. 5, the transistors Tr42[1] to Tr42[x] may be p-channel transistors.

CONFIGURATION EXAMPLE 2 OF HIERARCHICAL NEURAL NETWORK

Figure 6:
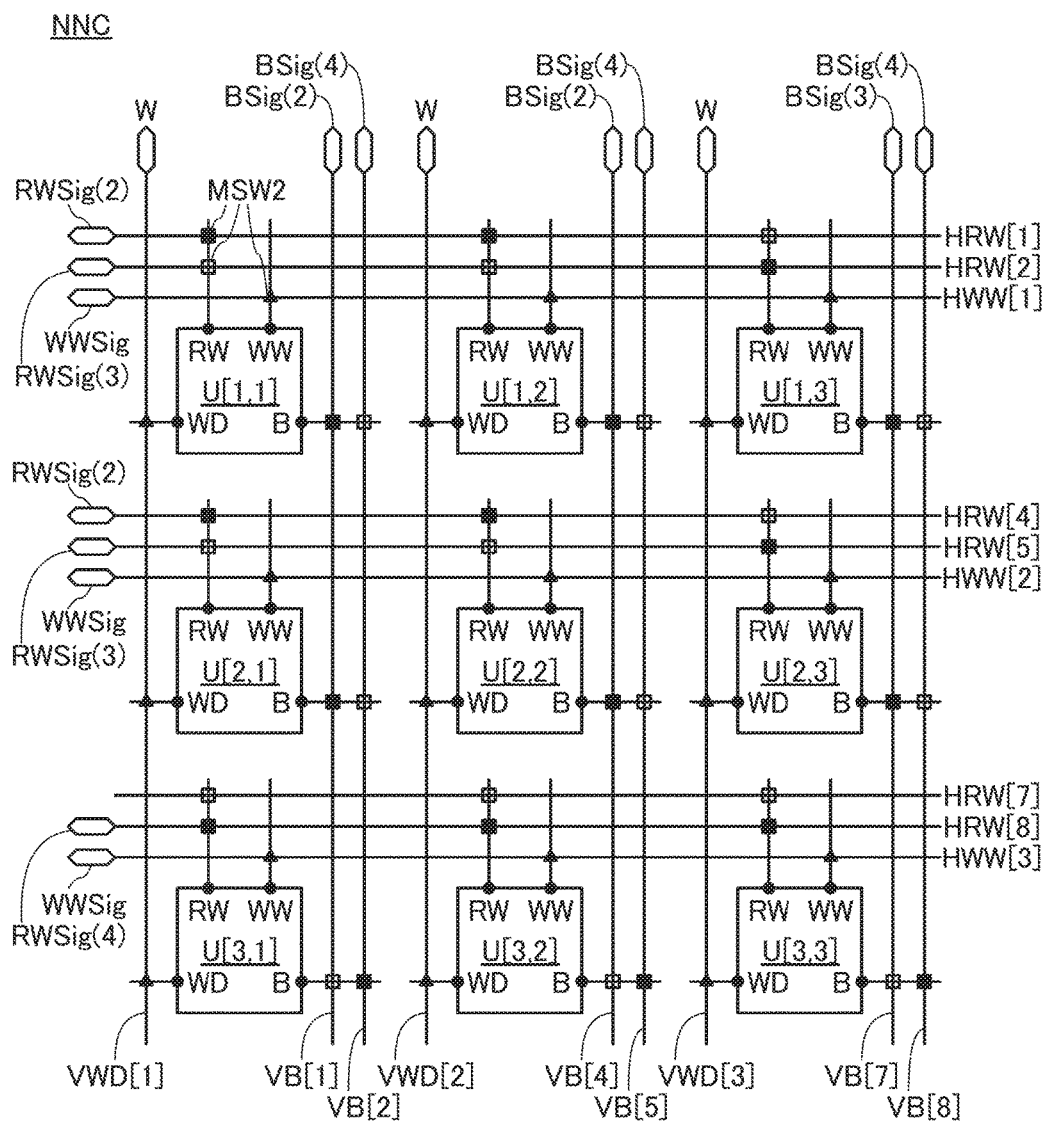
FIG. 6 is a block diagram illustrating an example of a semiconductor device.

FIG. 6 illustrates a specific example of the circuit NNC illustrated in FIG. 1A.

The circuit NNC in FIG. 6 includes the product-sum operation circuits U[1,1], U[1,2], U[1,3], U[2,1], U[2,2], U[2,3], U[3,1], U[3,2], and U[3,3]. That is, the circuit NNC in FIG. 6 corresponds to the circuit NNC in FIG. 1A in which M is three and N is three.

As for the wirings of the circuit NNC in FIG. 6, the wiring groups HRW[3], HRW[6], HRW[9], VB[3], VB[6], and VB[9] are removed from the configuration of the circuit NNC in FIG. 1A in which M is three and N is three. In other words, the circuit NNC in FIG. 6 includes the wiring groups HRW[1], HRW[2], HRW[4], HRW[5], HRW[7], HRW[8], HWW[], HWW[2], HWW[3], VB[1], VB[2], VB[4], VB[5], VB[7], VB[8], VWD[1], VWD[2], and VWD[3].

The memory cell array 120 in each of the product-sum operation circuits U[1,1] to U[3,3] includes $n^2$ memory cells AM. In the memory cell array 120 in each of the product-sum operation circuits U[1,1] to U[3,3], n memory cells AM are arranged in the column direction and n memory cells AM are arranged in the row direction, that is, n×n memory cells AM are arranged in a matrix.

Each of the wiring groups HRW[1], HRW[2], HRW[4], HRW[5], HRW[7], HRW[8], HWW[1] to HWW[3], VB[1], VB[2], VB[4], VB[5], VB[7], VB[8], and VWD[1] to VWD [3] includes n wirings. Furthermore, each of the wiring groups HRW[1], HRW[2], HRW[4], HRW[5], HRW[7], HRW[8], and HWW[1] to HWW[3] is electrically connected to the terminals RW or the terminals WW of the product-sum operation circuits via the switch circuits MSW2. Similarly, each of the wiring groups VB[1], VB[2], VB[4], VB[5], VB[7], VB[8], and VWD[1] to VWD[3] is electrically connected to the terminals WD or the terminals B of the product-sum operation circuits via the switch circuits MSW2.

The details of the switch circuit MSW2 are the same as those of Configuration example 1 of hierarchical neural network, which is described above. Thus, when the high-level potential is supplied to the holding node of the switch circuit MSW2, wirings and terminals that are connected via the switch circuit MSW2 are electrically connected. When the low-level potential is supplied to the holding node of the switch circuit MSW2, the wirings and the terminals that are connected via the switch circuit MSW2 are electrically disconnected. In FIG. 6, the switch circuit MSW2 that is in a conducting state is denoted by a black square, the switch circuit MSW2 that is in a non-conducting state is denoted by a white square, and the switch circuit MSW2 whose conducting and non-conducting states are switched during the operation of the circuit NNC is denoted by a black regular triangle. Note that instead of the switch circuit MSW2, the switch circuit MSW1 may be used.

In the circuit NNC in FIG. 6, an input layer (first layer) includes 2n neurons, a first hidden layer (second layer) includes 2n neurons, a second hidden layer (third layer) includes n neurons, and an output layer (fourth layer) includes 3n neurons.

Weight coefficients W(2) for inputs to neurons in the first hidden layer are stored in the memory cells AM of the product-sum operation circuits U[1,1], U[1,2], U[2,1], and U[2,2]. Weight coefficients W(3) for inputs to neurons in the second hidden layer are stored in the memory cells AM of the product-sum operation circuits U[1,3] and U[2,3]. Furthermore, weight coefficients W(4) for inputs to neurons in the output layer are stored in the memory cells AM of the product-sum operation circuits U[3,1], U[3,2], and U[3,3]. Note that each of the wiring groups HWW[1] to HWW[3] corresponds to wirings WW (3n signal lines), and each of the wiring groups VWD[1] to VWD[3] corresponds to wirings WD (3n signal lines). Selection signals WWSig are sequentially transmitted to the wirings WW, and data corresponding to the selection signals WWSig (denoted by W in FIG. 6) are supplied to the wirings WD, so that weight coefficients can be stored in the memory cells AM in the product-sum operation circuits.

Input of a signal to the first hidden layer and output of a signal from the first hidden layer are described. The outputs of the 2n neurons of the input layer are stored as 2n signals RWSig(2) in the product-sum operation circuits U[1,1], U[1,2], U[2,1], and U[2,2] via 2n signal lines of the wiring groups HRW[1] and HRW[4]. The outputs of the product-sum operation circuits U[1,1], U[1,2], U[2,1], and U[2,2] are output as 2n signals BSig(2) via 2n signal lines of the wiring groups VB[1] and VB [4]. That is, each of the 2n signals BSig(2) has a value of the sum of products of signals output from neurons in the input layer and the weight coefficient W(2) (the value is also referred to as a net value). The 2n signals BSig(2) are output from the wiring groups VB[1] and VB[4], and then an activation function is obtained from the value of the sum of products, so that neuron signals output from the first hidden layer can be generated.

Input of a signal to the second hidden layer and output of a signal from the second hidden layer are described. The outputs of the 2n neurons of the first hidden layer are stored as 2n signals RWSig(3) in the product-sum operation circuits U[1,3] and U[2,3] via 2n signal lines of the wiring groups HRW[2] and HRW[5]. The outputs of the product-sum operation circuits U[1,3] and U[2,3] are output as n signals BSig(3) via n signal lines of the wiring group VB[7]. That is, each of the n signals BSig(3) has a value of the sum of products of signals output from neurons in the first hidden layer and the weight coefficient W(3). The n signals BSig(3) are output from the wiring group VB[7], and then an activation function is obtained from the value of the sum of products, so that neuron signals output from the second hidden layer can be generated.

Input of a signal to the output layer and output of a signal from the output layer are described. The outputs of the n neurons of the second hidden layer are stored as n signals RWSig(4) in the product-sum operation circuits U[3,1], U[3,2], and U[3,3] via n signal lines of the wiring group HRW[8]. The outputs of the product-sum operation circuits U[3,1], U[3,2], and U[3,3] are output as 3n signals BSig(4) via 3n signal lines of the wiring groups VB[2], VB[5], and VB[8]. That is, each of the 3n signals BSig(4) has a value of the sum of products of signals output from neurons in the second hidden layer and the weight coefficient W(4). The 3n signals BSig(4) are output from the wiring groups VB[2], VB[5], and VB[8], and then an activation function is obtained from the value of the sum of products, so that neuron signals output from the second hidden layer can be generated.

As described above, the switches that connect or disconnect the plurality of wirings to/from the plurality of product-sum operation circuits are provided between the wirings and the product-sum operation circuits, so that the connection of the circuits of the hierarchical neural network can be freely changed. Accordingly, product-sum operation can be performed at high speed with a small circuit size, and a semiconductor device with low power consumption can be fabricated.

Note that this embodiment can be combined with any of the other embodiments in this specification as appropriate.

Embodiment 2

In this embodiment, the product-sum operation circuit described in Embodiment 1 is described. Note that in the product-sum operation circuit, the sum of products of first analog data and second analog data is conducted.

<Configuration Example>

Figure 7:
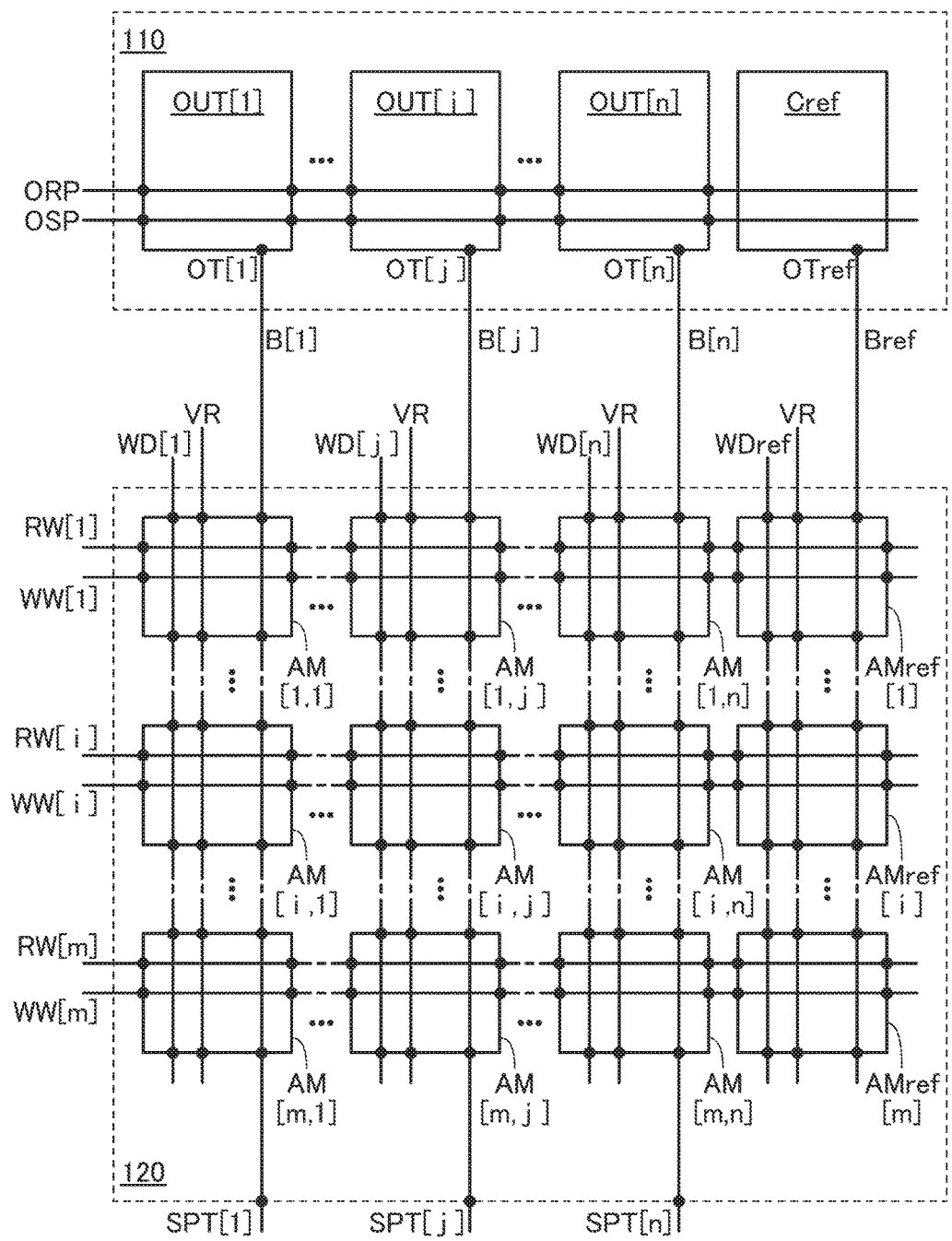
FIG. 7 is a block diagram illustrating an example of a semiconductor device.

FIG. 7 shows an example of a semiconductor device of one embodiment of the present invention. FIG. 7 is a block diagram of a product-sum operation circuit. The semiconductor device 100 includes the offset circuit 110 and the memory cell array 120.

The offset circuit 110 includes column output circuits OUT[1] to OUT[n] (here, n is an integer greater than or equal to 1) and a reference column output circuit Cref.

In the memory cell array 120, m (here, m is an integer greater than or equal to 1) memory cells AM are arranged in the column direction and n memory cells AM are arranged in the row direction; that is, m×n memory cells AM are provided. In addition, m memory cells AMref are arranged in the column direction. The total number of the memory cells AM and the memory cells AMref arranged in a matrix in the memory cell array 120 is m×(n+1). In particular, in the memory cell array 120 in FIG. 7, the memory cell AM positioned in an i-th row and a j-th column is denoted by a memory cell AM[i,j] (here, i is an integer greater than or equal to 1 and less than or equal to m, and j is an integer greater than or equal to 1 and less than or equal to n), and the memory cell AMref positioned in the i-th row is denoted by a memory cell AMref[i].

Note that the memory cell array in the product-sum operation circuit of Embodiment 1 includes m×n analog memory cells arranged in a matrix, i.e., m analog memory cells are arranged in the column direction and n analog memory cells are arranged in the row direction, whereas the memory cell array in the product-sum operation circuit of this embodiment includes m×(n+1) analog memory cells that are arranged in a matrix, i.e., m analog memory cells are arranged in the column direction and (n+1) analog memory cells are arranged in the row direction. Thus, when this embodiment is applied to Embodiment 1, the memory cell array in the product-sum operation circuit is an analog memory cell array in which memory cells are arranged in a matrix of m×(n+1), not m×n.

The memory cell AM holds a potential corresponding to the first analog data, and the memory cell AMref holds a predetermined potential. Note that the predetermined potential is a potential necessary for the product-sum operation, and in this specification, data corresponding to this predetermined potential is referred to as reference analog data in some cases.

The memory cell array 120 includes output terminals SPT[1] to SPT[n].

The column output circuit OUT[j] includes an output terminal OT[j], and the reference column output circuit Cref includes an output terminal OTref.

A wiring ORP is electrically connected to the column output circuits OUT[1] to OUT[n], and a wiring OSP is electrically connected to the column output circuits OUT[1] to OUT[n]. The wiring ORP and the wiring OSP are wirings for supplying a control signal to the offset circuit 110.

An output terminal SPT[j] of the memory cell array 120 is electrically connected to a wiring B[j].

The output terminal OT[j] of the column output circuit OUT[j] is electrically connected to the wiring B[j].

The output terminal OTref of the reference column output circuit Cref is electrically connected to a wiring Bref.

The memory cell AM[i,j] is electrically connected to a wiring RW[1], a wiring WW[i], a wiring WD[j], the wiring B[j], and a wiring VR.

The memory cell AMref[i] is electrically connected to the wiring RW[i], the wiring WW[i], a wiring WDref, the wiring Bref, and the wiring VR.

The wiring WW[i] functions as a wiring for supplying a selection signal to memory cells AM[i,1] to AMref[i,n] and the memory cell AMref[i]. The wiring RW[i] functions as a wiring for supplying either a reference potential or a potential corresponding to the second analog data to the memory cells AM[i,1] to AM[i,n] and the memory cell AMref[i]. The wiring WD[j] functions as a wiring for supplying writing data to the memory cells AM in the j-th column. The wiring VR functions as a wiring for supplying a predetermined potential to the memory cells AM or the memory cells AMref when data is read out from the memory cells AM or the memory cells AMref.

The wiring B[j] functions as a wiring for supplying a signal from the column output circuit OUT[j] to the memory cells AM in the j-th column in the memory cell array 120.

The wiring Bref functions as a wiring for supplying a signal from the reference column output circuit Cref to memory cells AMref[1] to AMref[m].

In the semiconductor device 100 in FIG. 7, only the following components are shown: the offset circuit 110; the memory cell array 120; the column output circuit OUT[1];

the column output circuit OUT[j]; the column output circuit OUT[n]; the reference column output circuit Cref; an output terminal OT[1]; the output terminal OT[j]; an output terminal OT[n]; the output terminal OTref; an output terminal SPT[1]; the output terminal SPT[j]; an output terminal SPT[n]; a memory cell AM[1,1]; the memory cell AM[i,1]; a memory cell AM[m,1]; a memory cell AM[1,j]; the memory cell AM[i,j]; a memory cell AM[m,j]; a memory cell AM[1,n]; the memory cell AM[i,n]; a memory cell AM[m,n]; a memory cell AMref[1]; the memory cell AMref[i]; a memory cell AMref[m]; the wiring OSP; the wiring ORP; a wiring B[1]; the wiring B[j]; a wiring B[n]; the wiring Bref; a wiring WD[1]; the wiring WD[j]; a wiring WD[n]; the wiring WDref; the wiring VR; a wiring RW[1]; the wiring RW[i]; a wiring RW[m]; a wiring WW[1]; the wiring WW[i]; and a wiring WW[m]. Other circuits, wirings, elements, and reference numerals thereof are not shown.

Note that a structure of one embodiment of the present invention is not limited to the configuration of the semiconductor device 100 shown in FIG. 7. Depending on circumstances or conditions or as needed, the structure of the semiconductor device 100 can be changed. For example, depending on a circuit configuration of the semiconductor device 100, the wiring WD[j] and the wiring VR are not separately provided, and one wiring may be shared therebetween. Alternatively, depending on a circuit configuration of the semiconductor device 100, the wiring ORP and the wiring OSP are not separately provided, and one wiring may be shared therebetween.

<<Offset Circuit 110>>

Figure 8:
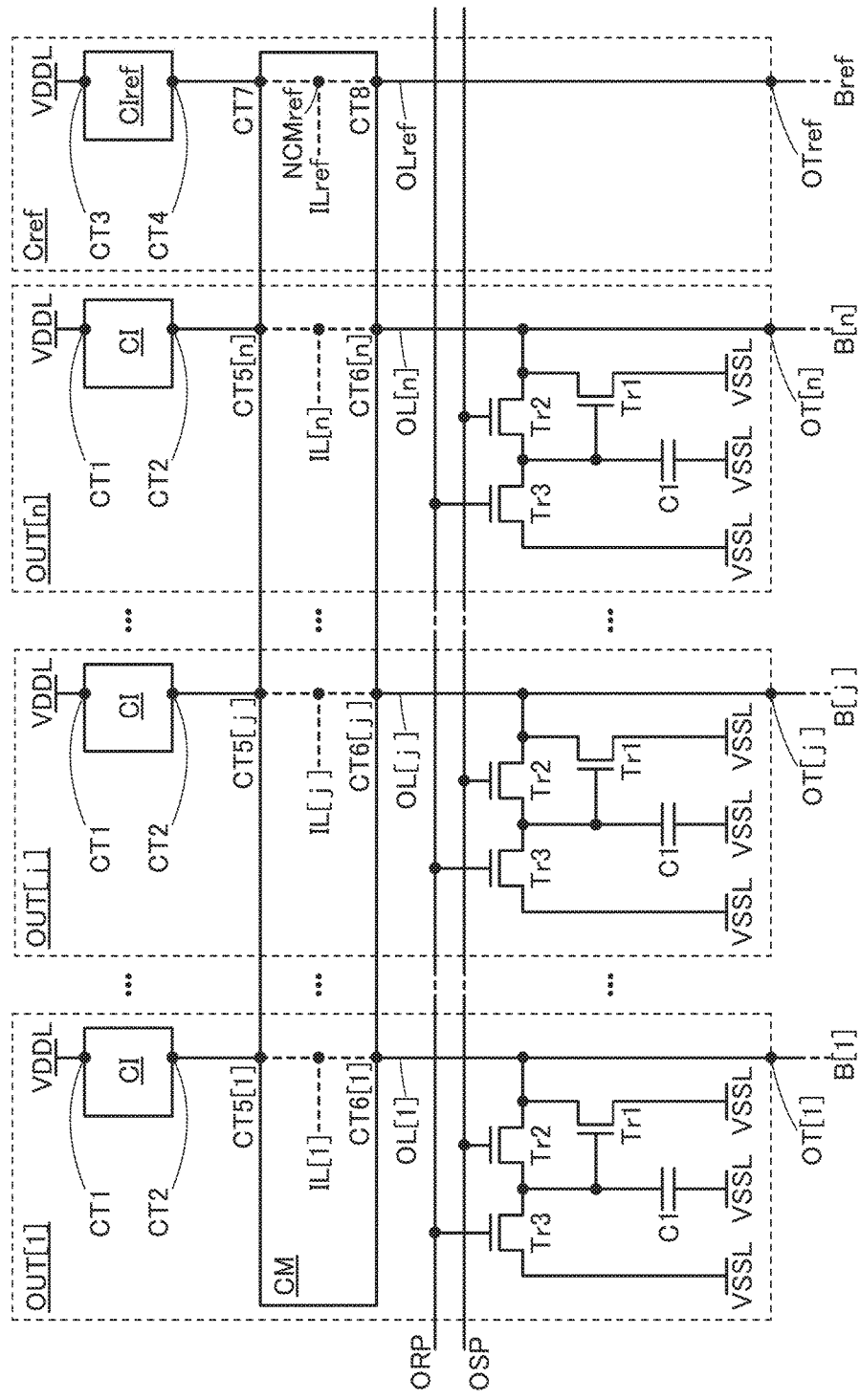
FIG. 8 is a circuit diagram showing an example of an offset circuit in the semiconductor device of FIG. 7.

Next, an example of a circuit configuration that can be applied for the offset circuit 110 is described. FIG. 8 shows an offset circuit 111 as an example of the offset circuit 110.

The offset circuit 111 is electrically connected to a wiring VDDL and the wiring VSSL for supplying a power supply voltage. Specifically, each of the column output circuits OUT[1] to OUT[n] are electrically connected to the wiring VDDL and the wiring VSSL, and the reference column output circuit Cref is electrically connected to the wiring VDDL. Note that a current mirror circuit CM described later is electrically connected to the wiring VSSL in some cases. The wiring VDDL supplies the high-level potential. The wiring VSSL supplies the low-level potential.

A circuit configuration of an inside of the column output circuit OUT[j] is described below. The column output circuit OUT[j] includes a constant current circuit CI, transistors Tr1 to Tr3, a capacitor C1, and a wiring OL[j]. The current mirror circuit CM is shared between the column output circuits OUT[1] to OUT[n] and the reference column output circuit Cref.

The constant current circuit CI includes a terminal CT1 and a terminal CT2. The terminal CT1 functions as an input terminal of the constant current circuit CI, and the terminal CT2 functions as an output terminal of the constant current circuit CI. The current mirror circuit CM shared between the column output circuits OUT[1] to OUT[n] and the reference column output circuit Cref includes terminals CT5[1] to CT5[n], terminals CT6[1] to CT6[n], a terminal CT7, and a terminal CT8.

The constant current circuit CI has a function of keeping the amount of current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of a transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

Note that each of the transistors Tr1 to Tr3 is preferably an OS transistor. In addition, each channel formation region in the transistors Tr1 to Tr3 is preferably formed using an oxide containing at least one of indium, an element M (the element M is aluminum, gallium, yttrium, or tin), and zinc.

The OS transistor has a characteristic of extremely low off-state current. Thus, when the OS transistor is in an off state, the amount of leakage current flowing between a source and a drain can be extremely small. In particular, when an OS transistor is used as the transistor Tr2, the electric charge held in the capacitor C1 can be prevented from flowing between a source and a drain of the transistor Tr2 that is off. Furthermore, when an OS transistor is used as the transistor Tr3, the electric charge held in the capacitor C1 can be prevented from flowing between a source and a drain of the transistor Tr3 that is off. Accordingly, the potential of a gate of the transistor Tr1 can be held for a long time; thus, a stable constant current can flow between a source and a drain of the transistor Tr1. As a result, the product-sum operation circuit can have high calculation accuracy in some cases.

In the column output circuit OUT[j], the terminal CT1 of the constant current circuit CI is electrically connected to the wiring VDDL, and the terminal CT2 of the constant current circuit CI is electrically connected to the terminal CT5[j] of the current mirror circuit CM. The terminal CT6[j] of the current mirror circuit CM is electrically connected to the output terminal OT[j].

Note that the wiring OL[j] is a wiring for electrically connecting the terminal CT2 of the constant current circuit CI to the output terminal OT[j] through the terminal CT5[j] and the terminal CT6[j] of the current mirror circuit CM.

Next, the reference column output circuit Cref is described. The reference column output circuit Cref includes a constant current circuit CIref and a wiring OLref. As described above, the reference column output circuit Cref includes the current mirror circuit CM that is shared with the column output circuits OUT[1] to OUT[n].

The constant current circuit CIref includes a terminal CT3 and a terminal CT4. The terminal CT3 functions as an input terminal of the constant current circuit CIref, and the terminal CT4 functions as an output terminal of the constant current circuit CIref.

The constant current circuit CIref has a function of keeping the amount of current flowing from the terminal CT3 to the terminal CT4 constant.

In the reference column output circuit Cref, the terminal CT3 of the constant current circuit CIref is electrically connected to the wiring VDDL, and the terminal CT4 of the constant current circuit CIref is electrically connected to the terminal CT7 of the current mirror circuit CM. The terminal CT8 of the current mirror circuit CM is electrically connected to the output terminal OTref.

The wiring OLref is a wiring for electrically connecting the terminal CT4 of the constant current circuit CIref to the output terminal OTref, and the terminals CT7 and CT8 in the current mirror circuit CM are on the wiring OLref.

In the current mirror circuit CM, the terminal CT5[j] is electrically connected to the terminal CT6[j], and the terminal CT7 is electrically connected to the terminal CT8. In addition, a wiring IL[j] is electrically connected between the terminal CT5[j] and the terminal CT6[j], and a wiring ILref is electrically connected between the terminal CT7 and the terminal CT8. Furthermore, a connection portion of the wiring ILref between the terminal CT7 and the terminal CT8 is a node NCMref. The current mirror circuit CM has a function of equalizing the amount of current flowing in the wiring ILref and the amount of current flowing in each of wirings IL[1] to IL[n] with reference to the potential at the node NCMref.

In the offset circuit 111 in FIG. 8, only the following components are shown: the column output circuit OUT[1]; the column output circuit OUT[j]; the column output circuit OUT[n]; the reference column output circuit Cref; the constant current circuit CI; the constant current circuit CIref; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the capacitor C1; a wiring OL[1]; the wiring OL[j]; a wiring OL[n]; the wiring OLref; the wiring ORP; the wiring OSP; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that a structure of one embodiment of the present invention is not limited to the configuration of the offset circuit 111 in FIG. 8. Depending on circumstances or conditions or as needed, the structure of the offset circuit 111 can be changed.

[Constant Current Circuits CI and CIref]

Next, an example of internal structures of the constant current circuit CI and the constant current circuit CIref is described.

Figure 9:
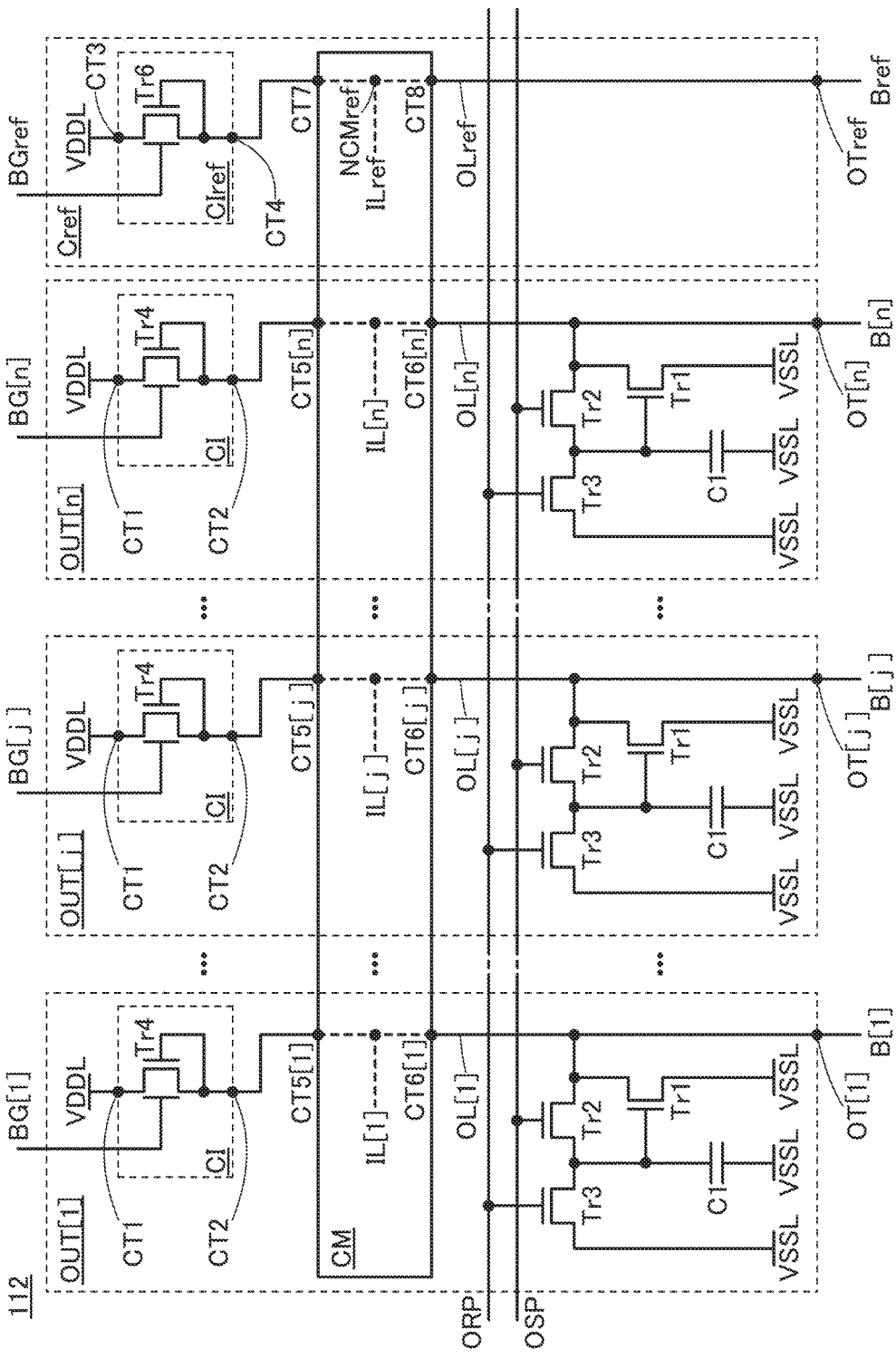
FIG. 9 is a circuit diagram showing an example of an offset circuit in the semiconductor device of FIG. 7.

An offset circuit 112 shown in FIG. 9 is a circuit diagram showing an example of internal structures of the constant current circuit CI and the constant current circuit CIref included in the offset circuit 111 shown in FIG. 8.

In the column output circuit OUT[j], the constant current circuit CI includes a transistor Tr4. The transistor Tr4 has a dual gate structure including a first gate and a second gate.

Note that in this specification, the first gate in the transistor having a dual gate structure indicates a front gate, and a term "first gate" can be replaced with a simple term "gate". Besides, the second gate in the transistor having a dual gate structure indicates a back gate, and a term "second gate" can be replaced with a term "back gate".

A first terminal of the transistor Tr4 is electrically connected to the terminal CT1 of the constant current circuit CI. A second terminal of the transistor Tr4 is electrically connected to the terminal CT2 of the constant current circuit CI. A gate of the transistor Tr4 is electrically connected to the terminal CT2 of the constant current circuit CI. A back gate of the transistor Tr4 is electrically connected to a wiring BG[j].

In the reference column output circuit Cref, the constant current circuit CIref includes a transistor Tr6. The transistor Tr6 has a dual gate structure including a gate and a back gate.

A first terminal of the transistor Tr6 is electrically connected to the terminal CT3 of the constant current circuit CIref. A second terminal of the transistor Tr6 is electrically connected to the terminal CT4 of the constant current circuit CIref. The gate of the transistor Tr6 is electrically connected to the terminal CT4 of the constant current circuit CIref. The back gate of the transistor Tr6 is electrically connected to a wiring BGref.

In the above connection structure, the threshold voltages of the transistor Tr4 and the transistor Tr6 can be controlled when a potential is supplied to the wiring BG[j] and the wiring BGref.

Each of the transistor Tr4 and the transistor Tr6 is preferably an OS transistor. In addition, each channel formation region in the transistors Tr4 and Tr6 is preferably formed using an oxide containing at least one of indium, the element M, and zinc.

In the offset circuit 112 shown in FIG. 9, only the following components are shown: the column output circuit OUT[1]; the column output circuit OUT[j]; the column output circuit OUT[n]; the reference column output circuit Cref; the constant current circuit CI; the constant current circuit CIref; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr4; the transistor Tr6; the capacitor C1; the wiring OL[1]; the wiring OL[j]; the wiring OL[n]; the wiring OLref; the wiring ORP; the wiring OSP; the wiring B[1]; the wiring B[j]; the wiring B[n]; the wiring Bref; a wiring BG[1]; the wiring BG[j]; a wiring BG[n]; the wiring BGref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that the configurations of the constant current circuits CI and CIref in the offset circuit of one embodiment of the present invention are not limited to those in the offset circuit 112 in FIG. 9. For example, depending on circumstances, conditions, or necessity, the component, such as a circuit, an element, or a wiring, of the offset circuit 112 can be removed; another component, such as a circuit, an element, or a wiring, can be added to the offset circuit 112; or the connection structure of the offset circuit 112 can be changed. For example, as illustrated in an offset circuit 115 of FIG. 10, the configuration of the constant current circuit CI in the offset circuit 112 may be changed and the constant current circuit CIref may be removed.

Figure 10:
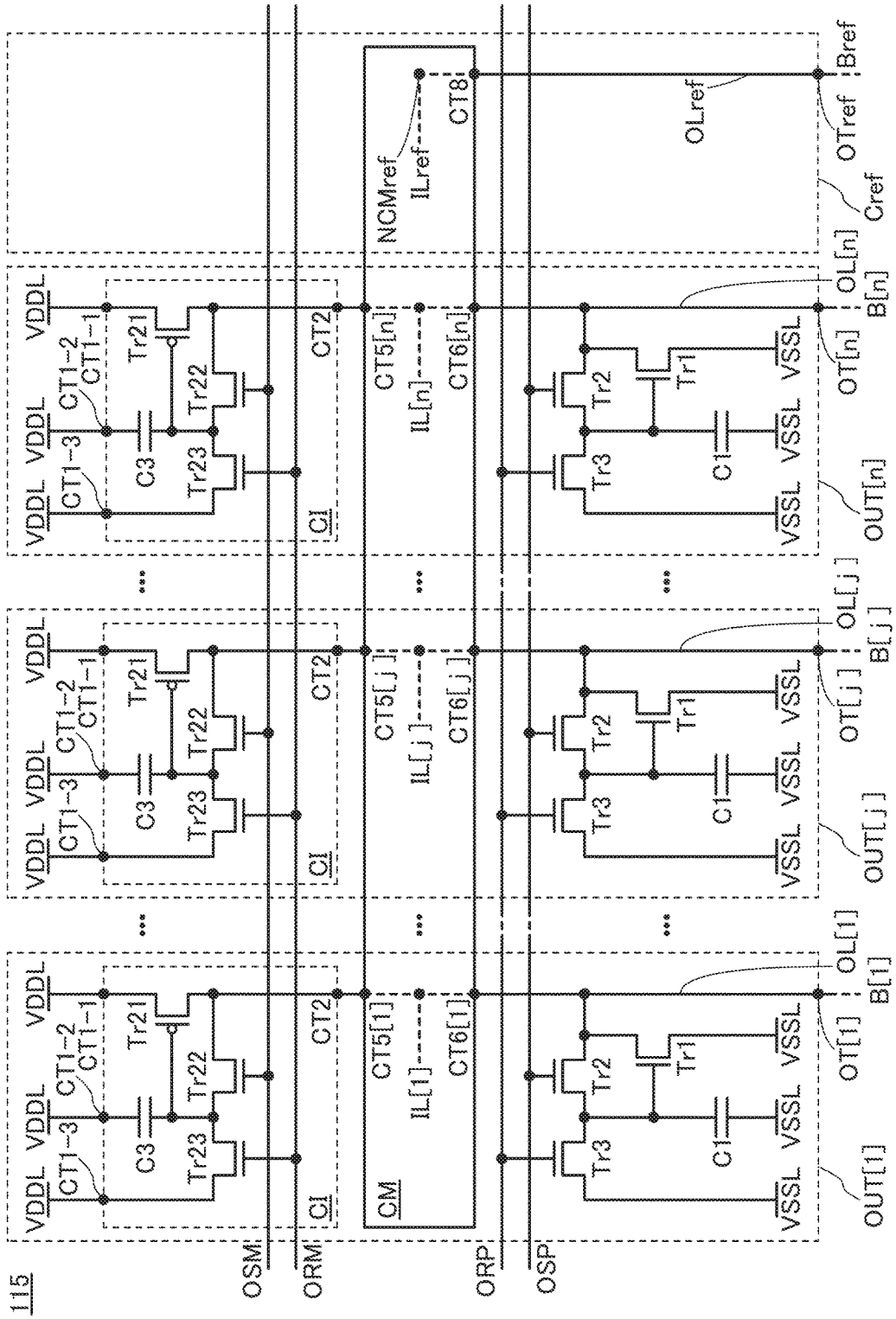
FIG. 10 is a circuit diagram showing an example of an offset circuit in the semiconductor device of FIG. 7.

The constant current circuit CI of the offset circuit 115 in FIG. 10 includes transistors Tr21 to Tr23 and a capacitor C3. The constant current circuits CI in the offset circuit 115 include terminals CT1-1, CT1-2, and CT1-3, instead of the terminals CT1 of the constant current circuits CI in the offset circuit 112. Furthermore, the offset circuit 115 is electrically connected to wirings OSM and ORM.

Note that the transistor Tr21 is a p-channel transistor, and the transistors Tr22 and Tr23 are n-channel transistors. In particular, the transistors Tr22 and Tr23 are preferably OS transistors. In addition, the channel formation region in each of the transistors Tr22 and Tr23 preferably includes an oxide containing at least one of indium, the element M, and zinc.

As described above, an OS transistor has a characteristic of extremely small off-state current. In particular, when an OS transistor is used as the transistor Tr22, the electric charge held in the capacitor C3 can be prevented from flowing between a source and a drain of the transistor Tr22 that is off. In particular, when an OS transistor is used as the transistor Tr23, the electric charge held in the capacitor C3 can be prevented from flowing between a source and a drain of the transistor Tr23 that is off. Accordingly, the potential of a gate of the transistor Tr21 can be held for a long time; thus, a stable constant current can flow between a source and a drain of the transistor Tr21. As a result, a product-sum operation circuit have high calculation accuracy can be obtained in some cases.

A first terminal of the transistor Tr21 is electrically connected to the terminal CT1-1, a second terminal of the transistor Tr21 is electrically connected to the terminal CT2, and a gate of the transistor Tr21 is electrically connected to a first terminal of the capacitor C3. A first terminal of the transistor Tr22 is electrically connected to the terminal CT2, a second terminal of the transistor Tr22 is electrically connected to the first terminal of the capacitor C3, and a gate of the transistor Tr22 is electrically connected to the wiring OSM. A first terminal of the transistor Tr23 is electrically connected to the first terminal of the capacitor C3, a second terminal of the transistor Tr23 is electrically connected to the terminal CT1-3, and a gate of the transistor Tr23 is electrically connected to the wiring ORM. A second terminal of the capacitor C3 is electrically connected to the terminal CT1-2.

The terminals CT1-1 to CT1-3 are each electrically connected to the wiring VDDL.

In the offset circuit 115 shown in FIG. 10, only the following components are shown:
the column output circuit OUT[1]; the column output circuit OUT[j]; the column output circuit OUT[n]; the reference column output circuit Cref; the constant current circuit CI; the current mirror circuit CM; the output terminal OT[1]; the output terminal OT[j]; the output terminal OT[n]; the output terminal OTref; the terminal CT1-1; the terminal CT1-2; the terminal CT1-3; the terminal CT2; the terminal CT5[1]; the terminal CT5[j]; the terminal CT5[n]; the terminal CT6[1]; the terminal CT6[j]; the terminal CT6[n]; the terminal CT8; the transistor Tr1; the transistor Tr2; the transistor Tr3; the transistor Tr21; the transistor Tr22; the transistor Tr23; the capacitor C1; the capacitor C3; the wiring OL[1]; the wiring OL[j]; the wiring OL[n]; the wiring OLref; the wiring ORP; the wiring OSP; the wiring OSM; the wiring ORM; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

The operation of the constant current circuit CI in the offset circuit 115 is described below.

When the high-level potential is supplied to the wiring ORM and the low-level potential is supplied to the wiring OSM, the transistor Tr23 is turned on and the transistor Tr22 is turned off. At this time, the first terminal of the capacitor C3 is supplied with the high-level potential from the wiring VDDL via the transistor Tr23. The second terminal of the capacitor C3 is supplied with the high-level potential from the wiring VDDL; thus, the holding potential of the capacitor C3 becomes 0. That is, by supplying the wiring ORM with the high-level potential and supplying the wiring OSM with the low-level potential, electric charge held in the capacitor C3 is discharged, so that the constant current circuit CI can be initialized.

When the low-level potential is supplied to the wiring ORM and the high-level potential is supplied to the wiring OSM, the transistor Tr23 is turned off and the transistor Tr22 is turned on. At this time, the second terminal of the transistor Tr21 is electrically connected to the gate of the transistor Tr21 via the transistor Tr22. That is, the transistor Tr21 has a diode-connected structure. The potential of the first terminal of the capacitor C3 becomes equal to that of the second terminal of the transistor Tr21 over time.

With this state, the low-level potential is supplied to the wiring OSM, and the transistor Tr22 is turned off, so that a potential equal to that of the second terminal of the transistor Tr21 is held in the capacitor C3. Accordingly, the potential is held in the gate of the transistor Tr21, and thus a constant current based on the potential flows through the transistor Tr21.

[Current Mirror Circuit CM]

Next, an internal structure example of the current mirror circuit CM is described.

Figure 11:
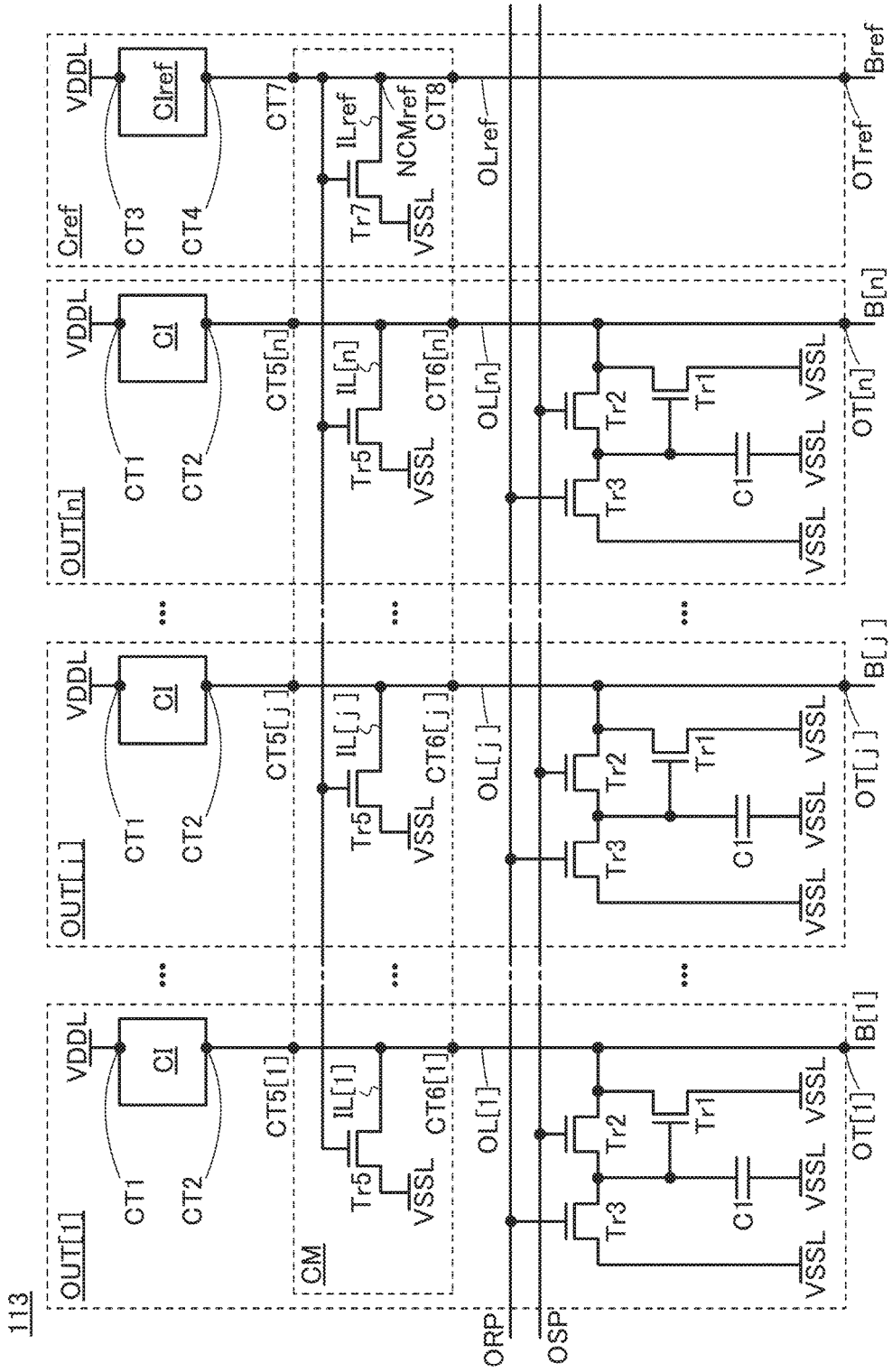
FIG. 11 is a circuit diagram showing an example of an offset circuit in the semiconductor device of FIG. 7.

An offset circuit 113 shown in FIG. 11 is a circuit diagram of an internal structure example of the current mirror circuit CM included in the offset circuit 111 shown in FIG. 8.

In the current mirror circuit CM, each of the column output circuits OUT[1] to OUT[n] includes a transistor Tr5, and the reference column output circuit Cref includes a transistor Tr7. Note that the transistors Tr5 and Tr7 are each an n-channel transistor.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VSSL. A gate of the transistor Tr5 in the column output circuit OUT[j] is electrically connected to the terminal CT7 and the terminal CT8 in the current mirror circuit CM.

A first terminal of the transistor Tr7 in the reference column output circuit Cref is electrically connected to the terminal CT7 and the terminal CT8 of the current mirror circuit CM. A second terminal of the transistor Tr7 in the reference column output circuit Cref is electrically connected to the wiring VSSL. A gate of the transistor Tr7 in the reference column output circuit Cref is electrically connected to the terminal CT7 and the terminal CT8 of the current mirror circuit CM.

In the above connection structure, a potential of the node NCMref can be applied to the gate of the transistor Tr5 in each of the column output circuits OUT[1] to OUT[n], and the amount of current flowing between a source and a drain of the transistor Tr7 can be equalized to the amount of current flowing between a source and a drain of the transistor Tr5 in each of the column output circuits OUT[1] to OUT[n]. Note that the transistors Tr5 and Tr7 of the current mirror circuit CM in the offset circuit 113 are n-channel transistors and are connected to the wiring VSSL to which the low-level potential is supplied, and thus the current mirror circuit CM function as a current sink.

Each of the transistor Tr5 and the transistor Tr7 is preferably an OS transistor. In addition, each channel formation region in the transistors Tr5 and Tr7 is preferably formed using an oxide containing at least one of indium, the element M, and zinc.

In the offset circuit 113 shown in FIG. 11, only the following components are shown:

the column output circuit OUT[1]; the column output circuit OUT[j]; the column output circuit OUT[n]; the reference column output circuit Cref; the constant current circuit CI; the constant current circuit CIref; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr5; the transistor Tr7; the capacitor C1; the wiring OL[1]; the wiring OL[j]; the wiring OL[n]; the wiring OLref; the wiring ORP; the wiring OSP; the wiring B[1]; the wiring B[j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

Note that the configuration of the current mirror circuit CM of the offset circuit of one embodiment of the present invention is not limited to that of the offset circuit 113 in FIG. 11. For example, depending on circumstances, conditions, or necessity, the component, such as a circuit, an element, or a wiring, of the offset circuit 113 can be removed; another component, such as a circuit, an element, or a wiring, can be added to the offset circuit 113; or the connection structure of the offset circuit 113 can be changed. For example, as illustrated in an offset circuit 116 of FIG. 12, the configuration of the current mirror circuit CM may be changed.

Figure 12:
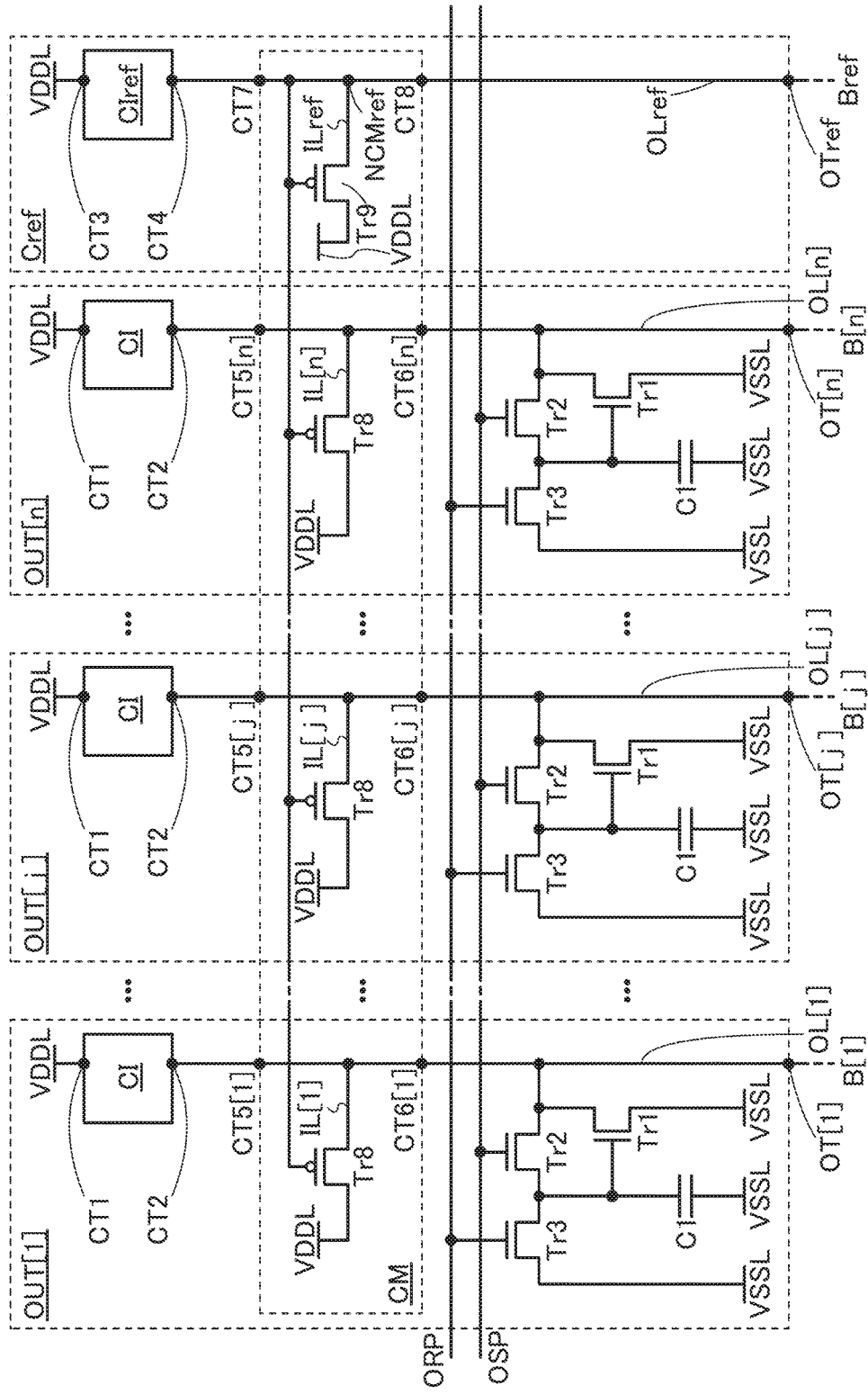
FIG. 12 is a circuit diagram showing an example of an offset circuit in the semiconductor device of FIG. 7.

In the current mirror circuit CM of the offset circuit 116 illustrated in FIG. 12, each of the column output circuits OUT[1] to OUT[n] includes a transistor Tr8, and the reference column output circuit Cref includes a transistor Tr9. Note that the transistors Tr8 and Tr9 are each an p-channel transistor.

A first terminal of the transistor Tr8 in the column output circuit OUT[j] is electrically connected to the terminal CT5[j] and the terminal CT6[j] of the current mirror circuit CM. A second terminal of the transistor Tr8 in the column output circuit OUT[j] is electrically connected to the wiring VDDL. A gate of the transistor Tr8 in the column output circuit OUT[j] is electrically connected to the terminal CT7 and the terminal CT8 in the current mirror circuit CM.

A first terminal of the transistor Tr9 in the reference column output circuit Cref is electrically connected to the terminal CT7 and the terminal CT8 of the current mirror circuit CM.

A second terminal of the transistor Tr9 in the reference column output circuit Cref is electrically connected to the wiring VDDL. A gate of the transistor Tr9 in the reference column output circuit Cref is electrically connected to the terminal CT7 and the terminal CT8 of the current mirror circuit CM.

In the above connection structure, a potential of the node NCMref can be applied to the gate of the transistor Tr8 in each of the column output circuits OUT[1] to OUT[n], and the amount of current flowing between a source and a drain of the transistor Tr9 can be equalized to the amount of current flowing between a source and a drain of the transistor Tr8 in each of the column output circuits OUT[1] to OUT[n]. Note that the transistors Tr8 and Tr9 of the current mirror circuit CM in the offset circuit 113 are p-channel transistors and are connected to the wiring VDDL to which the high-level potential is supplied, and thus the current mirror circuit CM function as a current source.

In the offset circuit 116 shown in FIG. 12, only the following components are shown: the column output circuit OUT[1]; the column output circuit OUT[j]; the column output circuit OUT[n]; the reference column output circuit Cref; the constant current circuit CI; the constant current circuit CIref; the current mirror circuit CM; the output terminal OT[1]; the output terminal OT[j]; the output terminal OT[n]; the output terminal OTref; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr8; the transistor Tr9; the capacitor C1; the wiring OL[1]; the wiring OL[j]; the wiring OL[n]; the wiring OLref; the wiring ORP; the wiring OSP; the wiring B[1]; the wiring B [j]; the wiring B[n]; the wiring Bref; the wiring IL[1]; the wiring IL[j]; the wiring IL[n]; the wiring ILref; the node NCMref; the wiring VDDL; and the wiring VSSL. Other circuits, wirings, elements, and reference numerals thereof are not shown.

<<Memory Cell Array 120>>

Figure 13:
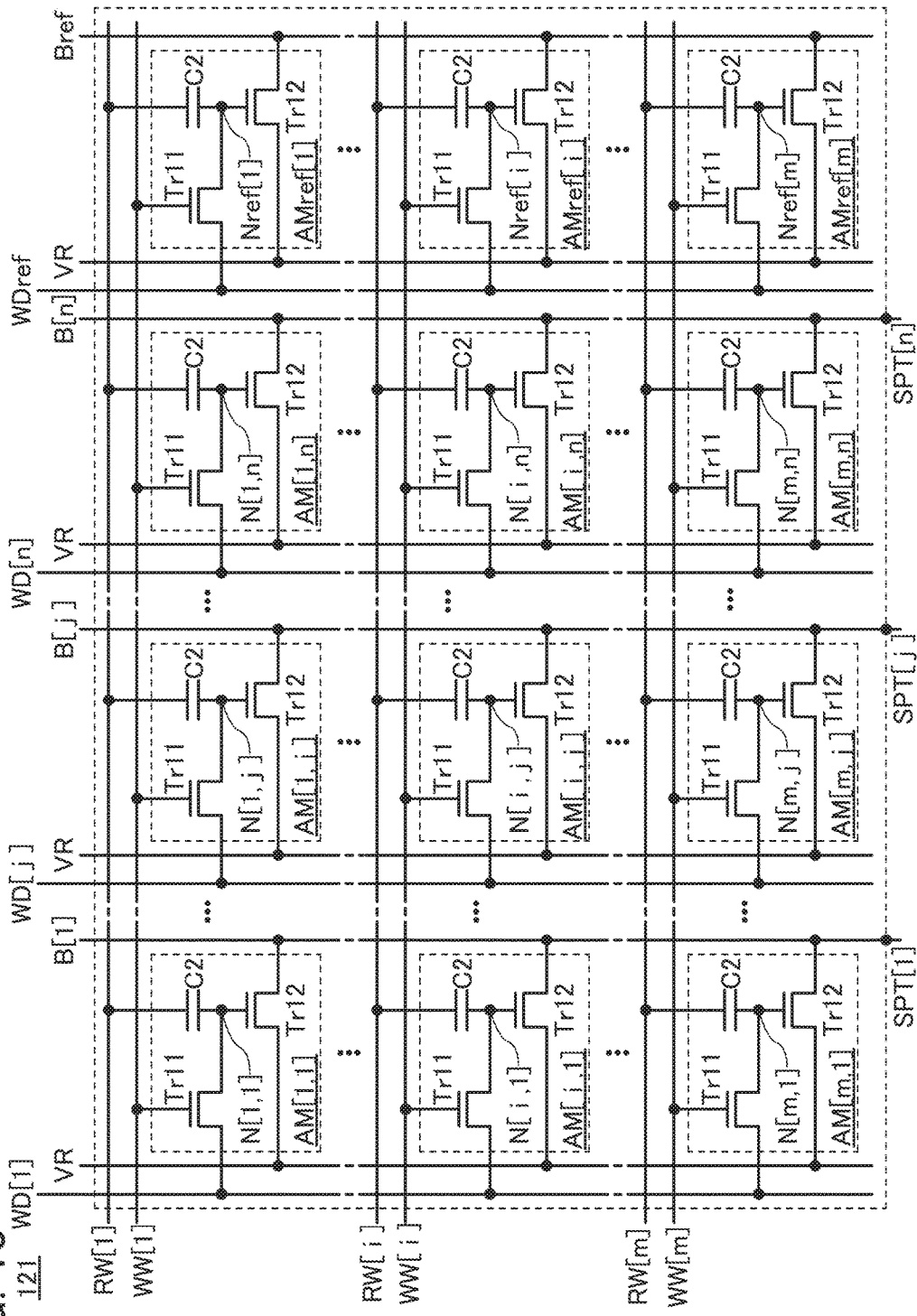
FIG. 13 is a circuit diagram showing an example of a memory cell array in the semiconductor device of FIG. 7.

Next, a circuit configuration example that can be employed in the memory cell array 120 is described. FIG. 13 shows a memory cell array 121 as an example of the memory cell array 120.

The memory cell array 121 includes the memory cells AM and the memory cells AMref. Each of the memory cells AM included in the memory cell array 121 includes a transistor Tr11, a transistor Tr12, and a capacitor C2. The memory cells AMref[1] to AMref[m] each include the transistor Tr11, the transistor Tr12, and the capacitor C2.

For the connection structure in the memory cell array 121, the description is made with a focus on the memory cell AM[i,j]. A first terminal of the transistor Tr11 is electrically connected to a gate of the transistor Tr12 and a first terminal of the capacitor C2. A second terminal of the transistor Tr11 is electrically connected to the wiring WD[j]. A gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i,j], a connection portion of the first terminal of the transistor Tr11, the gate of the transistor Tr12, and the first terminal of the capacitor C2 is a node N[i,j] In one embodiment of the present invention, a potential corresponding to the first analog data is held at the node N[i,j].

Next, the description is made with a focus on the memory cell AMref[i]. The first terminal of the transistor Tr11 is electrically connected to the gate of the transistor Tr12 and the first terminal of the capacitor C2. A second terminal of the transistor Tr11 is electrically connected to the wiring WDref. A gate of the transistor Tr11 is electrically connected to the wiring WW[i]. A first terminal of the transistor Tr12 is electrically connected to the wiring Bref. A second terminal of the transistor Tr12 is electrically connected to the wiring VR. A second terminal of the capacitor C2 is electrically connected to the wiring RW[i].

In the memory cell AMref[i], a connection portion of the first terminal of the transistor Tr11, the gate of the transistor Tr12, and the first terminal of the capacitor C2 is a node Nref[i].

Note that each of the transistor Tr11 and the transistor Tr12 is preferably an OS transistor. In addition, each channel formation region in the transistors Tr11 and Tr12 is preferably formed using an oxide containing at least one of indium, the element M, and zinc.

With use of the OS transistors as the transistors Tr11 and Tr12, the leakage current of each of the transistors Tr11 and Tr12 can be suppressed, which enables a product-sum operation circuit with high calculation accuracy to be fabricated in some cases. Furthermore, with use of the OS transistor as the transistor Tr11, the amount of leakage current from a holding node to a writing word line can be extremely small when the transistor Tr11 is in an off state. In other words, frequencies of refresh operation at the holding node can be reduced; thus, power consumption of a semiconductor device can be reduced.

Furthermore, when all of the above-described transistors Tr1 to Tr7, Tr11, Tr12, Tr22, and Tr23 are OS transistors, a manufacturing process of the semiconductor device can be shortened. Thus, a time needed for manufacturing semiconductor devices can be shortened, and the number of devices manufactured in a certain time period can be increased.

Note that the transistors Tr1, Tr4 to Tr9, Tr12, and Tr21 operate in a saturation region unless otherwise specified. In other words, the gate voltage, source voltage, and drain voltage of each of the transistors Tr1, Tr4 to Tr9, Tr12, and Tr21 are appropriately biased so that the transistors operate in the saturation region. Note that even when the operations of the transistors Tr1, Tr4 to Tr9, Tr12, and Tr21 are deviated from ideal operation in a saturation region, the gate voltage, source voltage, and drain voltage of each of the transistors are regarded as being appropriately biased as long as the accuracy of output data is within a desired range.

In the memory cell array 121 shown in FIG. 13, only the following components are shown: the memory cell AM[1,1]; the memory cell AM[i,1]; the memory cell AM[m,1]; the memory cell AM[1,j]; the memory cell AM[i,j]; the memory cell AM[m,j]; the memory cell AM[1,n]; the memory cell AM[i,n]; the memory cell AM[m,n]; the memory cell AMref[1]; the memory cell AMref[i]; the memory cell AMref[m]; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring WDref; the wiring B[1]; the wiring B[j]; the wiring B[n]; the wiring Bref; the wiring VR; the output terminal SPT[1]; the output terminal SPT[j]; the output terminal SPT[n]; a node N[1,1]; a node N[i,1]; a node N[m,1]; a node N[i,j]; the node N[i,j]; a node N[m,j]; a node N[1,n]; a node N[1,n]; a node N[m,n]; a node Nref[1]; the node Nref[i]; a node Nref[m]; the transistor Tr11; the transistor Tr12; and the capacitor C2. Other circuits, wirings, elements, and reference numerals thereof are not shown.

Depending on circumstances or conditions or as needed, the semiconductor device of one embodiment of the present invention may have a combined structure of the above structure examples.

<Operation Example>

An example of operation of the semiconductor device 100 of one embodiment of the present invention is described. Note that the semiconductor device 100 described in this operation example includes an offset circuit 151 shown in FIG. 14 as the offset circuit 110 and a memory cell array 160 shown in FIG. 15 as the memory cell array 120 of the semiconductor device 100.

Figure 14:
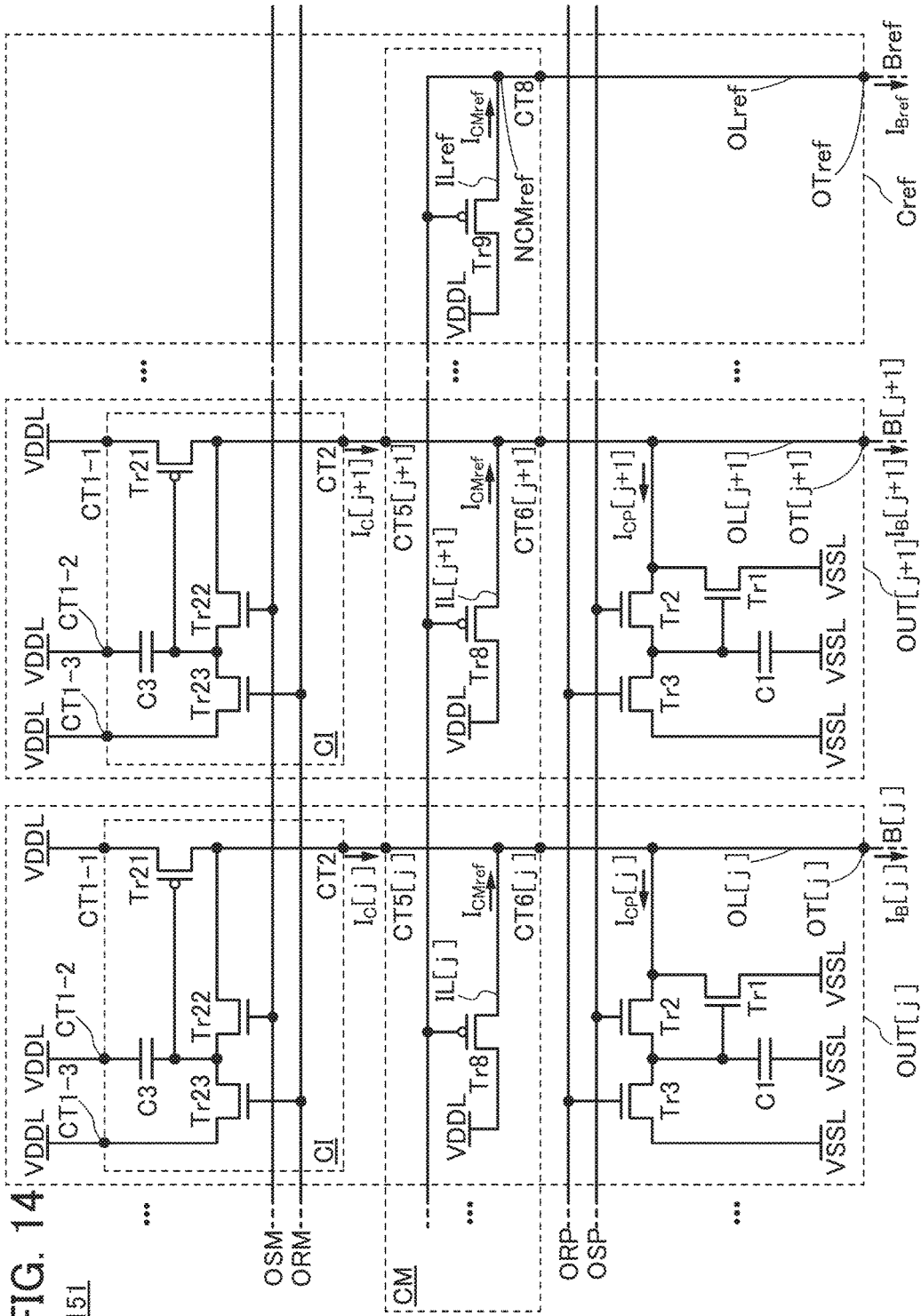
FIG. 14 is a circuit diagram showing an example of an offset circuit in the semiconductor device of FIG. 7.

The offset circuit 151 shown in FIG. 14 has a circuit configuration where the constant current circuit CI of the offset circuit 115 in FIG. 10 and the current mirror circuit CM of the offset circuit 116 in FIG. 12 are used. For the description of this operation example, FIG. 14 shows the column output circuit OUT[j], a column output circuit OUT[j+1], and the reference column output circuit Cref.

Note that in FIG. 14, current flowing from the terminal CT2 of the constant current circuit CI to the terminal CT5[j] of the current mirror circuit CM in the column output circuit OUT[j] is denoted by $I_C[j]$, and current flowing from the terminal CT2 of the constant current circuit CI to the terminal CT5[j+1] of the current mirror circuit CM in the column output circuit OUT[j+1] is denoted by $I_C[j+1]$. Furthermore, in the current mirror circuit CM, current flowing from the first terminal of the transistor Tr8 to the wiring IL[j] in the column output circuit OUT[j], current flowing from the first terminal of the transistor Tr8 to the wiring IL[j+1] in the column output circuit OUT[j+1], and current flowing from the first terminal of the transistor Tr9 to the wiring ILref in the reference column output circuit Cref are denoted by $I_{CMref}$. That is, current that is the sum of $I_C[j]$ and $I_{CMref}$ is output to the terminal CT6[j], and current that is the sum of $I_C[j+1]$ and $I_{CMref}$ is output to the terminal CT6[j+1]. Current flowing from the wiring OL[j] to the first terminal of the transistor Tr1 or the first terminal of the transistor Tr2 in the column output circuit OUT[j] is denoted by $I_{CP}[j]$, and current flowing from a wiring OL[j+1] to the first terminal of the transistor Tr1 or the first terminal of the transistor Tr2 in the column output circuit OUT[j+1] is denoted by $I_{CP}[j+1]$. Current output from the output terminal OT[j] to the wiring B[j] in the column output circuit OUT[j] is denoted by $I_B[j]$, current output from an output terminal OT[j+1] to the wiring B[j+1] in the column output circuit OUT[j+1] is denoted by $I_B[j+1]$, and current output from the output terminal OTref to the wiring Bref in the reference column output circuit Cref is denoted by $I_{Bref}$.

Figure 15:
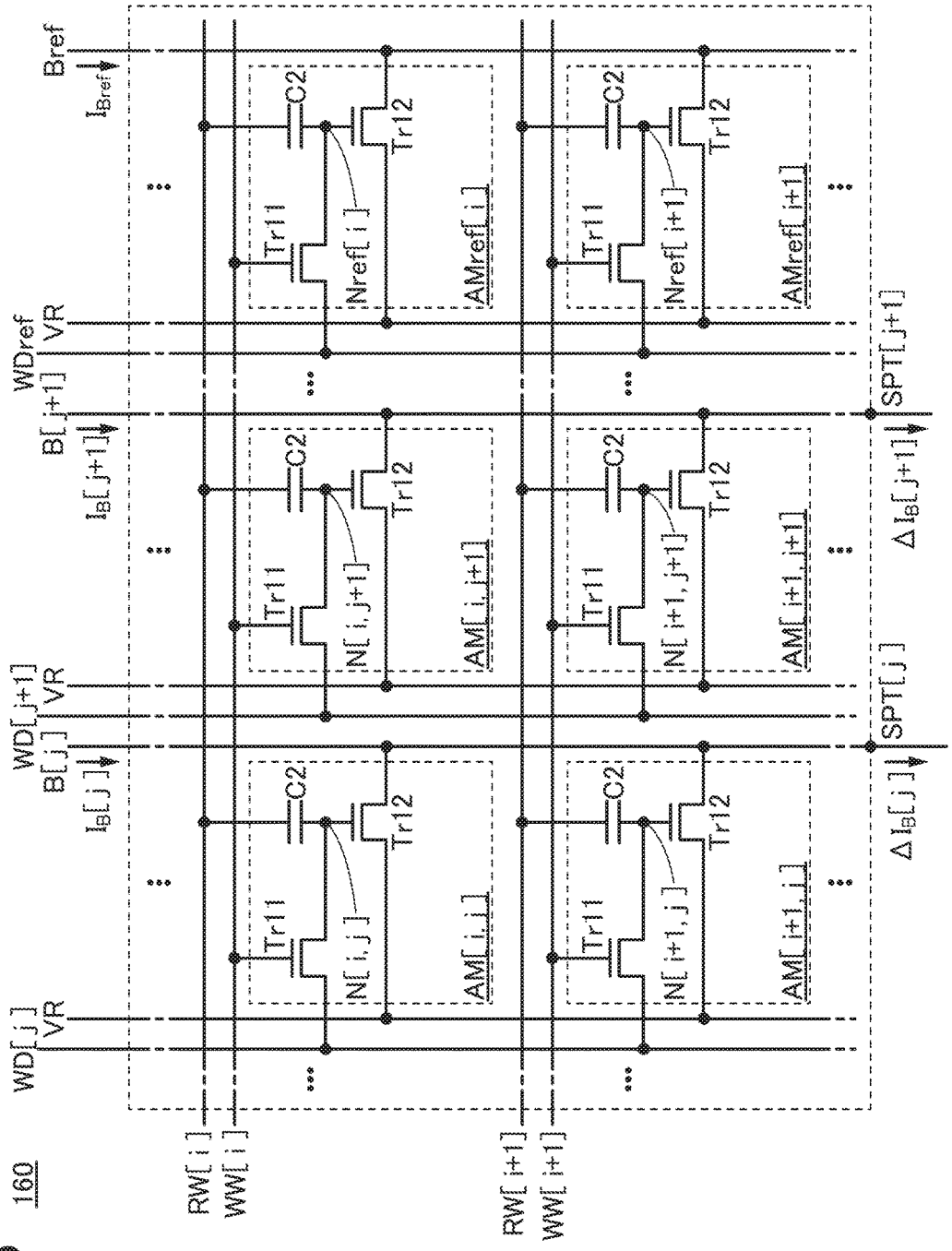
FIG. 15 is a circuit diagram showing an example of a memory cell array in the semiconductor device of FIG. 7.

The memory cell array 160 shown in FIG. 15 has a structure similar to that of the memory cell array 121 shown in FIG. 13. For the description of this operation example, FIG. 15 shows the memory cell AM[i,j], a memory cell AM[i+1,j], a memory cell AM[i,j+1], a memory cell AM[i+1,j+1], the memory cell AMref[i], and a memory cell AMref[i+1].

In FIG. 15, $I_B[j]$ denotes a current that is input from the wiring B[j], $I_B[j+1]$ denotes a current that is input from the wiring B[j+1], and $I_{Bref}$ denotes a current that is input from the wiring Bref. In addition, $\Delta I_B[1]$ denotes a current that is output from the output terminal SPT[j] that is electrically connected to the wiring B[j], and $\Delta I_B[j+1]$ denotes a current that is output from an output terminal SPT[j+1] that is electrically connected to the wiring B[j+1].

Figure 16:
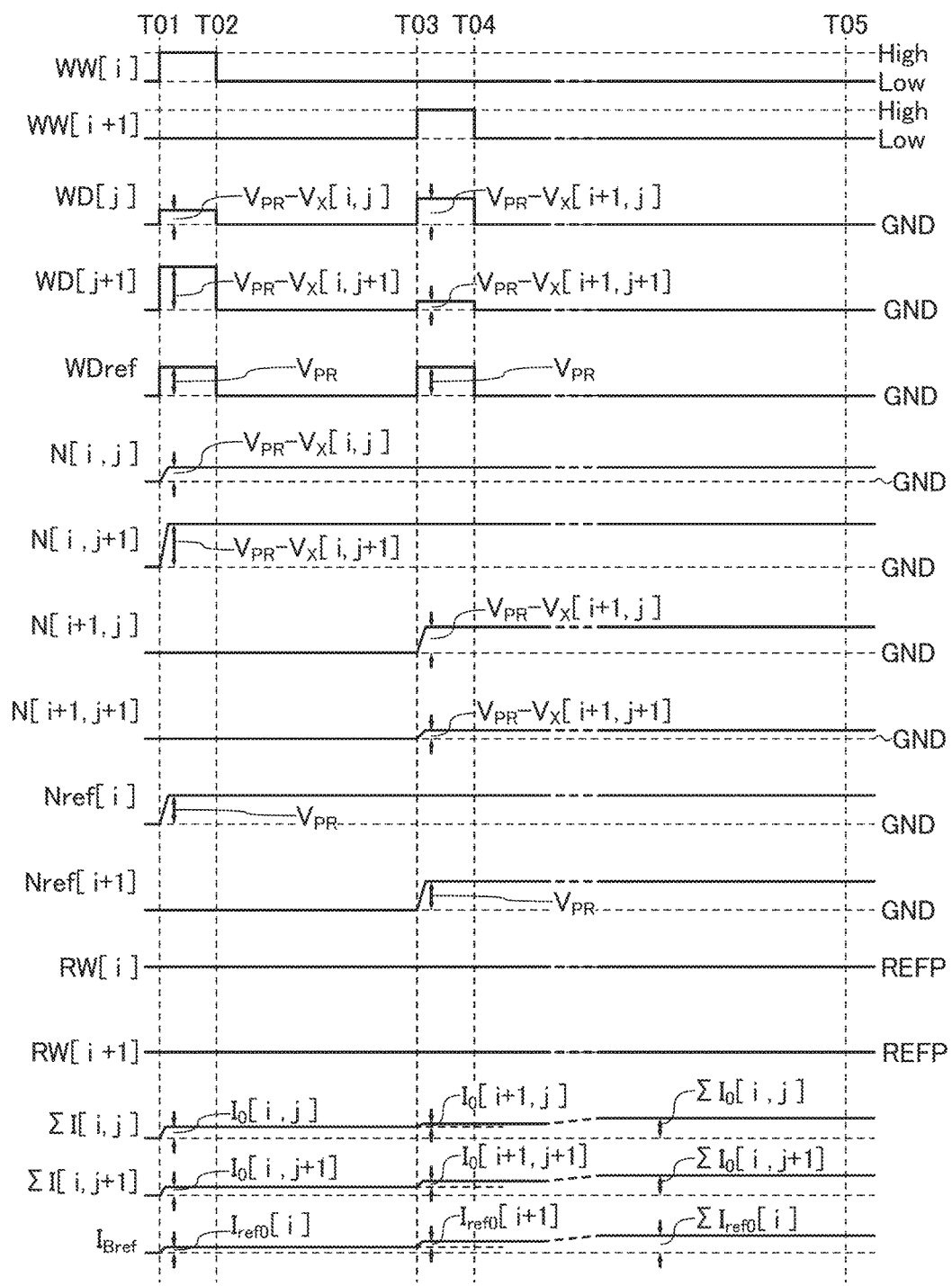
FIG. 16 is a timing chart showing an operation example of a semiconductor device.
Figure 17:
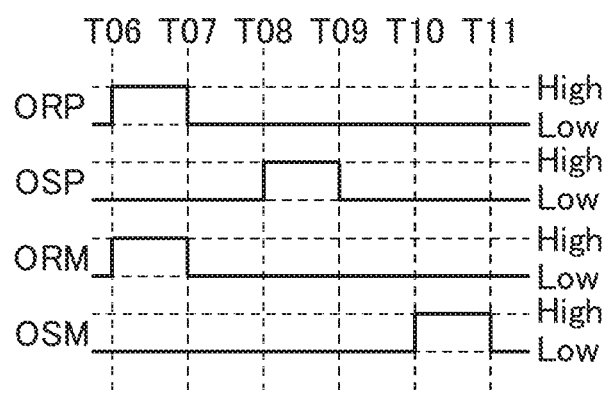
Figure 18:
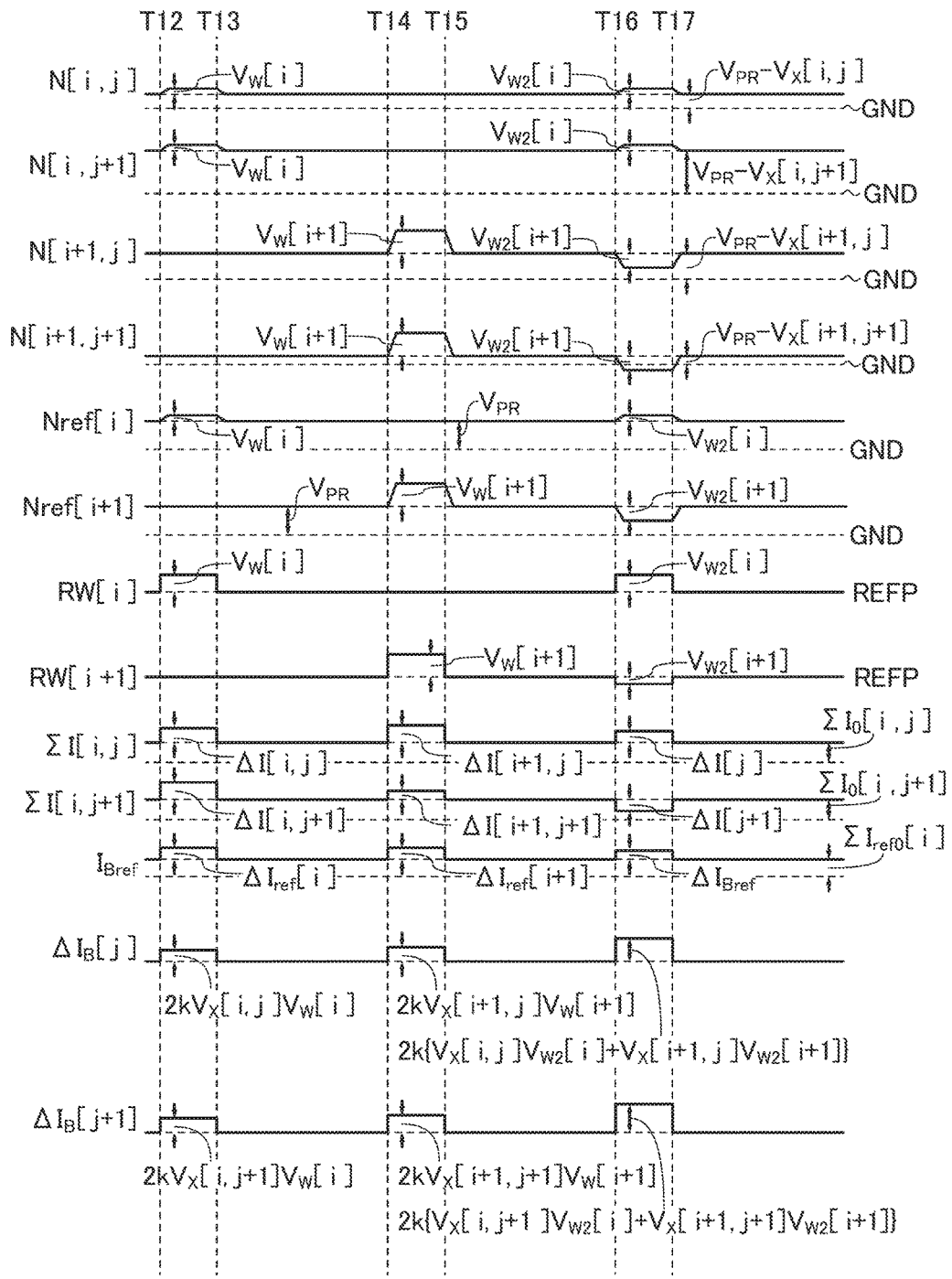
FIG. 18 is a timing chart showing an operation example of a semiconductor device.

FIG. 16 to FIG. 18 are timing charts showing the operation example of the semiconductor device 100. The timing chart in FIG. 16 shows changes in potentials during a period from Time T01 to Time T05 of the wiring WW[i], a wiring WW[i+1], the wiring WD[j], a wiring WD[j+1], the wiring WDref, the node N[i,j], a node N[i,j+1], a node N[i+1,j], a node N[i+1,j+1], the node Nref[i], a node Nref[i+1], the wiring RW[i], and a wiring RW[i+1]. This timing chart also shows the amount of changes in a current $\Sigma I[i,j]$, a current $\Sigma I[i,j+1]$, and a current $I_{Bref}$. Note that the current $\Sigma I[i,j]$ is the summation of current I[i,j] over i from 1 to m. Here, the current I[i,j] is current flowing in the transistor Tr12 in the memory cell AM[i,j]. The current $\Sigma I[i,j+1]$ is the summation of current I[i,j+1] over i from 1 to m. Here, the current I[i,j+1] is current flowing in the transistor Tr12 in the memory cell AM[i,j+1]. In the timing chart of FIG. 16, the potentials of the wirings ORP, OSP, ORM, and OSM are constantly low-level potentials (not shown).

A timing chart in FIG. 17 shows the operation during the period after Time T05, which is shown in the timing chart in FIG. 16, to Time T11. The timing chart in FIG. 17 shows the changes in potentials during a period from Time T06 to Time T11 of the wirings ORP, OSP, ORM, and OSM. Note that in Time T06 to Time T11, the potentials of the wiring WW[i], the wiring WW[i+1], the wiring WD[j], the wiring WD[j+1], the wiring WDref, the node NM, the node N[i,j+1], the node N[i+1,j], the node N[i+1,j+1], the node Nref[i], the node Nref[i+1], the wiring RW[i], and the wiring RW[i+1] and the amounts of the current ΣI[i,j], the current ΣI[i,j+1], and the current $I_{Bref}$ are not changed; thus, the changes in the potentials of the wirings and the nodes and in the currents are not shown in FIG. 17.

A timing chart in FIG. 18 shows the operation during the period after Time T11, which is shown in the timing chart in FIG. 17, to Time T17. The timing chart in FIG. 18 shows the changes in potentials during a period from Time T12 to Time T17 of the node N[i,j], the node N[i,j+1], the node N[i+1,j], the node N[i+1j+1], the node Nref[i], the node Nref[i+1], the wiring RW[i], and the wiring RW[i+1] and the amounts of the current ΣI[i,j], the current ΣI[i,j+1], and the current $I_{Bref}$. Note that each of the potentials of the wirings WW[i], WW[i+1], ORP, OSP, ORM, and OSM remains at the low-level potential, and each of the potentials of the wirings WD[j], WD[j+1], and WDref remains at a ground potential; thus, the potential changes in the wirings WW[i], WW[i+1], WD[j], WD[j+1], WDref, ORP, OSP, ORM, and OSM are not shown in the timing chart in FIG. 18. The timing chart in FIG. 18 also shows the changes in the current $\Delta I_B[j]$ and the current $\Delta I_B[j+1]$, which are described later.

<<Period from Time T01 to Time T02>>

During a period from Time T01 to Time T02, the high-level potential (denoted by High in FIG. 16) is applied to the wiring WW[i], and the low-level potential (denoted by Low in FIG. 16) is applied to the wiring WW[i+1]. Furthermore, a potential higher than the ground potential (denoted by GND in FIG. 16) by $V_{PR}-V_X[i,j]$ is applied to the wiring WD[j], the potential higher than the ground potential by $V_{PR}-V_X[i,j+1]$ is applied to the wiring WD[j+1], and a potential higher than the ground potential by $V_{PR}$ is applied to the wiring WDref. Moreover, a reference potential (denoted by REFP in FIG. 16) is applied to the wiring RW[i] and the wiring RW[i+1].

The potential $V_X[i,j]$ and the potential $V_X[i,j+1]$ each correspond to the first analog data. The potential $V_{PR}$ corresponds to the reference analog data.

In this period, the high-level potential is supplied to the gates of the transistors Tr11 in the memory cell AM[i,j], the memory cell AM[i,j+1], and the memory cell AMref[i]; accordingly, the transistors Tr11 in the memory cell AM[i,j], the memory cell AM[i,j+1], and the memory cell AMref[i] are turned on. Thus, in the memory cell AM[i,j], the wiring WD[j] and the node N[i,j] are electrically connected to each other, and the potential of the node N[i,j] is $V_{PR}-V_X[i,j]$. Similarly, in the memory cell AM[i,j+1], the wiring WD[j+1] and the node N[i,j+1] are electrically connected to each other, and the potential of the node N[i,j+1] is $V_{PR}-V_X[i,j+1]$. In the memory cell AMref[i], the wiring WDref and the node Nref[i] are electrically connected to each other, and the potential of the node Nref[i] is $V_{PR}$.

A current flowing from the first to second terminal of the transistor Tr12 in each of the memory cell AM[i,j], the memory cell AM[i,j+1], and the memory cell AMref[i] is considered. The current $I_0[i,j]$ flowing from the wiring B[j] to the second terminal through the first terminal of the transistor Tr12 in the memory cell AM[i,j] can be expressed by the following formula.

[Formula 3]

$$I_0[i,j]=k(V_{PR}-V_X[i,j]-V_{th})^2 \quad (E1)$$

In the formula, k is a constant determined by the channel length, the channel width, the mobility, the capacitance of a gate insulating film, and the like of the transistor Tr12. Furthermore, $V_{th}$ is a threshold voltage of the transistor Tr12.

At this time, the current flowing from the output terminal OT[j] of the column output circuit OUT[j] to the wiring B[j] is $I_0[i,j]$.

Similarly, the current $I_0[i,j+1]$ flowing from the wiring B[j+1] to the second terminal through the first terminal of the transistor Tr12 in the memory cell AM[i,j+1] can be expressed by the following formula.

$$I_0[i,j+1]=k(V_{PR}-V_X[i,j+1]-V_{th})^2 \quad [\text{Formula 4}]$$

At this time, the current flowing from the output terminal OT[j+1] of the column output circuit OUT[j+1] to the wiring B[j+1] is $I_0[i,j+1]$.

The current $I_{ref0}[i]$ flowing from the wiring Bref to the second terminal through the first terminal of the transistor Tr12 in the memory cell AMref[i] can be expressed by the following formula.

[Formula 5]

$$I_{ref0}[i]=k(V_{PR}-V_{th})^2 \quad (E2)$$

At this time, the current flowing from the output terminal OTref of the reference column output circuit Cref to the wiring Bref is $I_{ref0}[i]$.

Note that since the low-level potential is supplied to the gates of the transistors Tr11 in the memory cell AM[i+1,j], the memory cell AM[i+1,j+1], and the memory cell AMref[i+1], the transistors Tr11 in the memory cell AM[i+1,j], the memory cell AM[i+1,j+1], the memory cell AMref[i+1] are turned off. Thus, the potentials are not held at the node N[i+1,j], the node N[i+1, j+1], and the node Nref[i+1].

<<Period from Time T02 to Time T03>>

During a period from Time T02 to Time T03, the low-level potential is supplied to the wiring WW[i]. At this time, the low-level potential is supplied to the gates of the transistors Tr11 in the memory cell AM[i,j], the memory cell AM[i,j+1], and the memory cell AMref[i], and accordingly, the transistors Tr11 in the memory cells AM[i,j], AM[i,j+1], and AMref[i] are turned off.

The low-level potential has been applied to the wiring WW[i+1] continuously since before Time T02. Thus, the transistors Tr11 in the memory cell AM[i+1,j], the memory cell AM[i+1,j+1], and the memory cell AMref[i+1] have been kept in an off state since before Time T02.

Since the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] are each in an off state as described above, the potentials at the node N[i,j], the node N[i,j+1], the node N[i+1,j], the node N[i+1, j+1], the node Nref[i], and the node Nref[i+1] are held in a period from Time T02 to Time T03.

In particular, when an OS transistor is used as each of the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] as described in the circuit configuration of the semiconductor device 100, the amount of leakage current flowing between the sources and the drains of the transistors Tr11 can be made small, which makes it possible to hold the potentials at the nodes for a long time.

During the period from Time T02 to Time T03, the ground potential is supplied to the wiring WD[j], the wiring WD[j+1], and the wiring WDref. Since the transistors Tr11 in the memory cell AM[i,j], the memory cell AM[i,j+1], the memory cell AM[i+1,j], the memory cell AM[i+1,j+1], the memory cell AMref[i], and the memory cell AMref[i+1] are each in an off state, the potentials held at the nodes in the memory cell AM[i,j], the memory cell AM[i,j+1], the memory cell AM[i+1,j], the memory cell AM[i+1,j+1], the memory cell AMref[i], and the memory cell AMref[i+1] are not rewritten by application of potentials from the wiring WD[j], the wiring WD[j+1], and the wiring WDref.

<<Period from Time T03 to Time T04>>

During a period from Time T03 to Time T04, the low-level potential is supplied to the wiring WW[i], and the high-level potential is supplied to the wiring WW[i+1]. Furthermore, the potential higher than the ground potential by $V_{PR}-V_x[i+1,j]$ is applied to the wiring WD[j], the potential higher than the ground potential by $V_{PR}-V_x[i+1,j+1]$ is applied to the wiring WD[j+1], and the potential higher than the ground potential by $V_{PR}$ is applied to the wiring WDref. Moreover, the reference potential is continuously being applied to the wiring RW[i] and the wiring RW[i+1] continuously since Time T02.

Note that the potential $V_x[i+1,j]$ and the potential $V_x[i+1,j+1]$ are each a potential corresponding to the first analog data.

In this period, the high-level potential is supplied to the gates of the transistors Tr11 in the memory cell AM[i+1,j], the memory cell AM[i+1,j+1], and the memory cell AMref[i+1], and accordingly, the transistors Tr11 in the memory cell AM[i+1,j], the memory cell AM[i+1,j+1], and the memory cell AMref[i+1] are each turned on. Thus, in the memory cell AM[i+1,j], the node N[i+1,j] and the wiring WD[j] are electrically connected to each other, and the potential of the node N[i+1,j] becomes $V_{PR}-V_x[i+1,j]$. Similarly, in the memory cell AM[i+1,j+1], the wiring WD[j+1] and the node N[i+1,j+1] are electrically connected to each other, and the potential of the node N[i+1,j+1] becomes $V_{PR}-V_x[i+1,j+1]$. In the memory cell AMref[i+1], the wiring WDref and the node Nref[i+1] are electrically connected to each other, and the potential of the node Nref[i+1] becomes $V_{PR}$.

The current flowing from the first to second terminal of the transistor Tr12 in each of the memory cell AM[i+1,j], the memory cell AM[i+1,j+1], and the memory cell AMref[i+1] is considered. The current $I_0[i+1,j]$ flowing from the wiring B[j] to the second terminal through the first terminal of the transistor Tr12 in the memory cell AM[i+1,j] can be expressed by the following formula.

$$I_0[i+1,j]=k(V_{PR}-V_X[i+1,j]-V_{th})^2 \qquad \text{[Formula 6]}$$

At this time, the current flowing from the output terminal OT[j] of the column output circuit OUT[j] to the wiring B[j] is $I_0[i,j]+I_0[i+1,j]$.

Similarly, the current $I_0[i+1,j+1]$ flowing from the wiring B[j+1] to the second terminal through the first terminal of the transistor Tr12 in the memory cell AM[i+1,j+1] can be expressed by the following formula.

$$I_0[i+1,j+1]=k(V_{PR}-V_X[i+1,j+1]-V_{th})^2 \qquad \text{[Formula 7]}$$

At this time, the current flowing from the output terminal OT[j+1] of the column output circuit OUT[j+1] to the wiring B[j+1] is $I_0[i,j+1]+I_0[i+1,j+1]$.

The current $I_{ref0}[i+1]$ flowing from the wiring Bref to the second terminal through the first terminal of the transistor Tr12 in the memory cell AMref[i+1] can be expressed by the following formula.

$$I_{ref\,0}[i+1]32\ k(V_{PR}-V_{th})^2 \qquad \text{[Formula 8]}$$

At this time, the current flowing from the output terminal OTref of the reference column output circuit Cref to the wiring Bref is $I_{ref0}[i]+I_{REF0}[i+1]$.

<<Period from Time T04 to Time T05>>

During a period from Time T04 to Time T05, the potential corresponding to the first analog data is written to the rest of the memory cells AM, and the potential $V_{PR}$ is written to the rest of memory cells AMref, in a manner similar to that of the operation during the period from Time T01 to Time T02 or that of the operation during the period from Time T03 to Time T04. Thus, the total amount of currents flowing in the transistors Tr12 in all of the memory cells AM corresponds to the amount of current flowing from the output terminal OT[j] of the column output circuit OUT[j] to the wiring B[j] that is denoted by $\Sigma I_0[i,i]$ ($\Sigma I_0[i,j]$ represents the summation of the current $I_0$ [i,j] over i from 1 to m).

Here, the reference column output circuit Cref is focused on. The wiring OLref of the reference column output circuit Cref is electrically connected to the wiring Bref via the output terminal OTref; thus, current flowing through the wiring Bref is current flowing through the wiring OLref. The total amount of current flowing through the transistors Tr12 in the memory cells AMref[1] to AMref[m] flows into the wiring Bref. That is, the current $\Sigma I_{ref0}[i]$ flows into the wiring Bref (here, $\Sigma I_{ref0}[i]$ is the summation of $I_{ref0}[i]$ over i from 1 to m); thus, the current also flows through the wiring OLref. In the current mirror circuit CM, the current is output in the direction from the first terminal of the transistor Tr9 to the node NCMref in accordance with the potential of the node NCMref.

Although the current flowing through the wiring ILref is denoted by $I_{CMref}$ in FIG. 14, the current flowing through the wiring ILref before Time T09 is denoted by $I_{CMref}$ in this specification.

Thus, the current $I_{CMref0}$ flowing through the wiring ILref can be expressed by the following formula.

[Formula 9]

$$I_{CMref0} = I_{Bref} = \sum_i I_{ref0}[i] \qquad (E3)$$

Note that since the potential of the gate of the transistor Tr9 (potential of the node NCMref) is used as a reference in the current mirror circuit CM, the current $I_{CMref0}$ also flows in the wirings IL[1] to IL[N] of the column output circuits OUT[1] to OUT[N].

<<Period from Time T06 to Time T07>>

A period from Time T06 to Time T11 are described with reference to FIG. 17. During the period from Time T06 to Time T07, the wiring ORP is set at the high-level potential, and the wiring ORM is set at the high-level potential. At this time, the high-level potential is supplied to the gates of the transistors Tr3 in the column output circuits OUT[1] to OUT[n], so that the transistors Tr3 are turned on. Thus, the low-level potential is supplied to the first terminals of the capacitors C1 in the column output circuits OUT[1] to OUT[n], and thus the potentials of the capacitors C1 are initialized. Moreover, the high-level potential is supplied to the gates of the transistors Tr23 in the column output circuits OUT[1] to OUT[n], so that the transistors Tr23 are turned on. Thus, the low-level potential is supplied to the first terminals of the capacitors C3 in the column output circuits OUT[1] to OUT[n], and thus the potentials of the capacitors C3 are initialized. When Time T06 starts, the low-level potential is supplied to the wiring OSP, so that the transistors Tr2 in the column output circuits OUT[1] to OUT[n] are turned off, and the low-level potential is supplied to the wiring OSM, so that the transistors Tr22 in the column output circuits OUT[1] to OUT[n] are turned off.

<<Period from Time T07 to Time T08>>

During a period from Time T07 to Time T08, the wirings ORP and ORM are each set to the low-level potential. At this time, the low-level potential is supplied to the gates of the transistors Tr3 in the column output circuits OUT[1] to OUT[n], so that the transistors Tr3 are turned off. Furthermore, the low-level potential is supplied to the gates of the transistors Tr23 in the column output circuits OUT[1] to OUT[n], so that the transistors Tr23 are turned off.

<<Period from Time T08 to Time T09>>

During a period from Time T08 to Time T09, the wiring OSP is set at the high-level potential. At this time, the high-level potential is supplied to the gates of the transistors Tr2 in the column output circuits OUT[1] to OUT[n], so that the transistors Tr2 are turned on. The current $I_B[j]$ output from the column output circuit OUT[j] is $\Sigma I_0[i,j]$ (here, $\Sigma I_0[i,j]$ is the summation of $I_0[i,j]$ over i from 1 to m). When the current $I_{CMref0}$ is greater than the current $I_B[j]$, current flows into the first terminals of the capacitors C1 from the first terminals of the transistors Tr2 through the second terminals of the transistors Tr2, and positive potentials are held in the capacitors C1. Thus, the potentials of the gates of the transistors Tr1 are held, so that the current corresponding to the potentials of the gates of the transistors Tr1 flows between the sources and the drains of the transistors Tr1.

When Time T09 starts, the low-level potential is supplied to the wiring OSP, so that the transistors Tr2 in the column output circuits OUT[1] to OUT[n] are turned off. The potentials of the gates of the transistors Tr1 are held in the capacitors C1, so that even after Time T09, the same amount of current keeps flowing between the sources and the drains of the transistors Tr1.

<<Period from Time T10 to Time T11>>

During a period from Time T10 to Time T11, the wiring OSM is set at the high-level potential. At this time, the high-level potential is supplied to the gates of the transistors Tr22 in the column output circuits OUT[1] to OUT[n], so that the transistors Tr22 are turned on. The current $I_B[j]$ output from the column output circuit OUT[j] is $\Sigma I_0[i,j]$ (here, $\Sigma I_0[i,j]$ is the summation of $I_0[i,j]$ over i from 1 to m). When the current $I_{CMref0}$ is smaller than the current $I_B[j]$, the current flows into the first terminals of the transistors Tr22 from the first terminals of the capacitors C3 through the second terminals of the transistors Tr22, and potentials are held in the capacitors C3. Thus, the potentials of the gates of the transistors Tr21 are held, so that the current corresponding to the potentials of the gates of the transistors Tr21 flows between the sources and the drains of the transistors Tr21.

When Time T11 starts, the low-level potential is supplied to the wiring OSM, so that the transistors Tr22 in the column output circuits OUT[1] to OUT[n] are turned off. The potentials of the gates of the transistors Tr21 are held in the capacitors C3, so that even after Time T11, the same amount of current keeps flowing between the sources and the drains of the transistors Tr21.

Note that in the timing chart in FIG. 17, the operation for switching the conducting and non-conducting states of the transistor Tr2 (during the period from Time T08 to Time T09) is performed before the operation for switching the conducting and non-conducting states of the transistor Tr22 (during the period from Time T10 to Time T11); however, the order of the operation of the offset circuit 151 is not limited thereto. For example, the operation for switching the conducting and non-conducting states of the transistor Tr22 (during the period from Time T10 to Time T11) may be performed first, and then the operation for switching the conducting and non-conducting states of the transistor Tr2 (during the period from Time T08 to Time T09) may be performed.

Here, the column output circuit OUT[j] during a period from Time T06 to Time T12 (shown in FIG. 18) is focused on. In the column output circuit OUT[j], the current flowing between the source and the drain of the transistor Tr1 is denoted by $I_{CP}[j]$, and the current flowing between the source and the drain of the transistor Tr21 of the constant current circuit CI (current flowing from the terminal CT2 to the terminal CT5[j]) is denoted by $I_C[j]$. The current flowing between the source and the drain of the transistor Tr8 through the current mirror circuit CM is $I_{CMref0}$. On the assumption that the current is not output from the output terminal SPT[j] during the period from Time T1 to Time T12, the sum of the amounts of current flowing through each of the transistors Tr12 in the memory cells AM[1,i] to AM[n,i] flows in the wiring B[j] electrically connected to the column output circuit OUT[j]. In other words, the current $\Sigma I_0[i,j]$ flows in the wiring B[j] (here, $\Sigma I_0[i,j]$ is the summation of $I_0[i,j]$ over i from 1 to m). During the period from Time T06 to Time T12, in the column output circuit OUT[j], the current $I_{CMref0}$ that is input is different from $\Sigma I0[i,j]$ that is output, the current $I_C[j]$ flowing from the second terminal of the transistor Tr21 is supplied to the wiring OL[j], or the current $I_{CP}[j]$ flowing from the wiring OL[j] is supplied to the first terminal of the transistor Tr1. Thus, the above satisfies the following formula.

[Formula 10]

$$I_{CMref0} = I_C[j] - I_{CP}[j] = \sum_i I_0[i, j] \qquad (E4)$$

<<Period from Time T12 to Time T13>>

The operation after Time T12 is described with reference to FIG. 18. During a period from Time T12 to Time T13, a potential higher than the reference potential (denoted by REFP in FIG. 18) by $V_W[i]$ is applied to the wiring RW[i]. At this time, the potential $V_W[i]$ is applied to the second terminals of the capacitors C2 in the memory cells AM[i,1] to AM[i,n] and the memory cell AMref[i], so that the potentials of the gates of the transistors Tr12 increase.

Note that the potential $V_W[i]$ is a potential corresponding to the second analog data.

An increase in the potential of the gate of the transistor Tr12 corresponds to the potential obtained by multiplying a change in potential of the wiring RW[1] by a capacitive coupling coefficient determined by the memory cell structure. The capacitive coupling coefficient is calculated on the basis of the capacitance of the capacitor C2, the gate capacitance of the transistor Tr2, and the parasitic capacitance. In this operation example, to avoid complexity of description, an increase in potential of the wiring RW[i] is equal to an increase in potential of the gate of the transistor Tr12, which corresponds to a case where the capacitive coupling coefficient in each of the memory cells AM and the memory cell AMref is set to 1.

When the potential $V_W[i]$ is applied to the second terminals of the capacitors C2 in the memory cell AM[i,j], the memory cell AM[i,j+1], and the memory cell AMref[i] on the assumption that the capacitive coupling coefficient is 1, the potentials of the node N[i,j], the node N[i,j+1], and the node Nref[i] each increase by $V_W[i]$.

The current flowing from the first to second terminal of the transistor Tr12 in each of the memory cell AM[i,j], the memory cell AM[i,j+1], and the memory cell AMref[i] is described. The current I[i,j] flowing from the wiring B[j] to the second terminal through the first terminal of the transistor Tr12 in the memory cell AM[i,j] can be expressed by the following formula.

[Formula 11]

$$I[i,j] = k(V_{PR} - V_X[i,j] + V_W[i] + V_{th})^2 \quad (E5)$$

In other words, by application of the potential $V_W[i]$ to the wiring RW[i], the current flowing from the wiring B[j] to the second terminal through the first terminal of the transistor Tr12 in the memory cell AM[i,j] increases by $I[i,j] - I_0[i,j]$ (denoted by $\Delta I[i,j]$ in FIG. 18).

Similarly, the current I[i,j+1] flowing from the wiring B[j+1] to the second terminal through the first terminal of the transistor Tr12 in the memory cell AM[i,j+1] can be expressed by the following formula.

$$I[i,j+1] = k(V_{PR} - V_X[i,j+1] + V_W[i] - V_{th})^2 \quad \text{[Formula 12]}$$

In other words, by application of the potential $V_W[i]$ to the wiring RW[i], the current flowing from the wiring B[j+1] to the second terminal through the first terminal of the transistor Tr12 in the memory cell AM[i,j+1] increases by $I[i,j+1] - I_0[i,j+1]$ (denoted by $\Delta I[i,j+1]$ in FIG. 18).

Furthermore, the current $I_{ref}[i]$ flowing from the wiring Bref to the second terminal through the first terminal of the transistor Tr12 in the memory cell AMref[i] can be expressed by the following formula.

[Formula 13]

$$I_{ref}[i] = k(V_{PR} + V_W[i] - V_{th})^2 \quad (E6)$$

In other words, by application of the potential $V_W[i]$ to the wiring RW[i], the current flowing from the wiring Bref to the second terminal through the first terminal of the transistor Tr12 in the memory cell AMref[i] increases by $I_{ref}[i] - I_{ref0}[i]$ (denoted by $\Delta I_{ref}[i]$ in FIG. 18).

Here, the reference column output circuit Cref is focused on. The total amount of current flowing through the transistors Tr12 in the memory cells AMref[1] to AMref[m] flows into the wiring Bref. The wiring OLref is electrically connected to the wiring Bref via the output terminal OTref, and thus the current $I_{Bref}$, which is the current $\Sigma I_{ref}[i]$, flows through the wiring OLref. In the current mirror circuit CM, the current is output in the direction from the first terminal of the transistor Tr9 to the node NCMref in accordance with the potential of the node NCMref.

Thus, the current $I_{CMref}$ flowing from the terminal CT8 through the wiring ILref in the current mirror circuit CM can be expressed by the following formula.

[Formula 14]

$$I_{CMref} = \sum_i I_{ref}[i] \quad (E7)$$

Here, the current $\Delta I_B[j]$ that is output from the wiring B[j] is focused on. During the period from Time T11 to Time T12, Formula (E4) is satisfied, and the current $\Delta I_B[j]$ is not output from the terminal SPT[i] that is electrically connected to the wiring B[j].

During the period from Time T12 to Time T13, a potential higher than the reference potential by $V_W[i]$ is applied to the wiring RW[i], and the current flowing between the source and the drain of the transistor Tr12 in the memory cell AM[i,j] changes. Then, the current $\Delta I_B[j]$ is output from the output terminal SPT[i] that is electrically connected to the wiring B[j]. Specifically, in the column output circuit OUT[j], the current $I_C[j]$ is output from the terminal CT2 of the constant current circuit CI, the current $I_{CM}$ flows between the source and the drain of the transistor Tr5, and the current $I_{CP}[j]$ flows between the source and the drain of the transistor Tr1. Thus, the current $\Delta I_B[j]$ can be expressed by the following formula using $\Sigma I[i,j]$, which is the summation of current I[i,j] over i from 1 to m. Here, the current I[i,j] is current flowing between the source and the drain of the transistor Tr12 in the memory cell AM[i,j].

[Formula 15]

$$\Delta I_B[j] = (I_C[j] - I_{CM} - I_{CP}[j]) - \sum_i I[i,j] \quad (E8)$$

Formulae (E1) to (E7) are applied to Formula (E8), so that the following formula can be obtained.

[Formula 16]

$$\Delta I_B[j] = 2k \sum_i (V_X[i,j] V_W[i]) \quad (E9)$$

According to Formula (E9), the current $\Delta I_B[j]$ is a value corresponding to the sum of products of the potential $V_X[i,j]$ that is the first analog data and the potential $V_W[i]$ that is the second analog data. That is, when the current $\Delta I_B[j]$ is calculated, the value of the sum of products of the first analog data and the second analog data can be obtained.

During the period from Time T12 to Time T13, when all of the wirings RW[1] to RW[m] except the wiring RW[i] are set to have a reference potential, the relation, $V_W[g]=0$ (here, g is an integer that is greater than or equal to 1 and less than or equal to m and not i), is satisfied. Thus, according to Formula (E9), $\Delta I_B[j]=2kV_X[i,j]V_W[i]$ is output. In other words, the data corresponding to the product of the first analog data stored in the memory cell AM[i,j] and the second analog data corresponding to a selection signal supplied to the wiring RW[1] is output from the output terminal SPT[j] that is electrically connected to the wiring B[j].

Furthermore, similarly, a differential current that is output from the output terminal SPT[j+1] that is electrically connected to the wiring B[j+1] is expressed as $\Delta I_B[j+1]=2kV_X[i,j+1]V_W[i]$. The data corresponding to the product of the first analog data stored in the memory cell AM[i,j+1] and the second analog data corresponding to a selection signal supplied to the wiring RW[i] is output from the output terminal SPT[j+1] that is electrically connected to the wiring B[j+1].

<<Period from Time T13 to Time T14>>

During a period from Time T13 to Time T14, the ground potential is supplied to the wiring RW[i]. The ground potential is supplied to the second terminals of the capacitors C2 in the memory cells AM[i,1] to AM[i,n] and the memory cell AMref[i]. Thus, the potentials of the nodes N[i,1] to N[i,n] and the node Nref[i] return to the potentials during the period from Time T11 to Time T12.

<<Period from Time T14 to Time T15>>

During a period from Time T14 to Time T15, the wirings RW[1] to RW[m] except the wiring RW[i+1] are set to have the reference potential, and a potential higher than the reference potential by $V_W[i+1]$ is applied to the wiring RW[i+1]. At this time, as in the operation during the period from Time T12 to Time T13, the potential $V_W[i+1]$ is applied to the second terminals of the capacitors C2 in the memory cells AM[i+1,1] to AM[i+1,n] and the memory cell AMref[i+1], so that the potentials of the gates of the transistors Tr12 increase.

The potential $V_W[i+1]$ corresponds to the second analog data.

As described above, the capacitive coupling coefficients of the memory cells AM and the memory cell AMref are each 1. When the potential $V_W[i+1]$ is applied to the second terminals of the capacitors C2 in the memory cell AM[i+1,j], the memory cell AM[i+1,j+1], and the memory cell AMref[i+1], the potentials of the node N[i+1,j], the node N[i+1,j+1], and the node Nref[i+1] each increase by $V_W[i+1]$.

When the potentials of the node N[i+1,j], the node N[i+1,j+1], and the node Nref[i+1] increase by $V_W[i+1]$, the amount of current flowing in each of the transistors Tr12 in the memory cell AM[i+1,j], the memory cell AM[i+1,j+1], and the memory cell AMref[i+1] increases. When the current flowing in the transistor Tr12 in the memory cell AM[i+1,j] is denoted by I[i+1,j], the current flowing from the output terminal OT[j] of the column output circuit OUT[j] to the wiring B[j] increases by $I[i+1,j]-I_0[i+1,j]$ (denoted by $\Delta I[i+1,j]$ in FIG. 18). Similarly, when the current flowing in the transistor Tr12 in the memory cell AM[i+1,j+1] is denoted by I[i+1,j+1], the current flowing from the output terminal OT[j+1] of the column output circuit OUT[j+1] to the wiring B[j+1] increases by $I[i+1,j+1]-I_0[i+1,j+1]$ (denoted by $\Delta I[i+1,j+1]$ in FIG. 18). When the current flowing in the transistor Tr12 in the memory cell AMref[i+1] is denoted by $I_{ref}[i+1]$, the current flowing from the output terminal OTref of the reference column output circuit Cref to the wiring Bref increases by $I_{ref}[i+1]-I_{ref0}[i+1]$ (denoted by $\Delta I_{ref}[i+1]$ in FIG. 18).

The operation during the period from Time T14 to Time T15 can be similar to the operation during the period from Time T12 to Time T13. Thus, when Formula (E9) is applied to the operation during the period from Time T14 to Time T15, the differential current that is output from the wiring B[j] is expressed as $\Delta I_B[j]=2kV_x[i+1,j]V_W[i+1]$. In other words, the data corresponding to the product of the first analog data stored in the memory cell AM[i+1,j] and the second analog data corresponding to a selection signal applied to the wiring RW[i+1] is output from the output terminal SPT[j] that is electrically connected to the wiring B[j].

Furthermore, similarly, the differential current that is output from the wiring B[j+1] is expressed as $\Delta I_B[j+1]=2kV_x[i+1,j+1]V_W[i+1]$. The data corresponding to the product of the first analog data stored in the memory cell AM[i+1,j+1] and the second analog data corresponding to a selection signal applied to the wiring RW[i+1] is output from the output terminal SPT[j+1] that is electrically connected to the wiring B[j+1].

<<Period from Time T15 to Time T16>>

During a period from Time T15 to Time T16, the ground potential is supplied to the wiring RW[i+1]. In this period, the ground potential is supplied to the second terminals of the capacitors C2 in the memory cells AM[i+1,1] to AM[i+1,n] and the memory cell AMref[i+1], and the potentials of nodes N[i+1,1] to N[i+1,n] and the node Nref[i+1] return to the potentials in the period from Time T13 to Time T14.

<<Period from Time T16 to Time T17>>

During a period from Time T16 to Time T17, the wirings RW[1] to RW[m] except the wiring RW[1] and the wiring RW[i+1] are set to have the reference potential, a potential higher than the reference potential by $V_{W2}[i]$ is applied to the wiring RW[1], and a potential lower than the reference potential by $V_{W2}[i+1]$ is applied to the wiring RW[i+1]. At this time, as in the operation during the period from Time T12 to Time T13, the potential $V_{W2}[i]$ is applied to the second terminals of the capacitors C2 in the memory cells AM[i,1] to AM[i,n] and the memory cell AMref[i], so that potentials of the gates of the transistors Tr12 in the memory cells AM[i,1] to AM[i,n] and the memory cell AMref[i] increase. Concurrently, the potential $-V_{W2}[i+1]$ is applied to the second terminals of the capacitors C2 in the memory cells AM[i+1,1] to AM[i+1,n] and the memory cell AMref[i+1], so that the potentials of the gates of the transistors Tr12 in the memory cells AM[i+1,1] to AM[i+1,n] and the memory cell AMref[i+1] decrease.

The potential $V_{W2}[i]$ and the potential $V_{W2}[i+1]$ are potentials each corresponding to the second analog data.

Note that the capacitive coupling coefficients of the memory cell AM and the memory cell AMref are each 1. When the potential $V_{W2}[i]$ is applied to the second terminals of the capacitors C2 in the memory cell AM[i,j], the memory cell AM[i,j+1], and the memory cell AMref[i], the potentials of the node N[i,j], the node N[i,j+1], and the node Nref[i] each increase by $V_{W2}[i]$. When the potential $-V_{W2}[i+1]$ is applied to the second terminals of the capacitors C2 in the memory cell AM[i+1,j], the memory cell AM[i+1,j+1], and the memory cell AMref[i+1], the potentials of the node N[i+1,j], the node N[i+1, j+1], and the node Nref[i+1] each decrease by $V_{W2}[i+1]$.

When each of the potentials of the node N[i,j], the node N[i,j+1], and the node Nref[i] increases by $V_{W2}[i]$, the amount of current flowing in each of the transistors Tr12 in the memory cell AM[i,j], the memory cell AM[i,j+1], and the memory cell AMref[i] increases. Here, the current flowing in the transistor Tr12 in the memory cell AM[i,j] is denoted by I[i,j], the current flowing in the transistor Tr12 in the memory cell AM[i,j+1] is denoted by I[i,j+1], and the current flowing in the transistor Tr12 in the memory cell AMref[i] is denoted by $I_{ref}[i]$.

When the potentials of the node N[i+1,j], the node N[i+1,j+1], and the node Nref[i+1] each decrease by $V_{W2}[i+1]$, the amount of current flowing in each of the transistors Tr12 in the memory cell AM[i+1,j], the memory cell AM[i+1,j+1], and the memory cell AMref[i+1] decreases. Here, the current flowing in the transistor Tr12 in the memory cell AM[i+1,j] is denoted by $I_2[i,j]$, the current flowing in the transistor Tr12 in the memory cell AM[i+1,j+1] is denoted by $I_2[i,j+1]$, and the current flowing in the transistor Tr12 in the memory cell AMref[i+1] is denoted by $I_2\mathrm{ref}[i+1]$.

At this time, the current flowing from the output terminal OT[j] of the column output circuit OUT[j] to the wiring B[j] increases by $(I_2[i,j]-I_0[i,j])+(I_2[i+1j]-I_0[i+1j])$ (denoted by AM in FIG. 18). The current flowing from the output terminal OT[j+1] of the column output circuit OUT[j+1] to the wiring B[j+1] increases by $(I_2[i,j+1]-I_0[i,j+1])+(I_2[i+1,j+1]-I_0[i+1,j+1])$ (denoted by ΔI[j+1] in FIG. 18, which is a negative current). The current flowing from the output terminal OTref of the reference column output circuit Cref to the wiring Bref increases by $(I_2ref[i,j]-Iref_0[i,j])+(I_2ref[i+1,j]-Iref_0[i+1,j])$ (denoted by $\Delta I_{Bref}$ in FIG. 18).

The operation during the period from Time T16 to Time T17 can be similar to that operation during the period from Time T12 to Time T13. When Formula (E9) is applied to the operation during the period from Time T16 to Time T17, the differential current that is output from the wiring B[j] is expressed as $\Delta I_B[j]=2k\{V_X[i,j]V_{W2}[i]-V_x[i+1,j]-V_{W2}[i+1]\}$. Thus, the data corresponding to the sum of products of the first analog data stored in each of the memory cell AM[i,j] and the memory cell AM[i+1,j] and the second analog data corresponding to a selection signal applied to each of the wiring RW[i] and the wiring RW[i+1] is output from the output terminal SPT[j] that is electrically connected from the wiring B[j].

Furthermore, similarly, the differential current that is output from the wiring B[j+1] is expressed as $\Delta IB[j+1]=2k\{V_X[i,j+1]V_{W2}[i]-V_x[i+1,j+1]V_{W2}[i+1]\}$. The data corresponding to the product of the first analog data stored in each of the memory cell AM[i,j+1] and the memory cell AM[i+1,j+1] and the second analog data corresponding to a selection signal applied to each of the wiring RW[i] and the wiring RW[i+1] is output from the output terminal SPT[j+1] that is electrically connected to the wiring B[j+1].

<<After Time T17>>

After Time T17, the ground potential is supplied to the wiring RW[i] and the wiring RW[i+1]. At this time, the ground potential is supplied to the second terminals of the capacitors C2 in the memory cells AM[i,1] to AM[i,n], the memory cells AM[i+1,1] to AM[i+1,n], the memory cell AMref[i], and the memory cell AMref[i+1]. Thus, the potentials of the nodes N[i,1] to N[i,n], the nodes N[i+1,1] to N[i+1,n], the node Nref[i], and the node Nref[i+1] return to the potentials in the period from Time T15 to Time T16.

With the circuit configuration of FIG. 7, a plurality of product-sum operations can be executed concurrently. Thus, a semiconductor device enabling high-speed product-sum operation can be provided.

When the product-sum operation circuit described in this embodiment is used for the hidden layer described in Embodiment 1, the weight coefficient $w_{s[k-1]}^{(k)}$ is the first analog data stored in the memory cell AM[i,j] and the output signal $z_{s[k-1]}^{(k-1)}$ from the s[k-1]-th neuron in the (k-1)-th layer is a potential (second analog data) supplied from the wiring RW[i]; thus, the value of the sum of products of the first analog data and the second analog data can be obtained from the current output to the terminal SPT[i] in the product-sum operation circuit. In addition, the value of the activation function can be obtained from the value of the sum of products, so that the value of the activation function can be the output signal $z_{s[k]}^{(k)}$ of the s[k]-th neuron in the k-th layer.

When the product-sum operation circuit described in this embodiment is used for the output layer described in Embodiment 1, the weight coefficient $w_{s[L]s[L-1]}^{(L)}$ is the first analog data stored in the memory cell AM[i,j] and the output signal $z_{s[L-1]}^{(L-1)}$ from the s[L-1]-th neuron in the (L-1)-th layer is a potential (second analog data) supplied from the wiring RW[i]; thus, the value of the sum of products of the first analog data and the second analog data can be obtained from current output to the terminal SPT[i] in the product-sum operation circuit. In addition, the value of the activation function can be obtained from the value of the sum of products, so that the value of the activation function can be the output signal $z_{s[L]}^{(L)}$ of the s[L]-th neuron in the L-th layer.

Note that the input layer described in Embodiment 1 may function as a buffer circuit that outputs an input signal to the second layer.

In the product-sum operation circuit described in this embodiment, the number of the rows of the memory cells AM in one layer corresponds to the number of the neurons in the previous layer. That is, the number of the rows of the memory cells AM in one layer corresponds to the number of output signals of the neurons in the previous layer that are input to the one layer. In the case where the number of the neurons in the previous layer is greater than the number of the rows of the memory cells AM, as described in Embodiment 1, a plurality of product-sum operation circuits are connected to each other with the switch circuit MSW by sharing the wiring B[j]; accordingly, the number of the rows of the memory cells AM is increased to be equal to the number of the neurons in the previous layer. In the case where the number of the neurons in the one layer is increased, as described in Embodiment 1, a plurality of product-sum operation circuits are connected to each other with the switch circuit MSW by sharing the wirings WW[i] and RW[i]; accordingly, the number of the columns of the memory cells AM is increased to be equal to the number of the neurons in the one layer. That is, by combining this embodiment with Embodiment 1, the connection of the wirings B[j], WW[i], and RW[i] of a plurality of product-sum operation circuits can be freely changed, so that a variety of neural networks become possible.

Note that this embodiment can be combined with not only Embodiment 1 but also any of the other embodiments in this specification as appropriate.

Embodiment 3

In this embodiment, application examples of the semiconductor device described in the above embodiment to electronic devices are described with reference to FIGS. 19A to 19E.

<Electronic Component>

Figure 19:
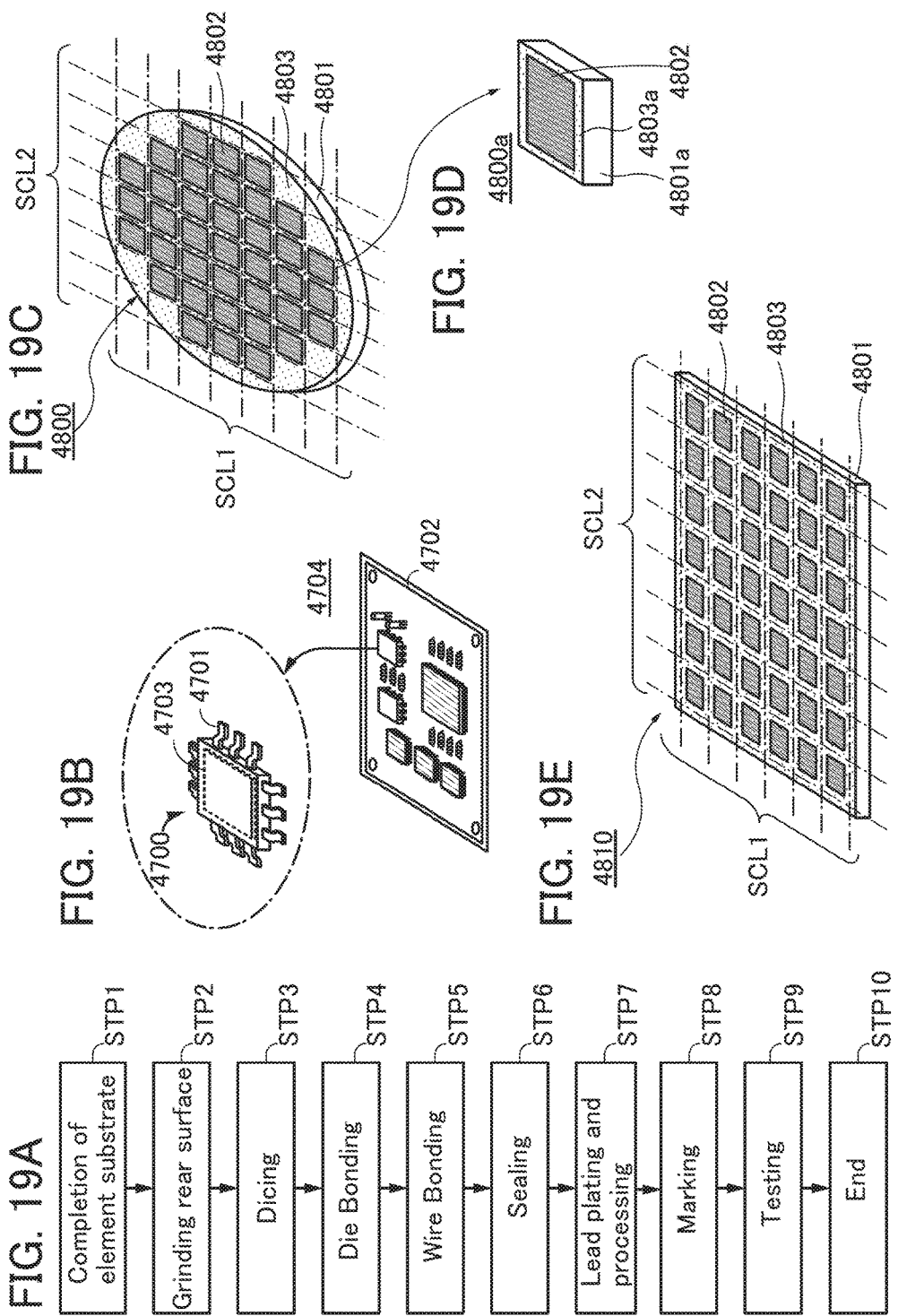
FIGS. 19A to 19E are a flow chart, a perspective view of an electronic component, and perspective views of a semiconductor wafer.

FIG. 19A illustrates an example where the semiconductor device described in the foregoing embodiment is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

The semiconductor device described in Embodiments 1 and 2, which are described above, including transistors, capacitors, and other components is completed through an assembly process (post-process) of assembling detachable components on a printed board.

The post-process can be completed through steps in FIG. 19A. Specifically, after an element substrate obtained in the proceeding process is completed (Step STP1), a rear surface of the substrate is ground (Step STP2). The substrate is thinned in this step to reduce warpage or the like of the substrate in the proceeding process and to reduce the size of the component itself After the rear surface of the substrate is ground, a dicing step is performed to divide the substrate into a plurality of chips (Step STP3). Then, the divided chips are separately picked up, placed on a lead frame, and bonded thereto in a die bonding step (Step STP4). In this die bonding step, the chip is bonded to the lead frame by an appropriate method depending on a product, for example, bonding with a resin or a tape. Note that in the die bonding step, the chip may be mounted on an interposer to be bonded.

Note that in this embodiment, when an element is formed on a surface of a substrate, the other surface is referred to as a rear surface (a surface on which the element is not formed).

Next, wire bonding for electrically connecting a lead of the lead frame and an electrode on a chip through a metal wire is performed (Step STP5). A silver line or a gold line can be used as the metal fine line. Ball bonding or wedge bonding can be used as the wire bonding.

A wire-bonded chip is subjected to a molding step of sealing the chip with an epoxy resin or the like (Step STP6). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP7). This plate processing prevents rust of the lead and facilitates soldering at the time of mounting the chip on a printed circuit board in a later step.

Next, printing (marking) is performed on a surface of the package (Step STP8). After a final testing step (Step STP9), the electronic component is completed (Step STP10).

The above electronic component can include the semiconductor device described in the above embodiment. Thus, a highly reliable electronic component can be obtained.

FIG. 19B is a schematic perspective diagram of the completed electronic component. FIG. 19B is a schematic perspective diagram of a quad flat package (QFP) as an example of the electronic component. An electronic component 4700 in FIG. 19B includes a lead 4701 and a circuit portion 4703. The electronic component 4700 in FIG. 19B is mounted on a printed circuit board 4702, for example. A plurality of electronic components 4700 that are combined and electrically connected to each other over the printed circuit board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. In addition, the element substrate of one embodiment of the present invention includes an element substrate that has been subjected to Step STP3 where the dicing step is performed. For example, a semiconductor wafer 4800 shown in FIG. 19C or the like corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. For performing the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 19D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 19C. For example, a rectangular semiconductor wafer 4810 shown in FIG. 19E can be employed. The shape of the element substrate can be changed as appropriate, depending on a process for fabricating an element and an apparatus for fabricating an element.

Note that this embodiment can be combined with any of the other embodiments in this specification as appropriate.

Embodiment 4

In this embodiment, application examples of the semiconductor device described in Embodiments 1 and 2 are described.

Since the semiconductor device 100 functions as a product-sum operation circuit, the semiconductor device 100 can be used as one of components of a neural network in some cases. The neural network is an information processing system modeled on a biological neural network and enables the characteristics of a brain function to be expressed on a computer.

The neural network has a configuration where units resembling neurons are connected to each other through units resembling synapses. It is considered that when the connection strength is changed, the neural network learns about a variety of input patterns and comes to enable pattern recognition, associative storage, and data mining to be executed at high speed. In particular, a novel electronic device utilizing pattern recognition of sound, voice, music, images, videos, or the like can be fabricated in some cases with the neural network.

In the semiconductor device described in Embodiments 1 and 2, the first analog data serves as weight coefficients, and the second analog data corresponds to neuron outputs, whereby the weighting calculation of neuron outputs can be conducted concurrently. Thus, data corresponding to results of the weighting calculation, that is, synapse inputs can be obtained as the output signals.

<Electronic Device>

Here, electronic devices or systems utilizing the neural network are described.

Figure 20:
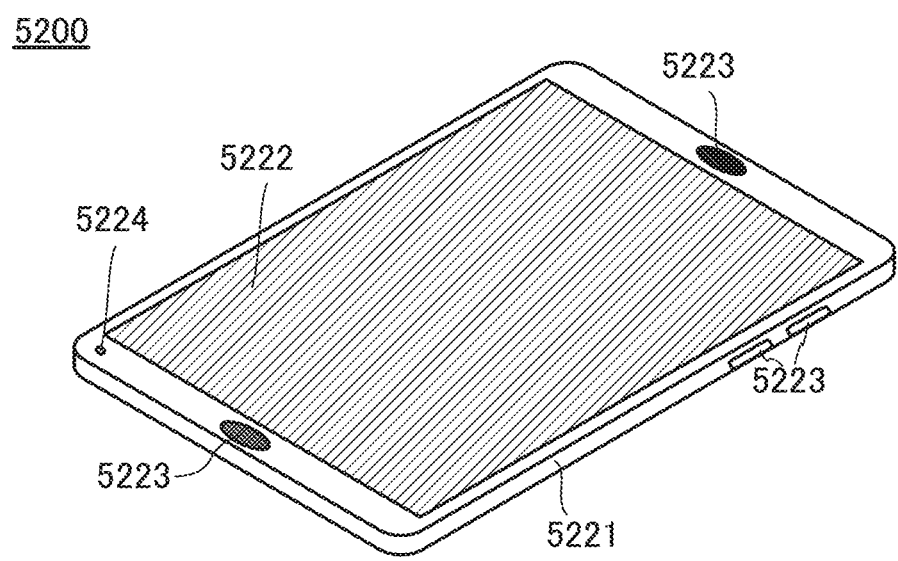
FIG. 20 is a perspective view illustrating an example of an electronic device.

FIG. 20 illustrates a tablet information terminal 5200, which includes a housing 5221, a display portion 5222, operation buttons 5223, and a speaker 5224. A display device with a position input function may be used for a display portion 5222. Note that the position input function can be added by providing a touch panel in a display device. Alternatively, the position input function can be added by providing a photoelectric conversion element called a photosensor in a pixel area of a display device. As the operation buttons 5223, any one of a power switch for starting the information terminal 5200, a button for operating an application of the information terminal 5200, a volume control button, a switch for turning on or off the display portion 5222, and the like can be provided. Although the number of the operation buttons 5223 is four in the information terminal 5200 illustrated in FIG. 20, the number and position of operation buttons included in the information terminal 5200 is not limited to this example.

Although not illustrated, the information terminal 5200 illustrated in FIG. 20 may include a microphone. With this structure, the information terminal 5200 can have a telephone function like a cellular phone, for example.

Although not illustrated, the information terminal 5200 illustrated in FIG. 20 may include a camera. Although not illustrated, the information terminal 5200 illustrated in FIG. 20 may include a light-emitting device for use as a flashlight or a lighting device.

Although not illustrated, the information terminal 5200 illustrated in FIG. 20 may include a sensor (that measures force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a sensing device including a sensor for sensing inclination such as a gyroscope sensor or an acceleration sensor is provided, display on the screen of the display portion 5222 can be automatically changed in accordance with the orientation of the information terminal 5200 illustrated in FIG. 20 by determining the orientation of the information terminal 5200 (the orientation of the information the terminal with respect to the vertical direction).

Although not illustrated, the information terminal 5200 illustrated in FIG. 20 may include a device for obtaining biological information such as fingerprints, veins, iris, voice prints, or the like. With this structure, the information terminal 5200 can have a biometric authentication function. In particular, the artificial neural network is used for the biometric authentication function, whereby a high-accuracy authentication system can be constructed in some cases.

Furthermore, the application of the neural network in the information terminal is not limited only to the authentication system. For example, in the information terminal 5200 in FIG. 20 utilizing the neural network, speech interpretation can be performed in some cases. With the speech interpretation function, the information terminal 5200 can have a function of operating the information terminal 5200 by speech recognition, a function of interpreting a speech or a conversation and creating a summary of the speech or the conversation, and the like. This can be utilized to create meeting minutes or the like, for example.

For example, when a touch panel is used for the display portion 5222, a character or a figure that is written or drawn on the display portion 5222 with a finger, a stylus pen, or the like can be recognized by use of a neural network in some cases. With this character recognition function, the information terminal 5200 can be operated by input of a character, a figure, or the like. In addition, the information terminal 5200 can recognize the written character and can obtain the data of the character.

This function can be used for a learning method in which an answer is written with a finger, a stylus pen, or the like on an information terminal that displays a workbook or the like for studying mathematics or for learning a native or foreign language, and then the information terminal determines whether or not the answer is correct. Furthermore, the above-described function of interpreting a speech or a conversation can be used for learning of a foreign language.

Thus, the pattern recognition function of the neural network is suitable for an information terminal used for teaching materials such as textbooks.

This embodiment can be combined with any of the other embodiments in this specification as appropriate.

Embodiment 5

In this embodiment, an input/output device that can be provided for the tablet terminal in FIG. 20 described in Embodiment 4 is described.

Figure 21A:
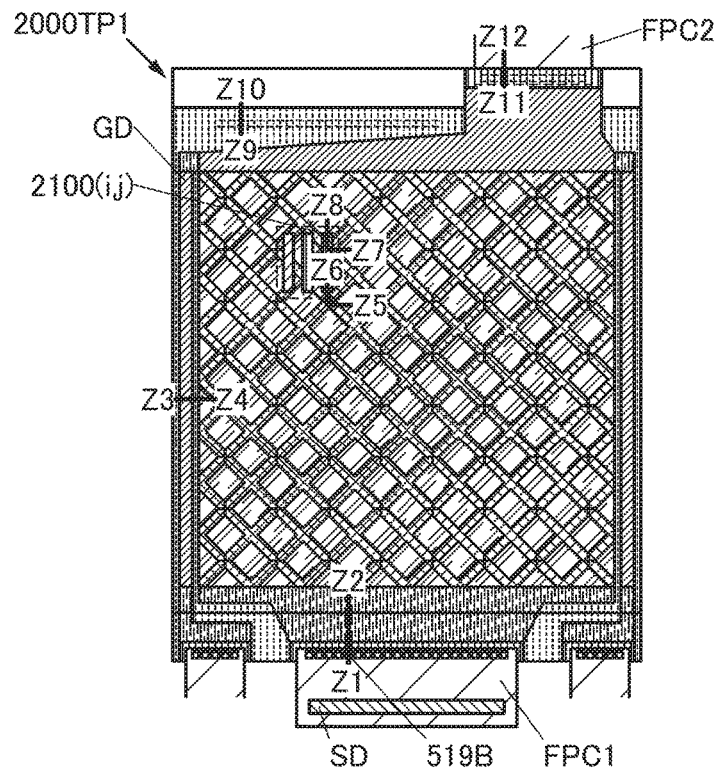
Figures 1, 21B:
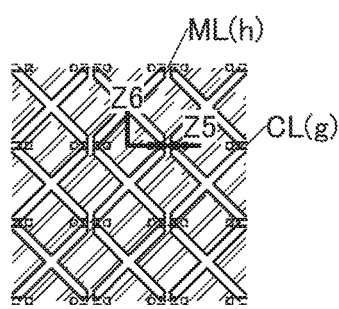
Figures 2, 21B:
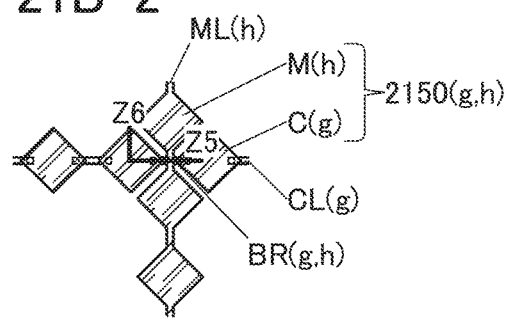
Figure 21C:
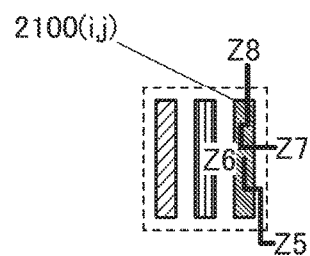

FIGS. 21A, 21B-1, 21B-2, and 21C illustrate a structure of a touch panel 2000TP1 that can be used for an input/output device. FIG. 21A is a top view of the touch panel. FIG. 21B-1 is a schematic view illustrating part of an input portion of the touch panel. FIG. 21B-2 is a schematic view illustrating part of the structure of FIG. 21B-1. FIG. 21C is a schematic view illustrating part of a display portion included in the touch panel.

Figure 22A:
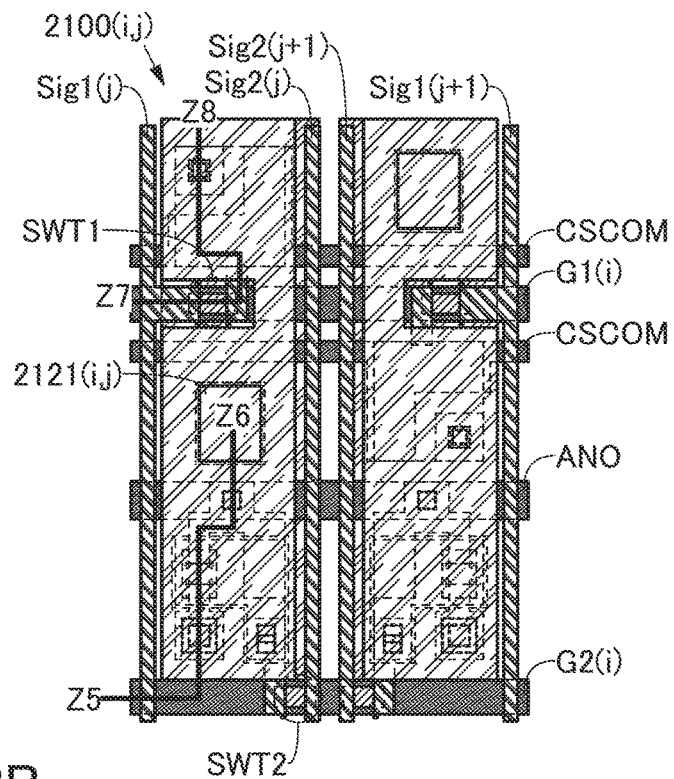
FIGS. 22A and 22B illustrate a structure example of a pixel in a display panel of a touch panel.
Figure 22B:
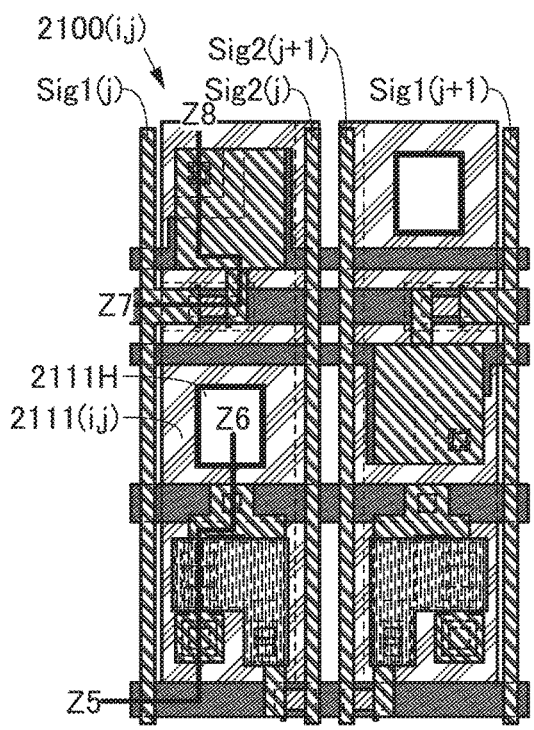

FIG. 22A is a bottom view illustrating part of the structure of a pixel in the touch panel in FIG. 21C. FIG. 22B is a bottom view illustrating part of the structure in FIG. 22A in which some components are omitted.

Figure 23A:
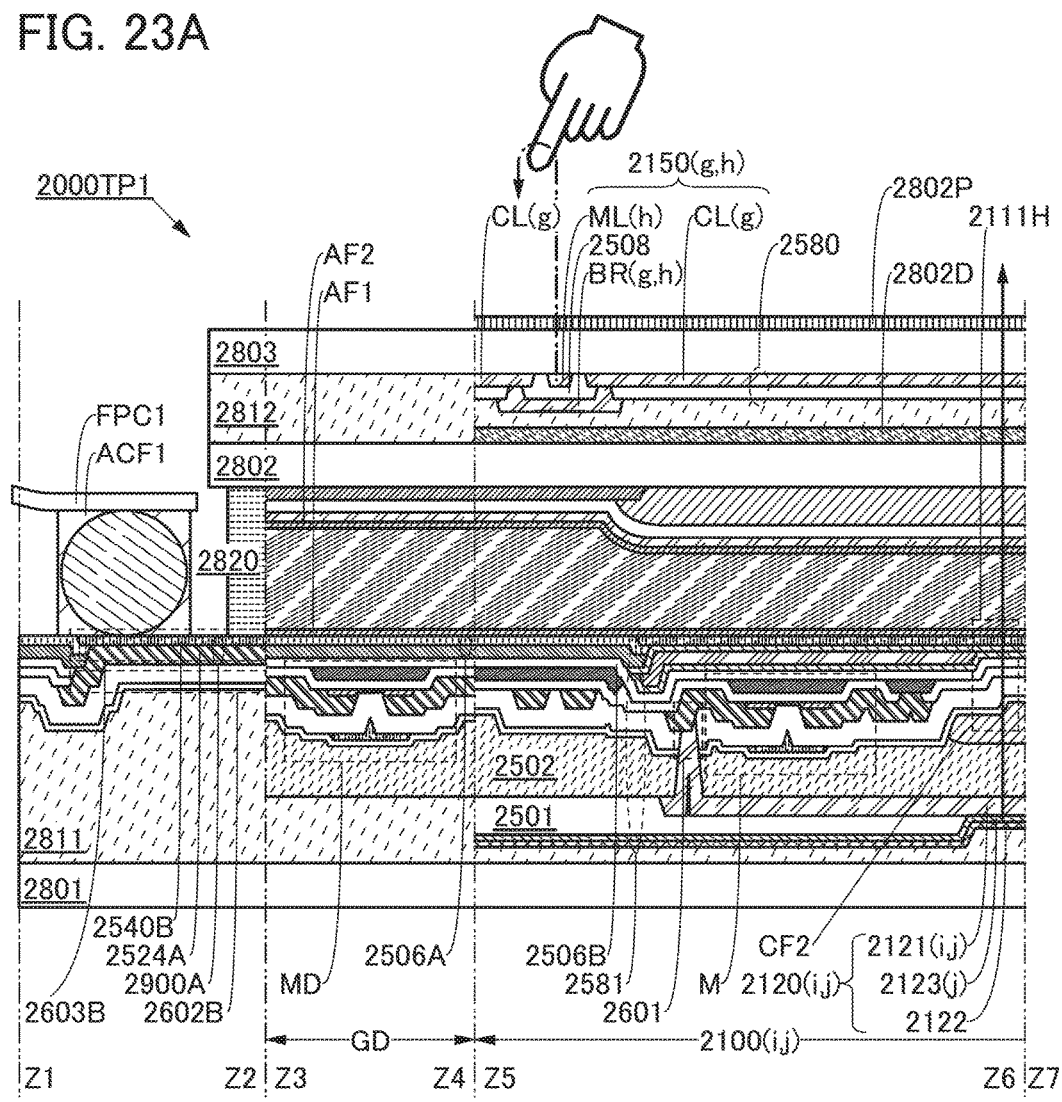
FIGS. 23A and 23B are cross-sectional views illustrating a structure example of a touch panel.
Figure 23B:
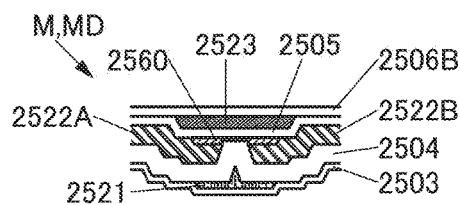

FIGS. 23A and 23B and FIGS. 24A and 24B are cross-sectional views illustrating the structure of the touch panel. FIG. 23A is a cross-sectional view taken along bold lines Z1-Z2, Z3-Z4, and Z5-Z6 in FIG. 21A. FIG. 23B illustrates part of FIG. 23A.

Figure 24A:
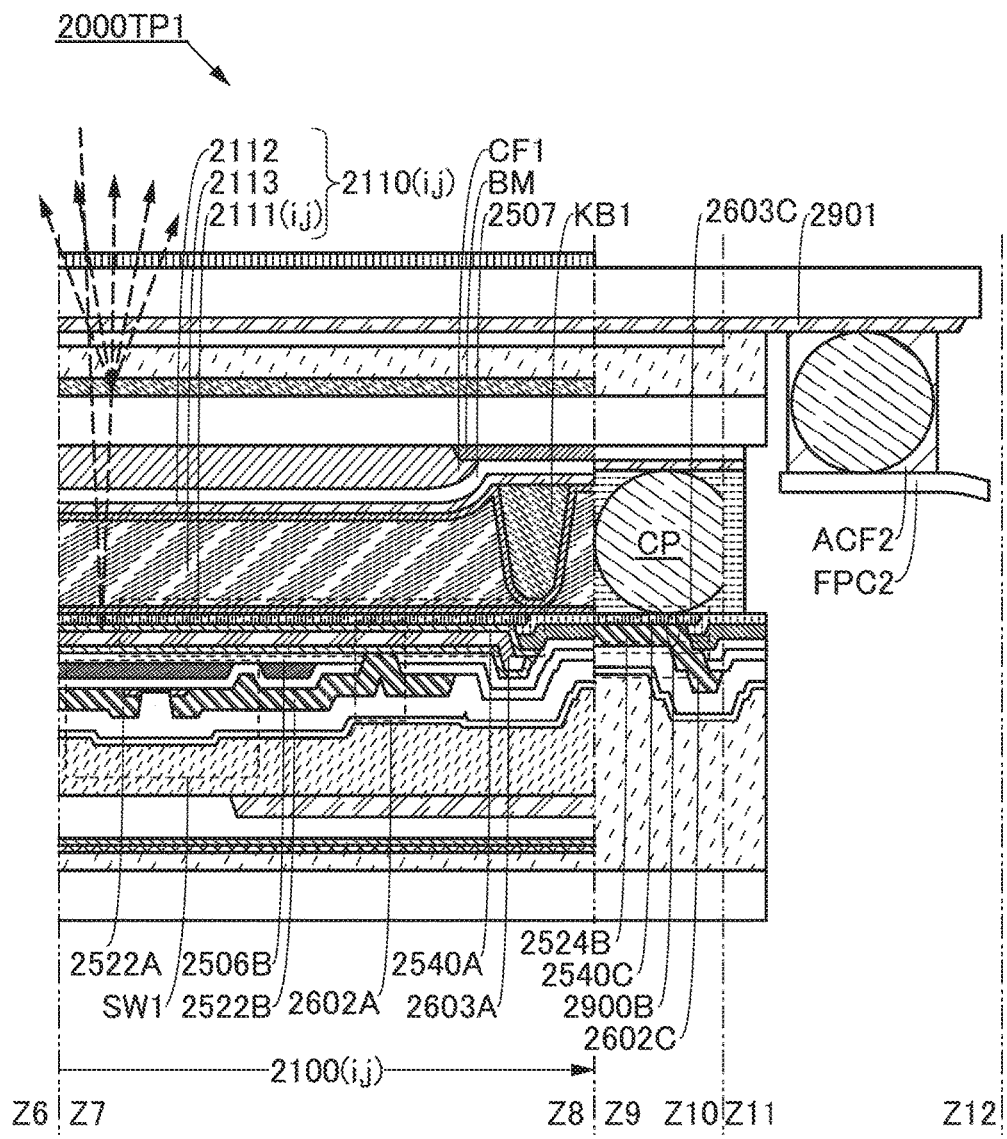
FIGS. 24A and 24B are cross-sectional views illustrating a structure example of a touch panel.
Figure 24B:
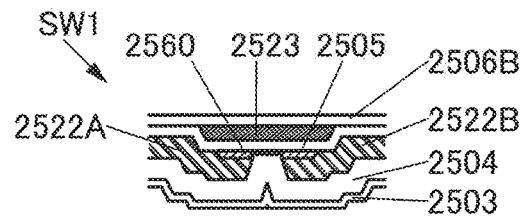

FIG. 24A is a cross-sectional view taken along bold lines Z7-Z8, Z9-Z10, and Z11-Z12 in FIG. 21A. FIG. 24B illustrates part of FIG. 24A.

Figure 25A:
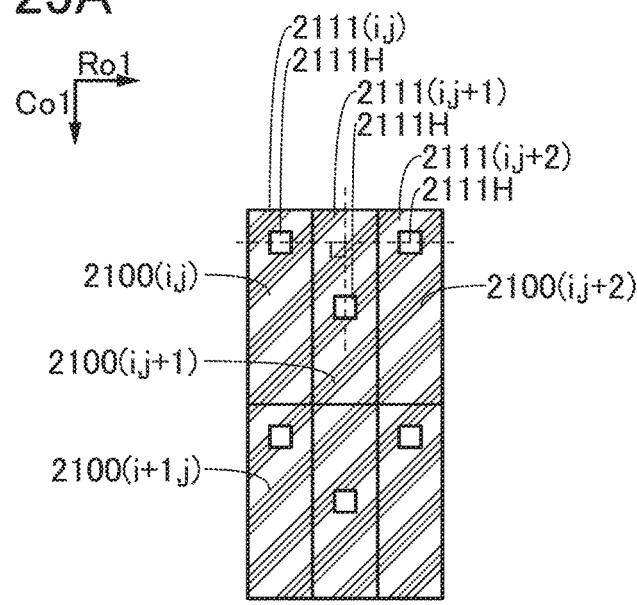
FIGS. 25A to 25C are schematic views illustrating an example of a shape of a reflective film of a display panel.
Figure 25B:
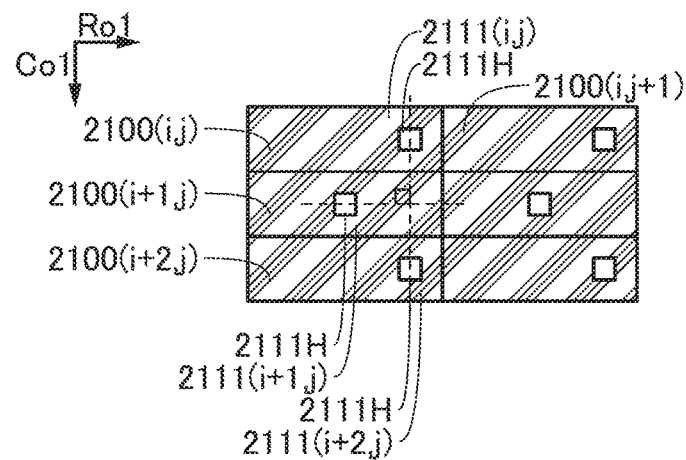
Figure 25C:
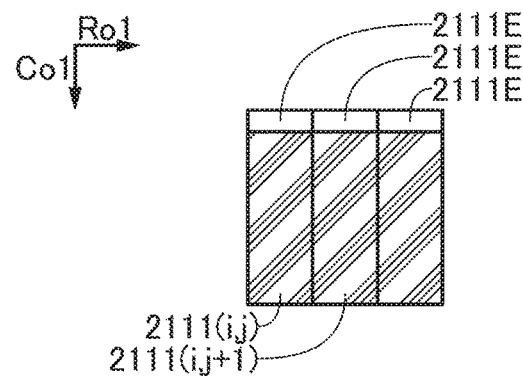

FIGS. 25A to 25C are schematic views each illustrating the shape of a reflective film that can be used in a pixel of the touch panel.

Figure 26:
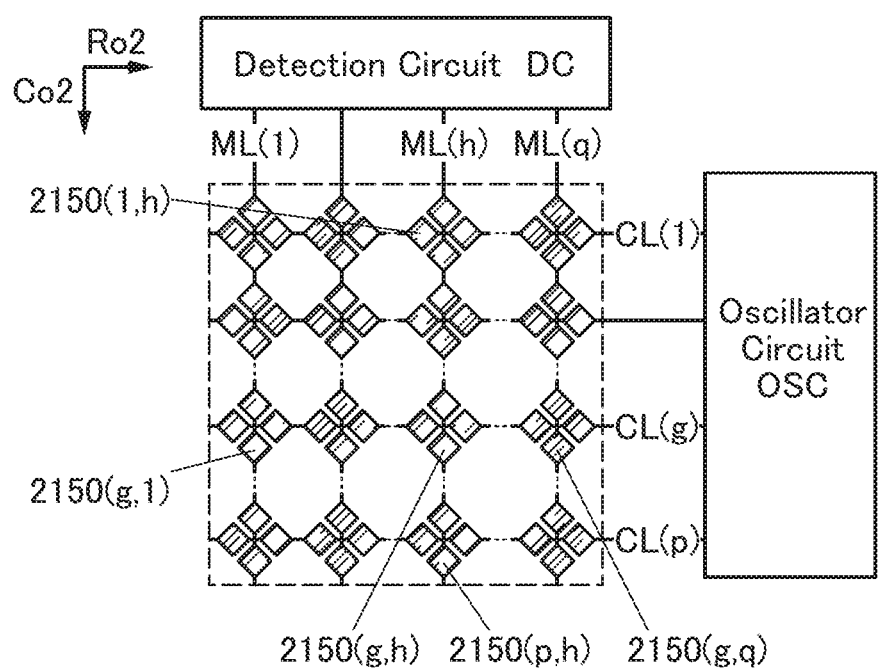
FIG. 26 is a block diagram illustrating a structure example of an input portion.

FIG. 26 is a block diagram illustrating the structure of the input portion of the touch panel.

Figure 27:
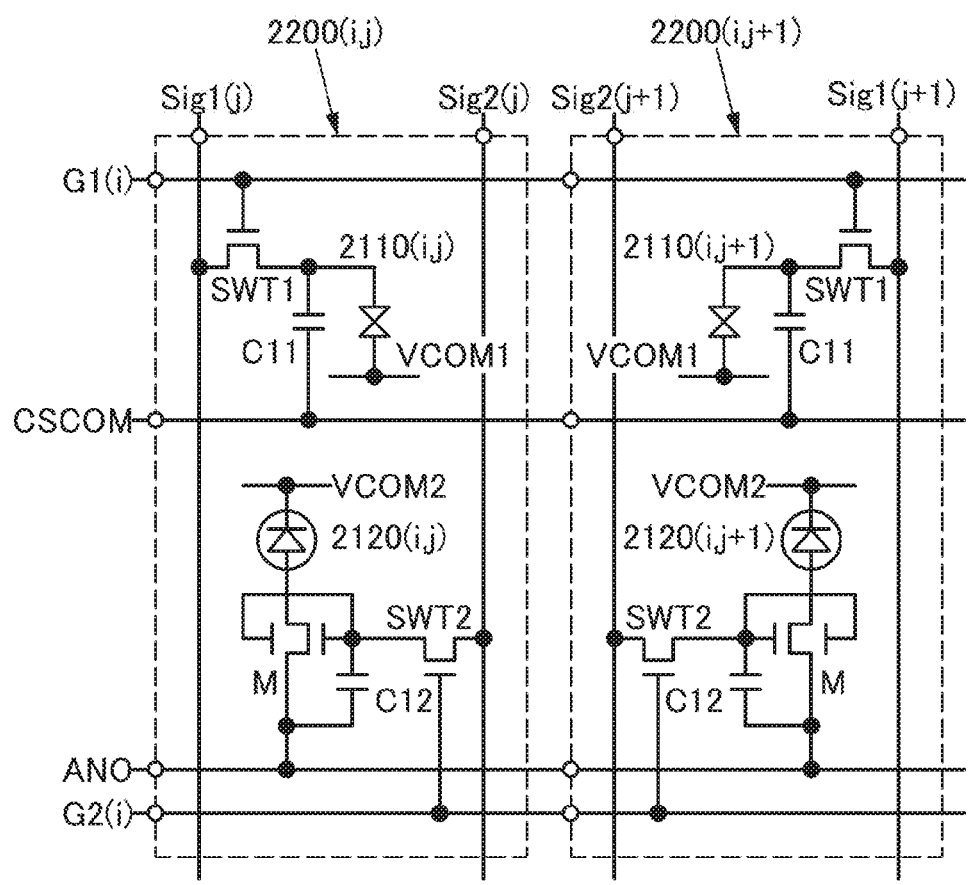
FIG. 27 is a circuit diagram showing a pixel of a display portion.

FIG. 27 is a circuit diagram illustrating a configuration of a pixel circuit included in the input/output device.

<Structure Example of Input/Output Device>

The input/output device described in this embodiment includes the touch panel 2000TP1 (see FIG. 21A). Note that the touch panel includes the display portion and the input portion.

<<Structure Example of Display Portion>>

The display portion includes a display panel, and the display panel includes a pixel 2100$(i,j)$.

The pixel 2100$(i,j)$ includes a second conductive film, a first conductive film, a second insulating film 2506B, and a first display element 2110$(i,j)$ (see FIG. 24A).

The second conductive film is electrically connected to a pixel circuit 2200$(i,j)$. For example, a conductive film 2522B that functions as a source electrode or a drain electrode of a transistor used as a switch SWT1 of the pixel circuit 2200$(i,j)$ can be used as the second conductive film (see FIG. 24A and FIG. 27).

The first conductive film includes a region overlapping with the second conductive film. For example, the first conductive film can be used for a first electrode 2111$(i,j)$ of the first display element 2110$(i,j)$.

The second insulating film 2506B includes a region sandwiched between the second conductive film and the first conductive film. The second insulating film 2506B has an opening 2602A in the region sandwiched between the first conductive film and the second conductive film. Furthermore, the second insulating film 2506B includes a region sandwiched between a first insulating film 2506A and a conductive film 2524A. Moreover, the second insulating film 2506B has an opening 2602B. The second insulating film 2506B has an opening 2602C (see FIG. 23A and FIG. 24A).

The first conductive film is electrically connected to the second conductive film in the opening 2602A. For example, the first electrode 2111($i,j$) is electrically connected to the conductive film 2522B. The first conductive film electrically connected to the second conductive film through the opening 2602A provided in the second insulating film 2506B can be referred to as a through electrode.

The first display element 2110($i,j$) is electrically connected to the first conductive film.

The first display element 2110($i,j$) includes a reflective film and has a function of controlling the intensity of light reflected by the reflective film. For example, the first conductive film, the first electrode 2111($i,j$), or the like can be used as the reflective film of the first display element 2110($i,j$). Similarly, the first conductive film, a first electrode 2111($i,j+1$), or the like can be used as a reflective film of a first display element 2110($i,j+1$), and the first conductive film, a first electrode 2111($i,j+2$), or the like can be used as a reflective film of a first display element 2110($i,j+2$) (see FIG. 25A). Note that also in FIG. 25B described later, the first electrode 2111($i,j$), a first electrode 2111($i+1,j$), and a first electrode 2111($i+2,j$) are illustrated as the reflective film.

The second display element 2120($i,j$) has a function of emitting light toward the second insulating film 2506B (see FIG. 23A).

The reflective film has a shape including a region that does not block light emitted from the second display element 2120($i,j$).

The reflective film included in the pixel 2100($i,j$) of the display panel described in this embodiment includes one or a plurality of openings 2111H (see FIGS. 25A to 25C).

The second display element 2120($i,j$) has a function of emitting light toward the opening 2111H. Note that the opening 2111H transmits light emitted from the second display element 2120($i,j$).

The opening 2111H of the pixel 2100($i,j+1$), that is adjacent to the pixel 2100($i,j$), is not provided on a line that extends in the row direction (the direction indicated by an arrow Ro1 in the drawing) through the opening 2111H of the pixel 2100($i,j$) (see FIG. 25A). Alternatively, for example, the opening 2111H of the pixel 2100($i+1,j$), which is adjacent to the pixel 2100($i,j$), is not provided on a line that extends in the column direction (the direction indicated by an arrow Co1 in the drawing) through the opening 2111H of the pixel 2100($i,j$) (see FIG. 25B).

For example, the opening 2111H of the pixel 2100($i,j+2$) is provided on a line that extends in the row direction through the opening 2111H of the pixel 2100($i,j$) (see FIG. 25A). In addition, the opening 2111H of the pixel 2100($i, j+1$) is provided on a line that is perpendicular to the above-mentioned line between the opening 2111H of the pixel 2100($i,j$) and the opening 2111H of the pixel 2100($i, j+2$).

Alternatively, for example, the opening 2111H of the pixel 2100($i+2,j$) is provided on a line that extends in the column direction through the opening 2111H of the pixel 2100($i,j$) (see FIG. 25B). In addition, for example, the opening 2111H of the pixel 2100($i+1,j$) is provided on a line that is perpendicular to the above-mentioned line between the opening 2111H of the pixel 2100($i,j$) and the opening 2111H of the pixel 2100($i+2,j$).

Thus, a third display element that displays a color different from that displayed by the second display element can be provided easily near the second display element. As a result, a display panel with high convenience or high reliability can be provided.

For example, the reflective film can be formed using a material having a shape in which an end portion is cut off so as to form a region 2111E that does not block light emitted from the second display element 2120($i,j$) (see FIG. 25C). Specifically, the first electrode 2111($i,j$) whose end portion is cut off so as to be shorter in the column direction (the direction indicated by the arrow Co1 in the drawing) can be used as the reflective film. Note that the first electrode 2111($i,j+1$) is illustrated in FIG. 25C in addition to the first electrode 2111($i,j$).

Thus, the first display element and the second display element that displays an image using a method different from that of the first display element can be driven using pixel circuits that can be formed in the same process. Specifically, a reflective display element is used as the first display element, whereby the power consumption can be reduced. In addition, an image with high contrast can be favorably displayed in an environment with bright external light. In addition, the second display element that emits light is used, whereby an image can be favorably displayed in a dark environment. Furthermore, using the second insulating film, impurity diffusion between the first display element and the second display element or between the first display element and the pixel circuit can be suppressed. Moreover, part of light emitted from the second display element to which a voltage controlled on the basis of the control data is supplied is not blocked by the reflective film included in the first display element. As a result, a display device with high convenience or high reliability can be provided.

The second display element 2120($i,j$) included in the pixel of the input/output device described in this embodiment is provided so as to be seen in part of a range from which display using the first display element 2110($i,j$) can be seen. For example, dashed arrows shown in FIG. 24A denote the directions in which external light is incident on and reflected by the first display element 2110($i,j$) that performs display by controlling the intensity of external light reflection. In addition, a solid arrow shown in FIG. 23A denotes the direction in which the second display element 2120($i,j$) emits light to the part of the region from which the display using the first display element 2110($i,j$) can be seen.

Accordingly, display using the second display element can be seen from part of the region from which the display using the first display element can be seen. Alternatively, a user can see the display without changing the attitude or the like of the display panel. As a result, a display panel with high convenience or high reliability can be provided.

The pixel circuit 2200($i,j$) is electrically connected to the signal line Sig1($j$). Note that the conductive film 2522A is electrically connected to the signal line Sig1($j$) (see FIG. 24A and FIG. 27). Furthermore, for example, the transistor in which the second conductive film is used as the conductive film 2522B serving as a source electrode or a drain electrode can be used as the switch SW1 of the pixel circuit 2200($i,j$).

The display panel described in this embodiment includes the first insulating film 2506A (see FIG. 23A).

The first insulating film 2506A has a first opening 2603A, a second opening 2603B, and an opening 2603C (see FIG. 23A or FIG. 24A).

The first opening 2603A includes a region overlapping with a first intermediate film 2540A and the first electrode 2111($i,j$) or a region overlapping with the first intermediate film 2540A and the second insulating film 2506B.

The second opening 2603B includes a region overlapping with a second intermediate film 2540B and the conductive film 2524A. Furthermore, the opening 2603(j) includes a region overlapping with an intermediate film 2540C and the conductive film 2524B.

The first insulating film 2506A includes a region that is along an outer edge of the first opening 2603A and is between the first intermediate film 2540A and the second insulating film 2506B. The first insulating film 2506A also includes a region that is along an outer edge of the second opening 2603B and is between the second intermediate film 2540B and the conductive film 2524A.

The display panel described in this embodiment includes a scan line G2(i), a wiring CSCOM, a third conductive film ANO, and a signal line Sig2(j) (see FIG. 27).

The second display element 2120(i,j) of the display panel described in this embodiment includes a third electrode 2121(i,j), a fourth electrode 2122, and a layer 2123(j) containing a light-emitting material (see FIG. 23A). Note that the third electrode 2121(i,j) and the fourth electrode 2122 are electrically connected to the third conductive film ANO and a fourth conductive film VCOM2, respectively (see FIG. 27).

The fourth electrode 2122 includes a region overlapping with the third electrode 2121(i,j).

The layer 2123(j) containing a light-emitting material includes a region sandwiched between the third electrode 2121(i,j) and the fourth electrode 2122.

The third electrode 2121(i,j) is electrically connected to the pixel circuit 2200(i,j) at a connection portion 2601.

The first display element 2110(i,j) of the display panel described in this embodiment includes a layer 2113 containing a liquid crystal material, the first electrode 2111(i,j), and a second electrode 2112. The second electrode 2112 is positioned such that an electric field that controls the alignment of the liquid crystal material is generated between the second electrode 2112 and the first electrode 2111(i,j) (see FIG. 23A and FIG. 24A).

The display panel described in this embodiment includes an alignment film AF1 and an alignment film AF2. The alignment film AF2 is provided such that the layer 2113 containing a liquid crystal material is interposed between the alignment film AF1 and the alignment film AF2.

The display panel described in this embodiment includes the first intermediate film 2540A and the second intermediate film 2540B.

The first intermediate film 2540A includes a region that overlaps with the second insulating film 2506B with the first conductive film interposed therebetween, and the first intermediate film 2540A includes a region in contact with the first electrode 2111(i,j). The second intermediate film 2540B includes a region in contact with the conductive film 2524A.

The display panel described in this embodiment includes a light-blocking film BM, an insulating film 2507, a functional film 2802P, a functional film 2802D, a coloring film CF1, and a coloring film CF2.

The light-blocking film BM has an opening in a region overlapping with the first display element 2110(i,j). The coloring film CF2 is provided between the second insulating film 2506B and the second display element 2120(i,j) and includes a region overlapping with the opening 2111H (see FIG. 23A).

The insulating film 2507 includes a region sandwiched between the coloring film CF1 and the layer 2113 containing a liquid crystal material or between the light-blocking film BM and the layer 2113 containing a liquid crystal material. The insulating film 2507 can reduce unevenness due to the thickness of the coloring film CF1. Alternatively, impurities can be prevented from being diffused from the light-blocking film BM, the coloring film CF1, or the like to the layer 2113 containing a liquid crystal material.

The functional film 2802P includes a region overlapping with the first display element 2110(i,j).

The functional film 2802D includes a region overlapping with the first display element 2110(i,j). The functional film 2802D is provided such that a substrate 2802 is interposed between the functional film 2802D and the first display element 2110(i,j). Thus, for example, light reflected by the first display element 2110(i,j) can be diffused.

The display panel described in this embodiment includes a substrate 2801, the substrate 2802, and a functional layer 2581.

The substrate 2802 includes a region overlapping with the substrate 2801.

The functional layer 2581 includes a region sandwiched between the substrate 2801 and the substrate 2802. The functional layer 2581 includes the pixel circuit 2200(i,j), the second display element 2120(i,j), an insulating film 2502, and an insulating film 2501. Furthermore, the functional layer 2581 includes an insulating film 2503 and an insulating film 2504 (see FIGS. 23A and 23B).

The insulating film 2502 includes a region sandwiched between the pixel circuit 2200(i,j) and the second display element 2120(i,j).

The insulating film 2501 is provided between the insulating film 2502 and the substrate 2801 and has an opening in a region overlapping with the second display element 2120(i,j).

The insulating film 2501 formed along an edge of the third electrode 2121(i,j) can prevent a short circuit between the third electrode 2121(i,j) and the fourth electrode.

The insulating film 2503 includes a region sandwiched between the insulating film 2502 and the pixel circuit 2200(i,j). The insulating film 2504 includes a region sandwiched between the insulating film 2503 and the pixel circuit 2200(i,j).

The display panel described in this embodiment includes a bonding layer 2811, a sealing material 2820, and a structure body KB1.

The bonding layer 2811 includes a region sandwiched between the functional layer 2581 and the substrate 2801, and has a function of bonding the functional layer 2581 and the substrate 2801 together.

The sealing material 2820 includes a region sandwiched between the functional layer 2581 and the substrate 2802, and has a function of bonding the functional layer 2581 and the substrate 2802 together.

The structure body KB1 has a function of providing a certain space between the functional layer 2581 and the substrate 2802.

The display panel described in this embodiment includes a terminal 2900A and a terminal 2900B.

The terminal 2900A includes the conductive film 2524A and the intermediate film 2540B, and the intermediate film 2540B includes a region in contact with the conductive film 2524A. The terminal 2900A is electrically connected to the signal line Sig1(j), for example.

The terminal 2900A can be electrically connected to a flexible printed circuit FPC1 using a conductive material ACF1.

The terminal 2900B includes the conductive film 2524B and the intermediate film 2540C, and the intermediate film 2540C includes a region in contact with the conductive film 2524B. The conductive film 2524B is electrically connected to a wiring VCOM1, for example.

A conductive material CP is sandwiched between the terminal 2900B and the second electrode 2112, and has a function of electrically connecting the terminal 2900B and the second electrode 2112. For example, a conductive particle can be used as the conductive material CP.

The display panel described in this embodiment includes a driver circuit GD and a driver circuit SD (see FIG. 21A).

The driver circuit GD is electrically connected to a scan line G1(*i*). The driver circuit GD includes a transistor MD, for example (see FIG. 23A). Specifically, a transistor including a semiconductor film that can be formed in the same process as the transistor included in the pixel circuit 2200 (*i,j*) can be used as the transistor MD.

The driver circuit SD is electrically connected to the signal line Sig1(*j*). The driver circuit SD is electrically connected to the terminal 2900A, for example.

<<Structure Example of Input Portion>>

The input portion includes a region overlapping with the display panel (see FIGS. 21A, 21B-1, 21B-2, and 21C, FIG. 23A, or FIG. 24A).

The input portion includes a substrate 2803, a functional layer 2582, a bonding layer 2812, and a terminal 2901 (see FIG. 23A and FIG. 24A).

The input portion includes a control line CL(g), a sensor signal line ML(h), and a sensing element 2150(*g,h*) (see FIG. 21B-2).

The functional layer 2582 includes a region sandwiched between the substrate 2802 and the substrate 2803. The functional layer 2582 includes the sensing element 2150(*g, h*) and an insulating film 2508.

The bonding layer 2812 is provided between the functional layer 2582 and the substrate 2802 and has a function of bonding the functional layer 2582 and the substrate 2802 together.

The sensing element 2150(*g,h*) is electrically connected to the control line CL(g) and the sensor signal line ML(h).

The control line CL(g) has a function of supplying a control signal.

The sensing element 2150(*g,h*) receives the control signal and has a function of supplying the control signal and a sensor signal that changes in accordance with a distance between the sensing element 2150(*g,h*) and an object approaching a region overlapping with the display panel.

The sensor signal line ML(h) has a function of receiving the sensor signal.

The sensing element 2150(*g,h*) has a light-transmitting property.

The sensing element 2150(*g,h*) includes an electrode C(g) and an electrode M(h).

The electrode C(g) is electrically connected to the control line CL(g).

The electrode M(h) is electrically connected to the sensor signal line ML(h) and is provided so that an electric field part of which is blocked by an object approaching a region overlapping with the display panel is generated between the electrode M(h) and the electrode C(g).

Thus, the object approaching the region overlapping with the display panel can be sensed while the image data is displayed on the display panel.

The input portion described in this embodiment includes the substrate 2803 and the bonding layer 2812 (see FIG. 23A and FIG. 24A).

The substrate 2803 is provided so that the sensing element 2150(*g,h*) is sandwiched between the substrate 2803 and the substrate 2802.

The bonding layer 2812 is provided between the substrate 2802 and the sensing element 2150(*g,h*) and has a function of bonding the substrate 2802 and the sensing element 2150(*g,h*) together.

The functional film 2802P is provided so that the sensing element 2150(*g,h*) is interposed between the functional film 2802P and the first display element 2110(*i,j*). Thus, the intensity of light reflected by the sensing element 2150(*g,h*) can be reduced, for example.

The input portion described in this embodiment includes one group of sensing elements 2150(*g,*1) to 2150(*g,q*) and another group of sensing elements 2150(1,*h*) to 2150(*p,h*) (see FIG. 26). Note that g is an integer greater than or equal to 1 and less than or equal to p, h is an integer greater than or equal to 1 and less than or equal to q, and each of p and q is an integer greater than or equal to 1.

The one group of the sensing elements 2150(*g,*1) to 2150(*g,q*) includes the sensing element 2150(*g,h*) and is provided in the row direction (indicated by an arrow Ro2 in the drawing).

The another group of sensing elements 2150(1,*h*) to 2150(*p,h*) includes the sensing element 2150(*g,h*) and is provided in the column direction (the direction indicated by an arrow Co2 in the drawing) that intersects the row direction.

The one group of sensing elements 2150(*g,*1) to 2150(*g,q*) provided in the row direction includes the electrode C(g) that is electrically connected to the control line CL(g).

The another group of sensing elements 2150(1,*h*) to 2150(*p,h*) provided in the column direction includes the electrode M(h) that is electrically connected to the sensor signal line ML(h).

The control line CL(g) of the touch panel described in this embodiment includes a conductive film BR(g,h) (see FIG. 23A). The conductive film BR(g,h) includes a region overlapping with the sensor signal line ML(h).

The insulating film 2508 includes a region sandwiched between the sensor signal line ML(h) and the conductive film BR(g,h). Thus, a short circuit between the sensor signal line ML(h) and the conductive film BR(g,h) can be prevented.

The touch panel described in this embodiment includes an oscillator circuit OSC and a detection circuit DC (see FIG. 26).

The oscillator circuit OSC is electrically connected to the control line CL(g) and has a function of supplying a control signal. For example, a rectangular wave, a sawtooth wave, a triangular wave, or the like can be used as the control signal.

The detection circuit DC is electrically connected to the sensor signal line ML(h) and has a function of supplying a sensor signal on the basis of a change in the potential of the sensor signal line ML(h).

Components of the touch panel are described below. Note that these components cannot be clearly distinguished and one component may also serve as another component or include part of another component.

For example, the first conductive film can be used as the first electrode 2111(*i,j*). The first conductive film can be used as a reflective film.

In addition, the second conductive film can be used as the conductive film 2522B serving as a source electrode or a drain electrode of a transistor.

The terminal 2901 can be electrically connected to a flexible printed circuit FPC2 using a conductive material ACF2, for example. In addition, the terminal 2901 is electrically connected to the sensing element 2150(*g,h*).

<<Configuration Example of Pixel Circuit>>

A configuration example of a pixel circuit is described with reference to FIG. 27. The pixel circuit 2200($i,j$) is electrically connected to the signal line Sig1($j$), the signal line sig2($j$), the scan line G1($i$), the scan line G2($i$), the wiring CSCOM, and the third conductive film ANO. Similarly, a pixel circuit 2200($i,j$+1) is electrically connected to a signal line Sig1($j$+1), a signal line Sig2($j$+1), the scan line G1($i$), a scan line G2($i$), the wiring CSCOM, and the third conductive film ANO.

The pixel circuit 2200($i,j$) and the pixel circuit 2200($i,j$+1) each include the switch SWT1 and a capacitor C11.

The pixel circuit 2200($i,j$) and the pixel circuit 2200($i,j$+1) each include a switch SWT2, a transistor M, and a capacitor C12.

For example, a transistor including a gate electrode electrically connected to the scan line G1($i$) and a first electrode electrically connected to the signal line Sig1($j$) can be used as the switch SWT1.

The capacitor C11 includes a first electrode electrically connected to a second electrode of the transistor used as the switch SWT1 and a second electrode electrically connected to the wiring CSCOM.

For example, a transistor including a gate electrode electrically connected to the scan line G2($i$) and a first electrode electrically connected to the signal line Sig2($j$) can be used as the switch SWT2.

The transistor M includes a gate electrode electrically connected to a second electrode of the transistor used as the switch SWT2 and a first electrode electrically connected to the third conductive film ANO.

Note that a transistor including a conductive film provided such that a semiconductor film is interposed between a gate electrode and the conductive film can be used as the transistor M. For example, as the conductive film, a conductive film electrically connected to a wiring that can supply the same potential as that of the gate electrode of the transistor M can be used.

The capacitor C12 includes a first electrode electrically connected to the second electrode of the transistor used as the switch SWT2 and a second electrode electrically connected to the first electrode of the transistor M.

Note that in the pixel circuit 2200($i,j$), the first electrode and the second electrode of the first display element 2110($i,j$) are electrically connected to the second electrode of the transistor used as the switch SWT1 and the wiring VCOM1, respectively. This enables the first display element 2110 to be driven. Similarly, in the pixel circuit 2200($i,j$+1), a first electrode and a second electrode of the first display element 2110($i,j$+1) are electrically connected to the second electrode of the transistor used as the switch SWT1 and the wiring VCOM1, respectively. This enables the first display element 2110 to be driven.

Furthermore, in the pixel circuit 2200($i,j$), the first electrode and the second electrode of the second display element 2120($i,j$) are electrically connected to the second electrode of the transistor M and the fourth conductive film VCOM2, respectively. This enables the second display element 2120 ($i,j$) to be driven. Similarly, in the pixel circuit 2200($i,j$+1), the first electrode and the second electrode of a second display element 2120($i,j$+1) are electrically connected to the second electrode of the transistor M and the fourth conductive film VCOM2, respectively. This enables the second display element 2120($i,j$+1) to be driven.

<<Transistor Structure Example>>

A bottom-gate transistor, a top-gate transistor, or the like can be used as the switch SWT1, the transistor M, and the transistor MD.

For example, a transistor including a semiconductor containing an element belonging to Group 14 in a semiconductor film can be used. Specifically, a semiconductor containing silicon can be used for a semiconductor film. For example, a transistor including single crystal silicon, polysilicon, microcrystalline silicon, amorphous silicon, or the like in a semiconductor film can be used.

For example, a transistor including an oxide semiconductor in a semiconductor film can be used. Specifically, an oxide semiconductor containing indium or an oxide semiconductor containing indium, zinc, and the element M (the element M is aluminum, gallium, yttrium, or tin) can be used for the semiconductor film.

For example, a transistor whose leakage current in an off state is smaller than that of a transistor including amorphous silicon in a semiconductor film can be used as the switch SWT1, the transistor M, the transistor MD, or the like. Specifically, a transistor including an oxide semiconductor in a semiconductor film 2560 can be used as the switch SWT1, the transistor M, the transistor MD, or the like.

Thus, a pixel circuit can hold an image signal for a longer Time than a pixel circuit including a transistor that uses amorphous silicon for a semiconductor film. Specifically, the selection signal can be supplied at a frequency of lower than 30 Hz, preferably lower than 1 Hz, further preferably less than once per minute while flickering is suppressed. Consequently, eyestrain on a user of the information processing device can be reduced, and power consumption for driving can be reduced.

The transistor that can be used as the switch SWT1 includes the semiconductor film 2560 and a conductive film 2523 including a region overlapping with the semiconductor film 2560 (see FIG. 24B). The transistor that can be used as the switch SWT1 includes the conductive film 2522A and the conductive film 2522B, which are electrically connected to the semiconductor film 2560.

Note that the conductive film 2523 and an insulating film 2505 serve as a gate electrode and a gate insulating film, respectively. The conductive film 2522A has one of a function as a source electrode and a function as a drain electrode, and the conductive film 2522B has the other.

A transistor in which the semiconductor film 2560 is provided between the conductive film 2523 and a conductive film 2521 can be used as the transistor M (see FIG. 23B).

The above-described input/output device is used for the tablet information terminal 5200 in FIG. 20 described in Embodiment 4, whereby an electronic device that is highly visible, convenient, or reliable can be obtained.

This embodiment can be combined with any of the other embodiments in this specification as appropriate.

(Notes on the Description in this Specification and the Like)

The following are notes on the structures in the above embodiments.

<Notes on one embodiment of the present invention described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It is readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a perspective view, some components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (such a structure is referred to as a dual-gate structure in some cases), these gates are referred to as a first gate and a second gate or a front gate and a back gate in some cases. Note that a "bottom gate" is a terminal that is formed before a channel formation region in manufacture of a transistor, and a "top gate" is a terminal that is formed after a channel formation region in manufacture of a transistor.

A transistor is an element having three terminals: a gate, a source, and a drain. A gate is a terminal that functions as a control terminal for controlling the conduction state of a transistor. Functions of input/output terminals of the transistor depend on the type and the levels of potentials applied to the terminals, and one of the two terminals serves as a source and the other serves as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is a silicon layer, examples of an impurity that changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the channel formation region between the source and the drain. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included. In addition, the term "substantially perpendicular" indicates that the angle formed between two straight lines is greater than or equal to $60°$ and less than or equal to $120°$.

<<Trigonal and Rhombohedral>>

In this specification, trigonal and rhombohedral crystal systems are included in a hexagonal crystal system.

EXPLANATION OF REFERENCE

OUT[1]: column output circuit, OUT[j]: column output circuit, OUT[j+1]: column output circuit, OUT[n]: column output circuit, Cref: reference column output circuit, OT[1]: output terminal, OT[j]: output terminal, OT[j+1]: output terminal, OT[n]: output terminal, OTref: output terminal, SPT[1]: output terminal, SPT[j]: output terminal, SPT[n]: output terminal, SPT[j+1]: output terminal, AM[1,1]: memory cell, AM[i,1]: memory cell, AM[m,1]: memory cell, AM[1,j]: memory cell, AM[i,j]: memory cell, AM[i+1,j]: memory cell, AM[i,j+1]: memory cell, AM[i+1,j+1]: memory cell, AM[m,j]: memory cell, AM[1,n]: memory cell, AM[i,n]: memory cell, AM[m,n]: memory cell, AMref[1]: memory cell, AMref[i]: memory cell, AMref[m]: memory cell, ORP: wiring, OSP: wiring, ORM: wiring, OSM: wiring, WW[1]: wiring, WW[i]: wiring, WW[m]: wiring, RW[1]: wiring, RW[i]: wiring, RW[m]: wiring, WD[1]: wiring, WD[j]: wiring, WD[j+1]: wiring, WD[n]: wiring, WDref: wiring, B[1]: wiring, B[j]: wiring, B[j+1]: wiring, B[n]: wiring, Bref: wiring, VR: wiring, CI: constant current circuit, CIref: constant current circuit, CM: current mirror circuit, CT1: terminal, CT1-1: terminal, CT1-2: terminal, CT1-3: terminal, CT2: terminal, CT3: terminal, CT4: terminal, CT5[1]: terminal, CT5[j]: terminal, CT5[j+1]: terminal, CT5[n]: terminal, CT6[1]: terminal, CT6[j]: terminal, CT6[j+1]: terminal, CT6[n]: terminal, CT7: terminal, CT8: terminal, IL[1]: wiring, IL[j]: wiring, IL[j+1]: wiring, IL[n]: wiring, ILref: wiring, OL[1]: wiring, OL[j]: wiring, OL[j+1]: wiring, OL[n]: wiring, OLref: wiring, VDDL: wiring, VSSL: wiring, BG[1]: wiring, BG[j]: wiring, BG[n]: wiring, BGref: wiring, NCMref: node, N[1,1]: node, N[i,1]: node, N[m,1]: node, N[1,j]: node, N[i,j]: node, N[i+1,j]: node, N[i+1]: node, N[i+1,j+1]: node, N[m,j]: node, N[1,n]: node, N[i,n]: node, N[m,n]: node, Nref[1]: node, Nref[i]: node, Nref[i+1]: node, Nref[m]: node, NNC: circuit, U[1,1]: product-sum operation circuit, U[2,1]: product-sum operation circuit, U[3,1]: product-sum operation circuit, U[1,2]: product-sum operation circuit, U[2,2]: product-sum operation circuit, U[3,2]: product-sum operation circuit, U[1,3]: product-sum operation circuit, U[2,3]: product-sum operation circuit, U[3,3]: product-sum operation circuit, U[M,1]: product-sum operation circuit, U[g,h]: product-sum operation circuit, U[1,N]: product-sum operation circuit, U[M,N]: product-sum operation circuit, MSW: switch circuit, MSW1: switch circuit, MSW2: switch circuit, MSW-RW: switch circuit, MSW-WW: switch circuit, MSW-WD: switch circuit, MSW-B: switch circuit, HRW[1]: wiring group, HRW[2]: wiring group, HRW[3]: wiring group, HRW[4]: wiring group, HRW[5]: wiring group, HRW[6]: wiring group, HRW[N]: wiring group, HRW[(g−1)N+1]: wiring group, HRW[gN]: wiring group, HRW[(M−1)N+1]: wiring group, HRW[MN]: wiring group, HWW[1]: wiring group, HWW[2]: wiring group, HWW[3]: wiring group, HWW[g]: wiring group, HWWM: wiring group, VB[1]: wiring group, VB[2]: wiring group, VB[3]: wiring group, VB[4]: wiring group, VB[5]: wiring group, VB[6]: wiring group, VBM: wiring group, VB[(h−1)M+1]: wiring group, VB[hM]: wiring group, VB[(n−1)M+1]: wiring group, VB[NM]: wiring group, VWD[1]: wiring group, VWD[2]: wiring group, VWD[3]: wiring group, VWD[h]: wiring group, VWD[N]: wiring group, SW[1]: circuit, SW[x]: circuit, SWW[1]: wiring, SWW[x]: wiring, SWW: wiring, SWB[1]: wiring, SWB[x]: wiring, SWB: wiring, RW: terminal, WW: terminal, WD: terminal, B: terminal, TH1: terminal, TH1[1]: terminal, TH1[x]: terminal, TH2: terminal, TH2[1]: terminal, TH2[x]: terminal, TV1: terminal, TV1[1]: terminal, TV1[x]: terminal, TV2: terminal, TV2[1]: terminal, TV2[x]: terminal, RWSig(2): signal, RWSig(3): signal, BSig(2): signal, BSig(3): signal, BSig(4): signal, WWSig: selection signal, T01: Time, T02: Time, T03: Time, T04: Time, T05: Time, T06: Time, T07: Time, T08: Time, T09: Time, T10: Time, T11: Time, T12: Time, T13: Time, T14: Time, T15: Time, T16: Time, T17: Time, Tr1: transistor, Tr2: transistor, Tr3: transistor, Tr4: transistor, Try: transistor, Tr6: transistor, Tr7: transistor, Tr8: transistor, Tr9: transistor, Tr11: transistor, Tr12: transistor, Tr21: transistor, Tr22: transistor, Tr23: transistor, Tr31: transistor, Tr32: transistor, Tr41: transistor, Tr42[1]: transistor, Tr42[x]: transistor, Cl: capacitor, C2: capacitor, C3: capacitor, C4: capacitor, C5: capacitor, Co1: arrow, Co2: arrow, Ro1: arrow, Ro2: arrow, SWT1: switch, SWT2: switch, M: transistor, MD: transistor, C11: capacitor, C12: capacitor, Sig1($j$): signal line, Sig2($j$): signal line, Sig1($j$+1): signal line, Sig2($j$+1): signal line, G1($i$): scan line, G2($i$): scan line, CL(g): control line, ML(h): sensor signal line, C(g): electrode, M(h): electrode, BR(g,h): conductive film, CSCOM: wiring, VCOM1: wiring, VCOM2: fourth conductive film, ANO: third conductive film, FPC1: flexible printed circuit, FPC2: flexible printed circuit, ACF1: conductive material, ACF2: conductive material, AF1: alignment film, AF2: alignment film, BM: light-blocking film, CF1: coloring film, CF2: coloring film, KB1: structure body, CP: conductive material, GD: driver circuit, SD: driver circuit, OSC: oscillator circuit, DC: detection circuit, 100: semiconductor device, 110: offset circuit, 111: offset circuit, 112: offset circuit, 113: offset circuit, 115: offset circuit, 116: offset circuit, 120: memory cell array, 121: memory cell array, 151: offset circuit, 160: memory cell array, 2000TP1: touch panel, 2100($i,j$): pixel, 2100($i,j$+1): pixel, 2100($i$+1,j): pixel, 2100($i$+2,j): pixel, 2110($i,j$): first display element, 2110($i,j$+1): first display element, 2110($i,j$+2): first display element, 2111($i,j$): first electrode, 2111($i,j$+1): first electrode, 2111($i,j$+2): first electrode, 2111($i$+1,j): first electrode, 2111($i$+2,j): first electrode, 2111E: region, 2111H: opening, 2112: second electrode, 2113: layer, 2120($i,j$) : second display element, 2120($i,j$+1): second display element, 2121($i,j$): third electrode, 2122: fourth electrode, 2123($j$): layer, 2150($g,h$): sensing element, 2150($g$,1): sensing element, 2150($g,q$): sensing element, 2150(1,$h$): sensing element, 2150($p,h$): sensing element, 2200($i,j$): pixel circuit, 2200($i,j$+1): pixel circuit, 2501: insulating film, 2502: insulating film, 2503: insulating film, 2504: insulating film, 2505: insulating film, 2506A: first insulating film, 2506B: second insulating film, 2507: insulating film, 2508: insulating film, 2521: conductive film, 2522A: conductive film, 2522B: conductive film, 2523: conductive film, 2524A: conductive film, 2524B: conductive film, 2540A: first intermediate film, 2540B: second intermediate film, 2540C: intermediate film, 2560: semiconductor film, 2581: functional layer, 2582: functional layer, 2601: connection portion, 2602A: opening, 2602B: opening, 2602C: opening, 2603A: first opening, 2603B: second opening, 2603C: opening, 2801: substrate, 2802: substrate, 2802P: functional film, 2802D: functional film, 2803: substrate, 2811: bonding layer, 2812: bonding layer, 2820: sealing material, 2900A: terminal, 2900B: terminal, 2901: terminal, 4700: electronic component, 4701: lead, 4702: printed circuit board, 4703: circuit portion, 4704: circuit substrate, 4800: semiconductor wafer, 4800$a$: chip, 4801: wafer, 4801$a$: wafer, 4802: circuit portion, 4803: spacing, 4803$a$: spacing, 4810: semiconductor wafer, 5200: information terminal, 5221: housing, 5222: display portion, 5223: operation button, 5224: speaker.

This application is based on Japanese Patent Application serial No. 2016-081092 filed with Japan Patent Office on Apr. 14, 2016, the entire contents of which are hereby incorporated by reference.

The invention claimed is:

1. A semiconductor device comprising:
a first product-sum operation circuit comprising a first terminal;
a second product-sum operation circuit comprising a second terminal;
a first switch circuit comprising a third terminal and a fourth terminal, the third terminal being electrically connected to the first terminal; and
a second switch circuit comprising a fifth terminal and a sixth terminal, the fifth terminal being electrically connected to the second terminal,
wherein the fourth terminal and the sixth terminal are electrically connected to each other,
wherein the first switch circuit is configured to control a conduction state between the third terminal and the fourth terminal, and
wherein the second switch circuit is configured to control a conduction state between the fifth terminal and the sixth terminal.

2. The semiconductor device according to claim 1, wherein the first switch circuit further comprises a first transistor and a second transistor, wherein one of a source and a drain of the first transistor is electrically connected to a gate of the second transistor, wherein one of a source and a drain of the second transistor is electrically connected to the third terminal, and wherein the other of the source and the drain of the second transistor is electrically connected to the fourth terminal.

3. The semiconductor device according to claim 2, wherein the first switch circuit further comprises a capacitor, wherein a first electrode of the capacitor is electrically connected to the one of the source and the drain of the first transistor, and wherein a second electrode of the capacitor is electrically connected to a wiring for supplying a low-level potential.

4. The semiconductor device according to claim 2, wherein the first transistor comprises an oxide semiconductor layer comprising indium and zinc.

5. The semiconductor device according to claim 1, wherein the semiconductor device is configured to perform pattern recognition and associative storage.

6. A semiconductor device comprising a plurality of product-sum operation circuits arranged in a matrix, the plurality of product-sum operation circuits comprising:

a first product-sum operation circuit comprising a first terminal;

a second product-sum operation circuit comprising a second terminal;

a first switch circuit comprising a third terminal and a fourth terminal, the third terminal being electrically connected to the first terminal; and a second switch circuit comprising a fifth terminal and a sixth terminal, the fifth terminal being electrically connected to the second terminal, wherein the first product-sum operation circuit and the first switch circuit are arranged in a first row and a first column of the matrix, and the second product-sum operation circuit and the second switch circuit are in a second row and the first column of the matrix, wherein the fourth terminal and the sixth terminal are electrically connected to each other, wherein the first switch circuit is configured to control a conduction state between the third terminal and the fourth terminal, and wherein the second switch circuit is configured to control a conduction state between the fifth terminal and the sixth terminal.

7. The semiconductor device according to claim 6, wherein the first switch circuit further comprises a first transistor and a second transistor, wherein one of a source and a drain of the first transistor is electrically connected to a gate of the second transistor, wherein one of a source and a drain of the second transistor is electrically connected to the third terminal, and wherein the other of the source and the drain of the second transistor is electrically connected to the fourth terminal.

8. The semiconductor device according to claim 7, wherein the first switch circuit further comprises a capacitor, wherein a first electrode of the capacitor is electrically connected to the one of the source and the drain of the first transistor, and wherein a second electrode of the capacitor is electrically connected to a wiring for supplying a low-level potential.

9. The semiconductor device according to claim 7, wherein the first transistor comprises an oxide semiconductor layer comprising indium and zinc.

10. The semiconductor device according to claim 6, wherein the semiconductor device is configured to perform pattern recognition and associative storage.

11. A semiconductor device comprising:

a first product-sum operation circuit comprising a first terminal;

a second product-sum operation circuit comprising a second terminal;

a first switch circuit comprising a third terminal and a fourth terminal, the third terminal being electrically connected to the first terminal; and a second switch circuit comprising a fifth terminal and a sixth terminal, the fifth terminal being electrically connected to the second terminal, wherein the fourth terminal and the sixth terminal are electrically connected to each other, wherein the first switch circuit is configured to control a conduction state between the third terminal and the fourth terminal, wherein the second switch circuit is configured to control a conduction state between the fifth terminal and the sixth terminal, and wherein each of the first product-sum operation circuit and the second product-sum operation circuit comprises a memory cell array and an offset circuit electrically connected to the memory cell array.

12. The semiconductor device according to claim 11, wherein the first switch circuit further comprises a first transistor and a second transistor, wherein one of a source and a drain of the first transistor is electrically connected to a gate of the second transistor, wherein one of a source and a drain of the second transistor is electrically connected to the third terminal, and wherein the other of the source and the drain of the second transistor is electrically connected to the fourth terminal.

13. The semiconductor device according to claim 12, wherein the first switch circuit further comprises a capacitor, wherein a first electrode of the capacitor is electrically connected to the one of the source and the drain of the first transistor, and wherein a second electrode of the capacitor is electrically connected to a wiring for supplying a low-level potential.

14. The semiconductor device according to claim 12, wherein the first transistor comprises an oxide semiconductor layer comprising indium and zinc.

15. The semiconductor device according to claim 11, wherein the semiconductor device is configured to perform pattern recognition and associative storage.

16. The semiconductor device according to claim 11, wherein the offset circuit comprises a constant current circuit and a current mirror circuit.

17. The semiconductor device according to claim 11,
wherein the memory cell array comprises a first memory cell and a second memory cell,
wherein the first memory cell is configured to supply a first current in accordance with a first signal,
wherein the second memory cell is configured to supply a second current in accordance with the first signal,
wherein the offset circuit is configured to supply a third current corresponding to a first differential current between the first current and the second current,
wherein the first memory cell is configured to supply a fourth current in accordance with a second signal,
wherein the second memory cell is configured to supply a fifth current in accordance with the second signal, and
wherein the first product-sum operation circuit is configured to output a sixth current that is obtained by subtracting the third current from a second differential current between the fourth current and the fifth current.

* * * * *